US010754256B2

(12) United States Patent
Wallow et al.

(10) Patent No.: US 10,754,256 B2
(45) Date of Patent: Aug. 25, 2020

(54) METHOD AND APPARATUS FOR PATTERN CORRECTION AND VERIFICATION

(71) Applicant: ASML NETHERLANDS B.V., Veldhoven (NL)

(72) Inventors: Thomas I. Wallow, San Carlos, CA (US); Peng-cheng Yang, Shenzhen (CN); Adam Lyons, San Jose, CA (US); Mir Farrokh Shayegan Salek, Santa Clara, CA (US); Hermanus Adrianus Dillen, Maarheeze (NL)

(73) Assignee: ASML Netherlands B.V., Veldhoven (NL)

( * ) Notice: Subject to any disclaimer, the term of this patent is extended or adjusted under 35 U.S.C. 154(b) by 249 days.

(21) Appl. No.: 15/763,387

(22) PCT Filed: Oct. 3, 2016

(86) PCT No.: PCT/EP2016/073554
§ 371 (c)(1),
(2) Date: Mar. 26, 2018

(87) PCT Pub. No.: WO2017/060192
PCT Pub. Date: Apr. 13, 2017

(65) Prior Publication Data
US 2018/0275521 A1    Sep. 27, 2018

Related U.S. Application Data

(60) Provisional application No. 62/239,165, filed on Oct. 8, 2015, provisional application No. 62/402,636, filed on Sep. 30, 2016.

(51) Int. Cl.
G03F 7/20         (2006.01)
G03F 1/36         (2012.01)

(52) U.S. Cl.
CPC ........... *G03F 7/70441* (2013.01); *G03F 1/36* (2013.01); *G03F 7/7065* (2013.01); *G03F 7/70508* (2013.01); *G03F 7/70625* (2013.01)

(58) Field of Classification Search
CPC .... G03F 1/36; G03F 7/70441; G03F 7/70508; G03F 7/70625; G03F 7/7065
USPC ..................................................... 430/5, 30
See application file for complete search history.

(56) References Cited

U.S. PATENT DOCUMENTS

| 7,587,704 B2 | 9/2009 | Ye et al. |
| 8,930,172 B2 | 1/2015 | Ye et al. |
| 9,141,730 B2 | 9/2015 | Geshel et al. |
| 2011/0075162 A1 | 3/2011 | Saettel et al. |
| 2013/0010100 A1 | 1/2013 | Kotaki et al. |
| 2015/0186557 A1 | 7/2015 | Ye et al. |

FOREIGN PATENT DOCUMENTS

| CN | 102209935 | 10/2011 |
| TW | 201321911 | 6/2013 |

OTHER PUBLICATIONS

International Search Report and Written Opinion dated Jan. 26, 2017 in corresponding International Patent Application No. PCT/EP2016/073554.
Weisbuch, Francois et al., "Assessing SEM contour based OPC models quality using rigorous simulation", Proceedings of SPIE, vol. 9051, pp. 90510A-1-90510A-16 (2014).
Weisbuch, Francois et al., "Bringing SEM contour based OPC to production", Proceedings of SPIE, vol. 9052, pp. 905224-1-905224-13 (2014).
Chou, C.S. et al., "Joint calibration of 3D resist image and CDSEM", Proceedings of SPIE, vol. 8681, pp. 868113-1-868113-7 (2013).
De Bisschop, Peter et al., "Alignment and averaging of scanning electron microscope image contours for optical proximity correction modeling purposes", Journal of Micro Nanolithography Mems and Moems, vol. 9, No. 4, pp. 041302-1-041302-10 (2010).
Fischer, Daniel et al., "Challenges of implementing contour modeling in 32nm technology", Proceedings of SPIE, vol. 6922, pp. 69220A-1-69220A-12 (2008).
Hibino, Daisuke et al., "High-accuracy optical proximity correction modeling using advanced critical dimension scanning electron microscope-based contours in next-generation lithography", Journal of Micro Nanolithography Mems and Moems, vol. 10, No. 1, pp. 013012-1-013012-8 (2011).
Hitomi, Keiichiro et al., "Hybrid OPC modeling with SEM contour technique for 10 nm node process", Proceedings of SPIE, vol. 9052, pp. 90520W-1-90520W-9 (2014).
Kusnadi, Ir et al., "Contour-based self-aligning calibration of Opc models", Proceedings of Spie, vol. 7638, pp. 76382M-1 - 76382M-8 (2010).
Tabery, Cyrus et al., "Sem image contouring for Opc model calibration and verification," Proceedings of Spie, vol. 6520, pp. 652019-1 - 652019-11 (2007).
Wang, Ching-Heng et al., "More robust model built using Sem calibration", Proceedings of Spie, vol. 6730, pp. 673053-1 - 673053-7 (2007).
Weisbuch, Francois et al., "Enabling scanning electron microscope contour-based optical proximity correction models", Journal of Micro Nanolithography Mems and Moems, vol. 14, No. 2, pp. 021105-1 - 021105-11 (Apr. 2015).
Filitchkin, Paul et al., "Contour quality assessment for Opc model calibration", Proceedings of Spie, Vol, 7272, pp. 72722Q-1 - 72722Q-7 (2009).

(Continued)

*Primary Examiner* — Christopher G Young
(74) *Attorney, Agent, or Firm* — Pillsbury Winthrop Shaw Pittman LLP

(57) ABSTRACT

A method including providing a plurality of unit cells for a plurality of gauge patterns appearing in one or more images of one or more patterning process substrates, each unit cell representing an instance of a gauge pattern of the plurality of gauge patterns, averaging together image information of each unit cell to arrive at a synthesized representation of the gauge pattern, and determining a geometric dimension of the gauge pattern based on the synthesized representation.

21 Claims, 31 Drawing Sheets

(56) References Cited

OTHER PUBLICATIONS

Fuchimoto, Daisuke et al., "Measurement technology to quantify 2D pattern shape in sub-2x nm advanced lithography", Proceedings of Spie, vol. 8681, pp. 86810A-1 86810A-7 (2013).
Fuchimoto, Daisuke et al., "Contour-based metrology for complex 2D shaped patterns printed by multiple-patterning process", Proceedings of Spie, vol. 9050, pp. 90500V-1 - 90500V-8 (2014).
Shibahara, T. et al., "A Cd-gap-free contour extraction technique for Opc model calibration", Proceedings of Spie, vol. 7971, pp, 797-100-1 - 797100-8 (2011).
Smith, Mark D. et al., "Investigation of interactions between metrology and lithography with a Cd Sem simulator", Proceedings of Spie, vol. 9051, pp. 905109-1- 905109-11 (2014).

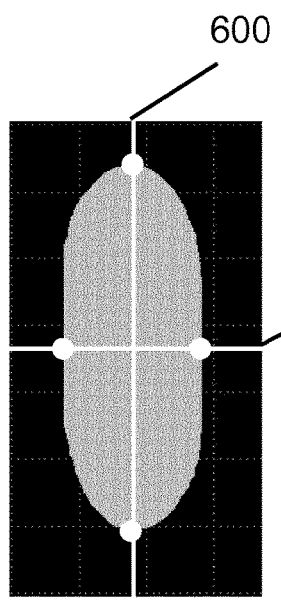
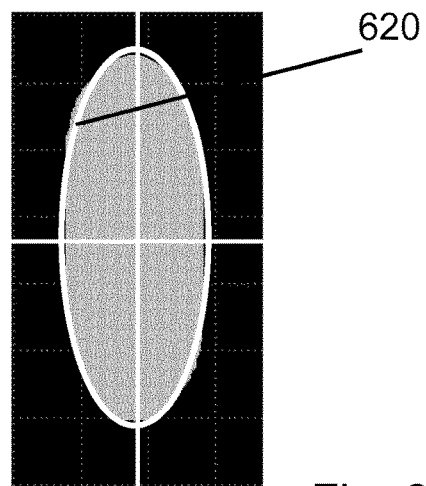
Fig. 6A
Fig. 6B
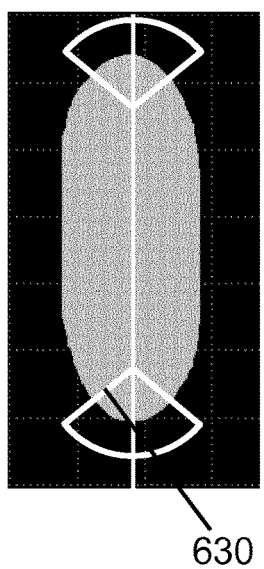
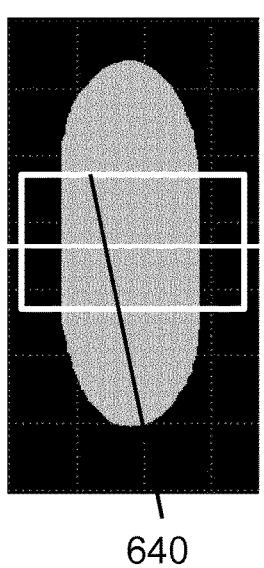
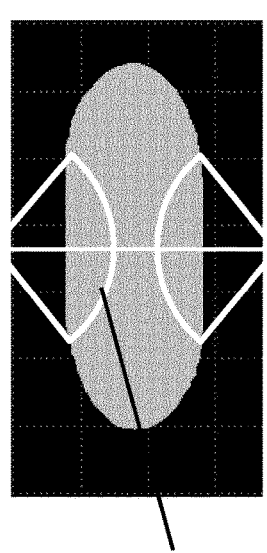
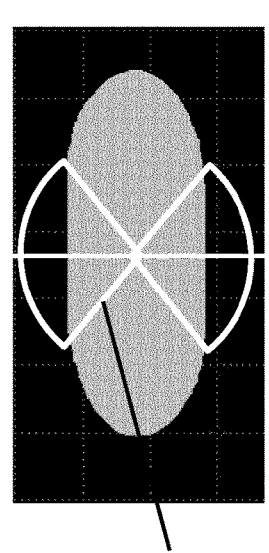
Fig. 6C  Fig. 6D  Fig. 6E  Fig. 6F

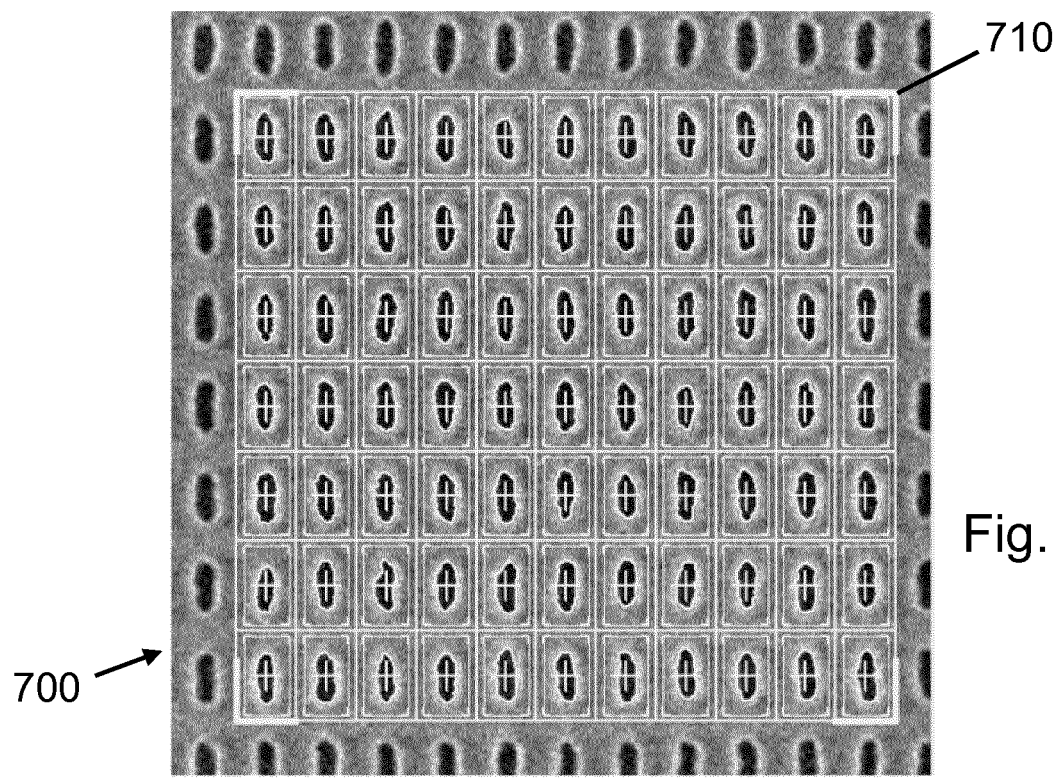
Fig. 7A
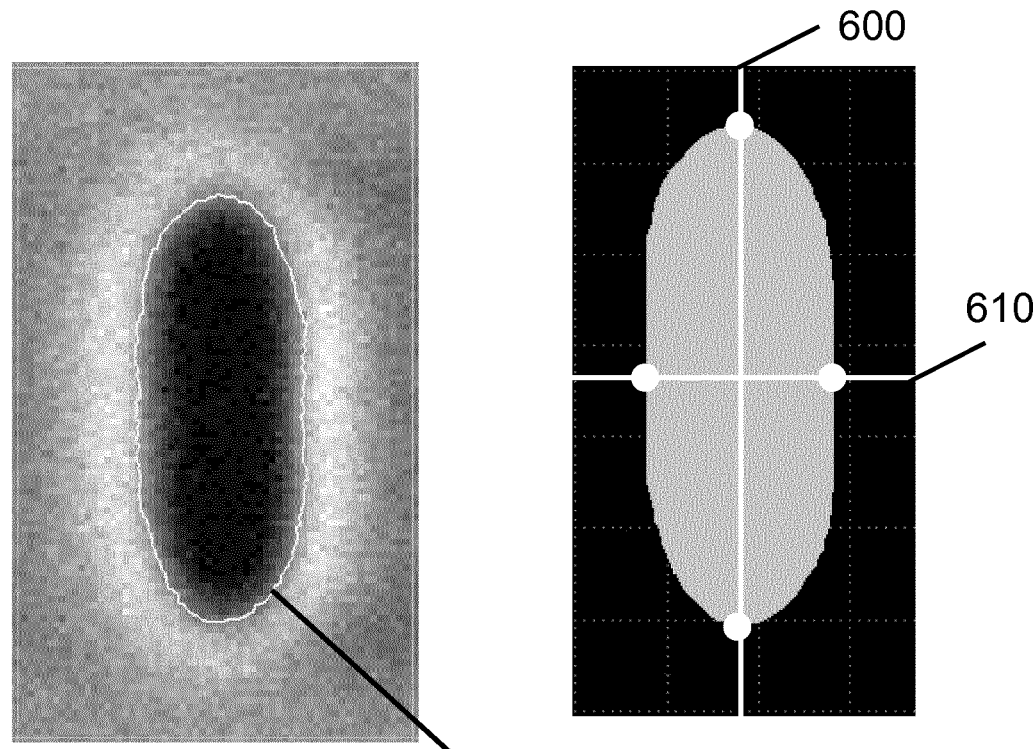
Fig. 7B
Fig. 7C

700 → Fig. 8A ← 710

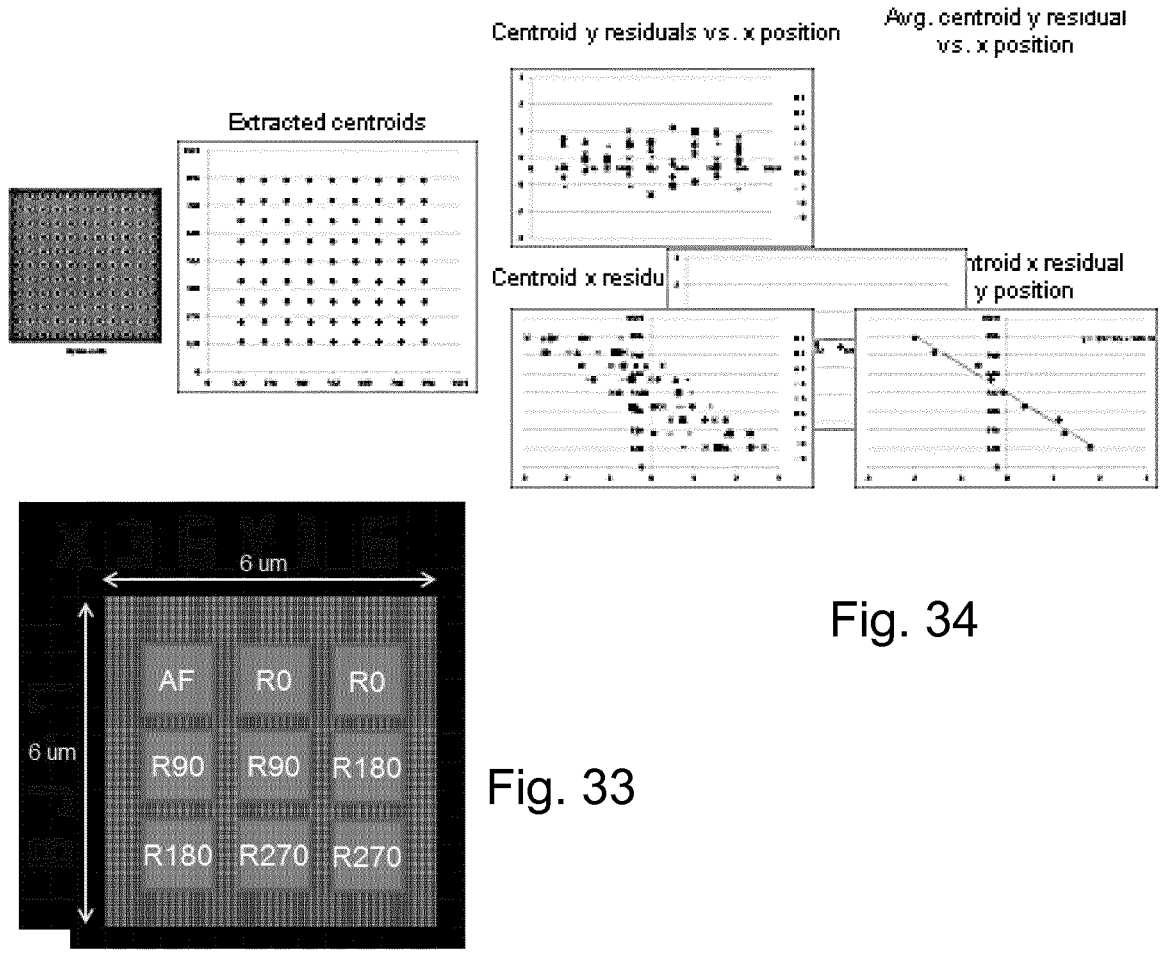
Fig. 34
Fig. 33
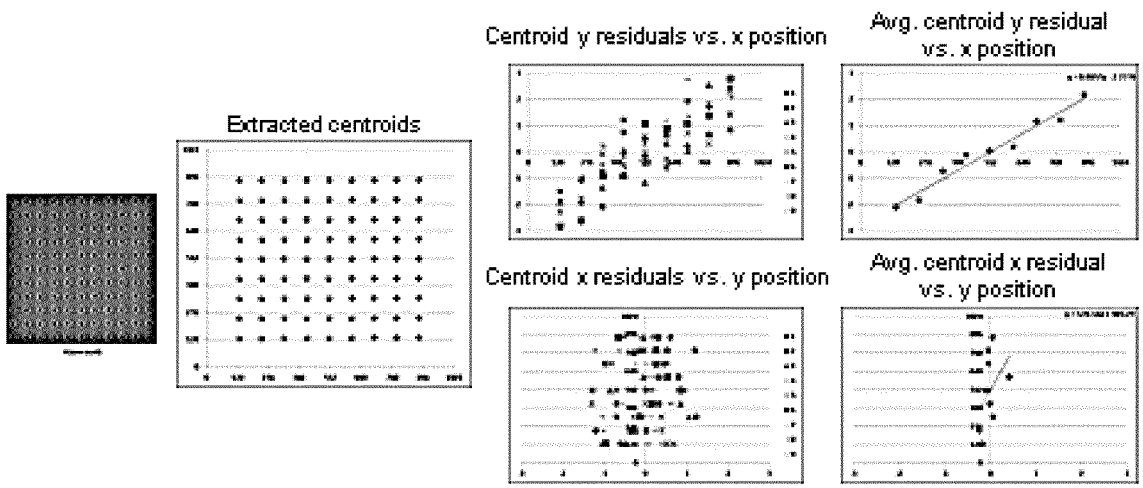
Fig. 35

METHOD AND APPARATUS FOR PATTERN CORRECTION AND VERIFICATION

CROSS-REFERENCE TO RELATED APPLICATIONS

This application is the U.S. National phase entry of PCT patent application No. PCT/EP2016/073554, which was filed on Oct. 3,2016, claims the benefit of priority of U.S. provisional application no. 62/239,165, which was filed on Oct. 8, 2015 , and U.S. provisional application no. 62/402, 636, which was filed on Sep. 30, 2016 , which are incorporated herein in their entireties by reference.

FIELD

The present description relates to methods and apparatus for pattern correction and verification using high-resolution images.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

In a patterning process (i.e., a process of creating a device or other structure involving patterning (such as lithographic exposure or imprint), which may typically include one or more associated processing steps such as development of resist, etching, etc.), it is desirable to create one or more models that model one or more aspects of the patterning process. Such one or models may include one or more models that convert a designed pattern and correct it in order to compensate for one or more distortions arising during the patterning process. Distortion may arise from optics, patterning material, a substrate property, a process characteristic, etch, among others. Models of various types (loosely identified as optical proximity correction (OPC) models) are calibrated and verified using different kinds of pattern structures. Doing so involves measurement of structures created with the patterning process. One or more parameters of those measured structures are typically measured or determined, for example the critical dimension of a structure, the overlay error between successive layers formed in or on the substrate, etc. There are various techniques for making measurements of the microscopic structures formed in a patterning process. Various tools for making such measurements are known including, but not limited to, scanning electron microscopes (SEMs), which are often used to measure critical dimension (CD). SEMs have high resolving power and are capable of resolving features with sub-nanometer precision. Additionally, it is desirable to make measurements of structures created with the patterning process and use them in, e.g., for process design, control and/or verification.

The information contained in images (e.g., SEM images) of patterned structures can be used for patterning process design, correction and/or verification, defect detection or classification, yield estimation and/or process control or monitoring. Such images may be processed to extract contours that describe the edges of objects, representing, e.g., device or measurement structures, in the image. These contours are then quantified via metrics, such as CD. Thus, typically, the images of structures are compared and quantified via metrics, such as an edge-to-edge distance (CD) or simple pixel differences between images. Accordingly, there is desired a method and apparatus to obtain improved geometric dimensions from one or more images.

In an embodiment, there is provided a method comprising: providing a plurality of unit cells for a plurality of gauge patterns appearing in one or more images of one or more patterning process substrates, each unit cell representing an instance of a gauge pattern of the plurality of gauge patterns; averaging together image information of each unit cell to arrive at a synthesized representation of the gauge pattern; and determining a geometric dimension of the gauge pattern based on the synthesized representation.

In an embodiment, there is provided a method comprising: determining, by a hardware computer system, a SEM image metric for a portion of a SEM image of a pattern produced by a patterning process on a substrate; and determining, by the hardware computer system, a weighting factor for a model error function based on the SEM image metric.

In an embodiment, there is provided a method of manufacturing devices wherein a device pattern is applied to a series of substrates using a patterning process, the method including evaluating a structure created using the patterning process using a method as described herein and controlling and/or designing the patterning process for one or more of the substrates in accordance with the result of the method.

In an embodiment, there is provided a non-transitory computer program product comprising machine-readable instructions configured to cause a processor to cause performance of a method as described herein.

In an embodiment, there is provided a system comprising: a scanning electron microscope configured to provide an image of a lithographically created structure; and an image analysis engine comprising a non-transitory computer program product as described herein. In an embodiment, the system further comprises a lithographic apparatus comprising a support structure configured to hold a patterning device to modulate a radiation beam and a projection optical system arranged to project the modulated onto a radiation-sensitive substrate.

BRIEF DESCRIPTION OF THE DRAWINGS

Embodiments will now be described, by way of example only, with reference to the accompanying drawings in which:

FIG. 6A schematically depicts a gauge pattern and FIGS. 6B, 6C, 6D, 6E and 6F schematically depict algorithms for determining a gauge for the gauge pattern;

FIG. 7A schematically depicts an embodiment of unit cells of a SEM image of a plurality of instances of a gauge pattern, FIG. 7B schematically depicts an example of a synthesized unit cell image that is the result of unit cell averaging of the SEM image of the plurality of instances of the gauge pattern, and FIG. 7C schematically depicts the gauges determined for the unit cell averaged gauge pattern;

FIG. 33 schematically shows an example of regions of a patterned substrate from which SEM images are obtained at 0 degrees, 90 degrees, 180 degrees and 270 degrees capture orientations;

FIG. 34 schematically shows an example statistical analysis of SEM images obtained at 0 degrees capture orientation to identify a representative image for distortion correction across a larger set of images;

FIG. 35 schematically shows an example statistical analysis of SEM images obtained at 90 degrees capture orientation to identify a representative image for distortion correction across a larger set of images;

DETAILED DESCRIPTION

Before describing embodiments in detail, it is instructive to present an example environment in which embodiments may be implemented.

Figure 1:
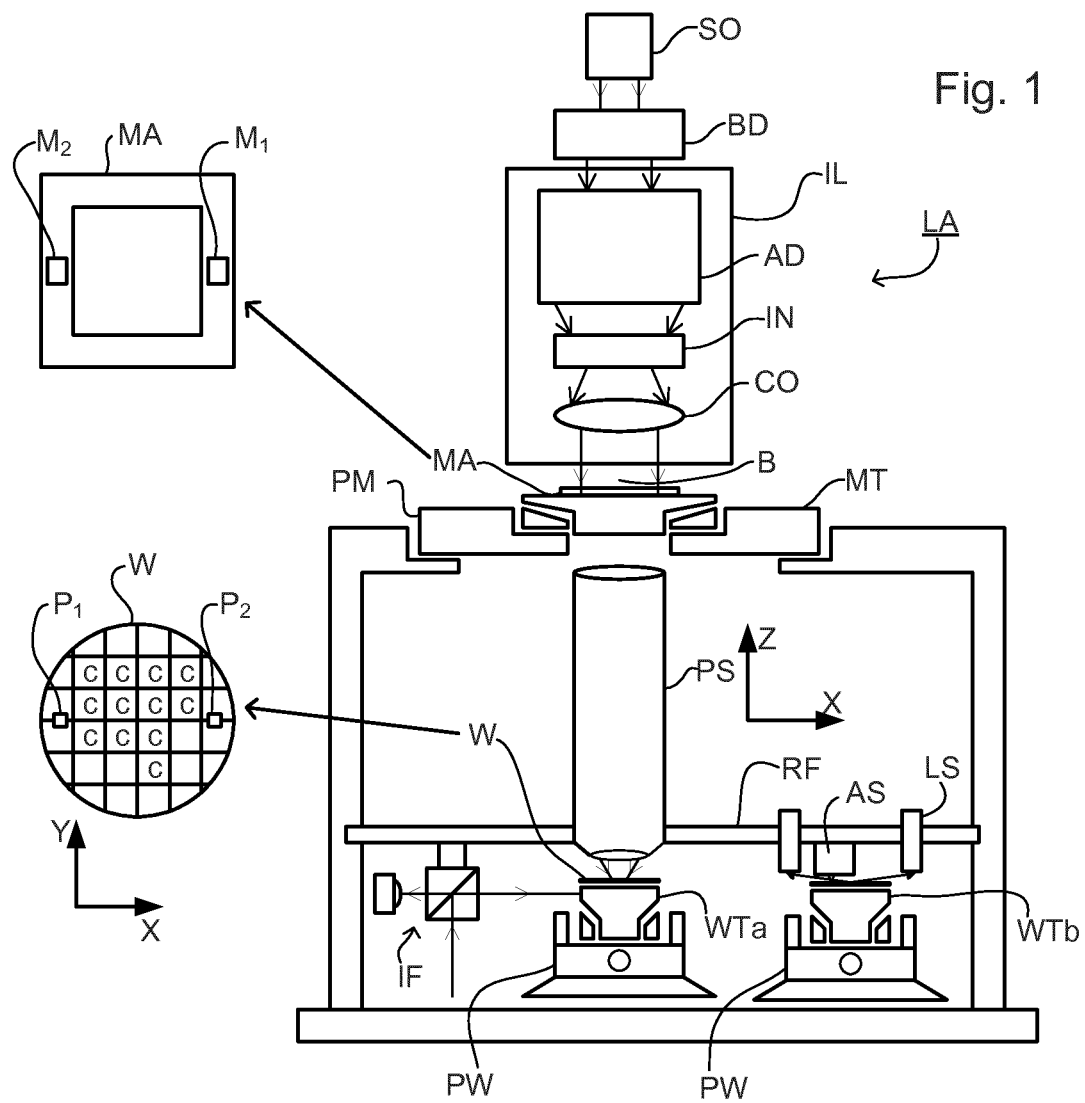
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive or reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as CS-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
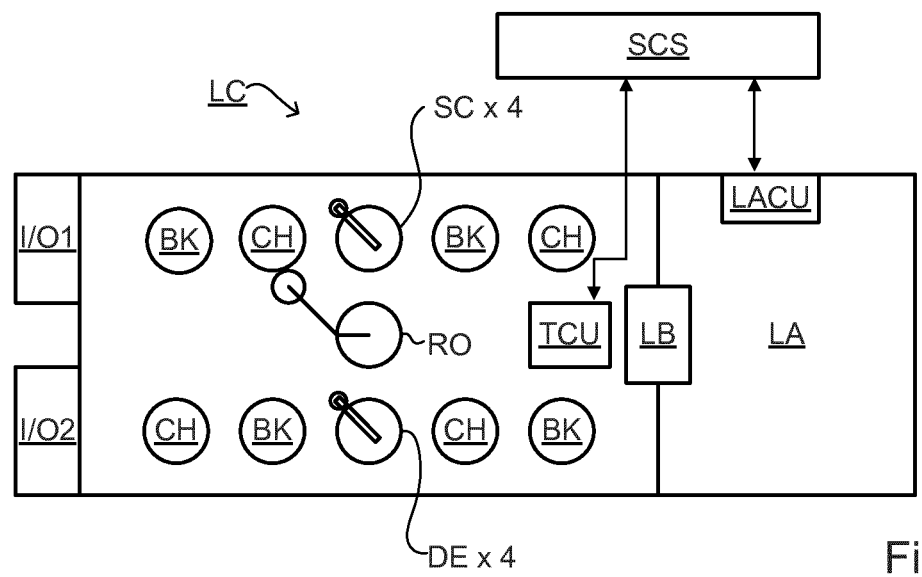
FIG. 2 schematically depicts an embodiment of a lithographic cell or cluster.

As shown in FIG. 2, the lithographic apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

It is desirable to inspect an exposed substrate to measure one or more properties such as overlay error between subsequent layers, line thickness, critical dimension (CD), etc. If an error is detected, an adjustment may be made to an exposure of one or more subsequent substrates. This may particularly useful, for example, if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from a lithographic process step. As discussed further below, measurements may be used in the patterning process design (e.g., in designing the device design).

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. In an embodiment, the measurement may be taken of the latent image in the resist. But, the latent image in the resist has a very low contrast—there is only a very small difference in refractive index between the part of the resist which has been exposed to radiation and that which has not. So, measurements may be taken after the post-exposure bake step (PEB) which is customarily the first step carried out on an exposed substrate and increases the contrast between exposed and unexposed parts of the resist. At this stage, the image in the resist may be referred to as semi-latent. Further, in an embodiment and commonly, measurements may be made of the developed resist image—at which point either the exposed or unexposed parts of the resist have been removed—or after a pattern transfer step such as etching. Measuring after etching limits the possibility for rework of a faulty substrate but may still provide useful information, e.g. for the purpose of process control.

Figure 3:
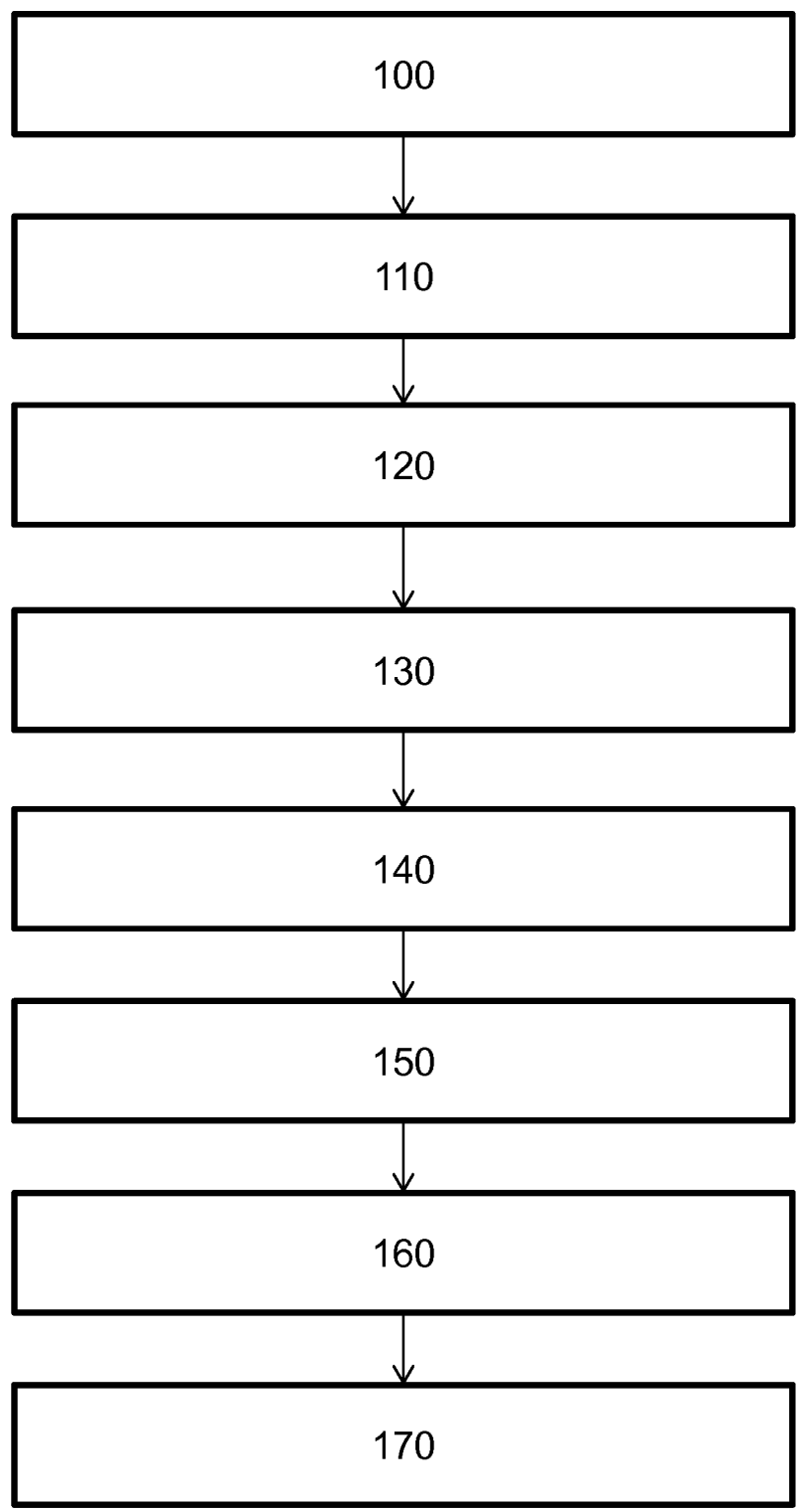
FIG. 3 schematically depicts an embodiment of a system to design a patterning process.

As noted above, one or more aspects of the patterning process need to be designed. To do this, there may be provided one or more tools used in computationally designing those one or more aspects, such as the pattern design for a patterning device (including, for example, adding sub-resolution assist features or optical proximity corrections), the illumination for the patterning device, etc. Accordingly, in a system for computationally designing a manufacturing process involving patterning, the major manufacturing system components and/or processes can be described by various functional modules, for example, as illustrated in FIG. 3. Referring to FIG. 3, the functional modules may include a design layout module 100, which defines a device design (e.g., integrated circuit, memory or electronic device) pattern; a patterning device layout module 110, which defines how the patterning device pattern is laid out in polygons based on the device design; a patterning device model module 120, which models the physical properties of the pixilated and continuous-tone patterning device to be utilized during the simulation process; an optical model module 130, which defines the performance of the optical components of the lithography system; a resist model module 140, which defines the performance of the resist being utilized in the given process; a process model module 150, which defines performance of the post-resist development processes (e.g., etch); and a metrology module 160, which defines the performance of a metrology system used with a metrology target and thus the performance of the metrology target when used with the metrology system. The results of one or more of the simulation modules, for example, predicted contours and CDs, are provided in a result module 170.

The properties of the illumination and projection optics are captured in the optical model module 130 that includes, but is not limited to, NA-sigma (σ) settings as well as any particular illumination source shape, where σ(or sigma) is outer radial extent of the illuminator. The optical properties of the photo-resist layer coated on a substrate—i.e. refractive index, film thickness, propagation and polarization effects—may also be captured as part of the optical model module 130, whereas the resist model module 140 describes the effects of chemical processes which occur during resist exposure, post exposure bake (PEB) and development, in order to predict, for example, contours of resist features formed on the substrate. The patterning device model module 120 captures how the design features are laid out in the pattern of the patterning device and may include a representation of detailed physical properties of the patterning device, as described, for example, in U.S. Pat. No. 7,587,704. The objective of the simulation is to accurately predict, for example, edge placements and CDs, which can then be compared against the device design. The device design is generally defined as the pre-OPC patterning device layout, and will be provided in a standardized digital file format such as GDSII or OASIS.

In general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process. However, sometimes the model parameters may be inaccurate from measurement and reading errors, and there may be other imperfections in the system. With precise calibration of the model parameters, extremely accurate simulations can be done.

Figure 4:
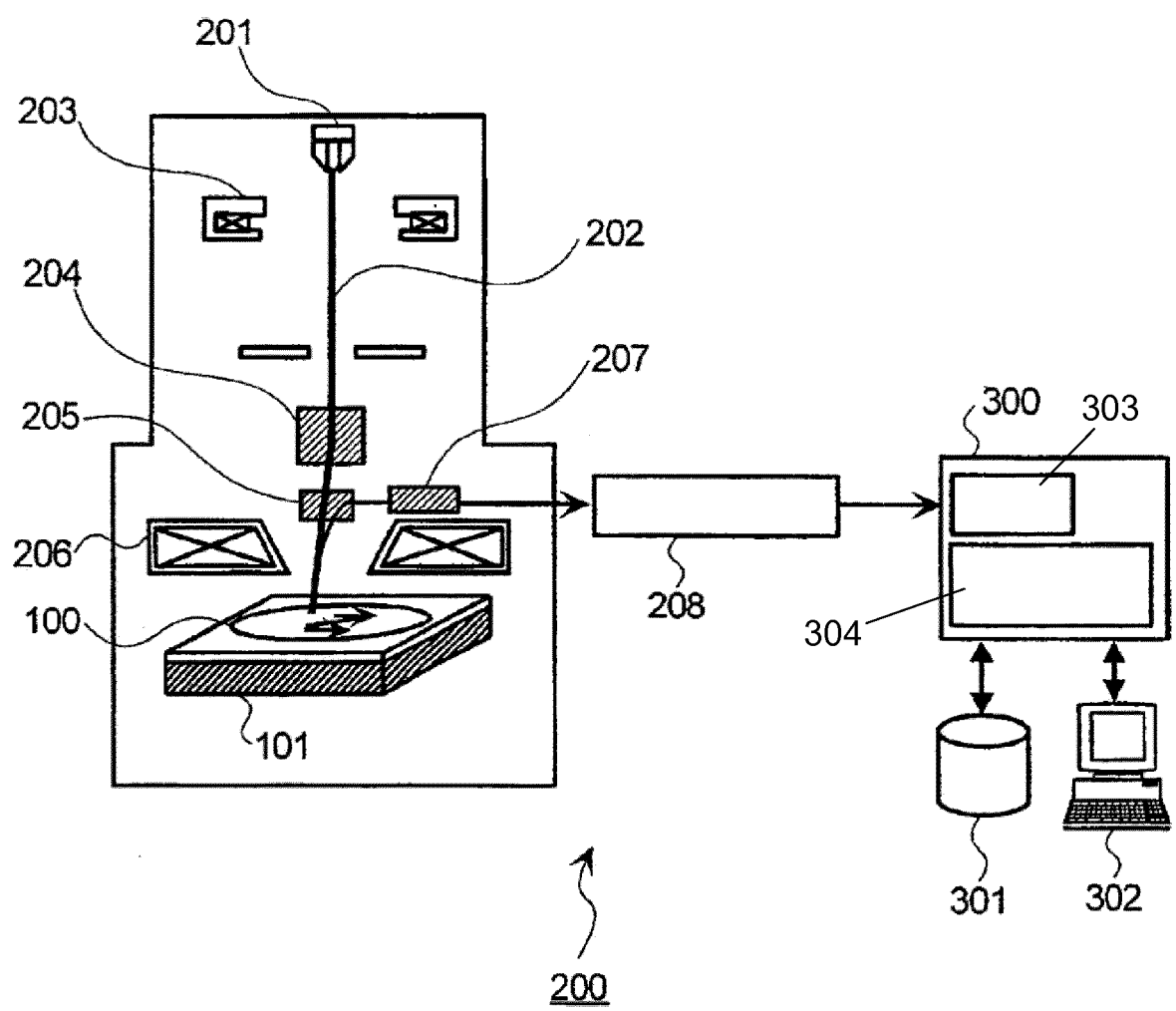
FIG. 4 schematically depicts an embodiment of a scanning electron microscope (SEM)

To enable calibration of the computational models (and optionally in order that the substrate that is exposed by the lithographic apparatus is exposed correctly and consistently), it is desirable to take various measurements of patterns printed on a substrate using an inspection apparatus. In some embodiments, the inspection apparatus may be a scanning electron microscope (SEM) that yields an image of one or more structures (e.g., one or more test (or calibration) patterns or one or more patterns corresponding to some or all the structures of a device) exposed or transferred on the substrate. FIG. 4 depicts an embodiment of a SEM 200. A primary electron beam 202 emitted from an electron source 201 is converged by condenser lens 203 and then passes through a beam deflector 204, an E×B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction.

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software) is configured to convert or process the digital images into datasets representative of the digital images. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

Returning back to designing a patterning process, sophisticated fine-tuning steps may be applied to the illumination, projection system and/or patterning device design. These include, for example, but not limited to, optimization of numerical aperture, optimization of coherence settings, customized illumination schemes, use of phase shifting features in or on a patterning device, optical proximity correction in the patterning device layout, placement of sub-resolution assist features in the patterning device layout or other methods generally defined as "resolution enhancement techniques" (RET).

As an example, optical proximity correction (OPC, sometimes also referred to as optical and process correction) addresses the fact that the final size and placement of a printed feature on the substrate will not simply be a function of the size and placement of the corresponding feature on the patterning device. For the small feature sizes and high feature densities present on typical circuit designs, the position of a particular edge of a given feature will be influenced to a certain extent by the presence or absence of other adjacent features. In an embodiment, these proximity effects arise from coupling of radiation from more than one feature. In an embodiment, proximity effects arise from diffusion and other chemical effects during post-exposure bake (PEB), resist development, and etching that generally follow lithographic exposure.

In order to help ensure that the features are generated on a substrate in accordance with the requirements of the given device design, proximity effects should be predicted utilizing sophisticated numerical models, and corrections or pre-distortions are applied to the design of the patterning device before successful manufacturing of devices becomes possible. These modifications may include shifting or biasing of edge positions or line widths and/or application of one or more assist features that are not intended to print themselves, but will affect the properties of an associated primary feature.

The application of a model-based patterning process design requires good process models and considerable computational resources, given the many millions of features typically present in a chip design. However, applying model-based design is generally not an exact science, but an iterative process that does not always resolve all possible weaknesses of a device design. Therefore, post-OPC designs, i.e. patterning device layouts after application of all pattern modifications by OPC and any other RET's, should be verified by design inspection, e.g., intensive full-chip simulation using calibrated numerical process models, in order to reduce the possibility of design flaws being built into the manufacturing of a patterning device.

Further, since computational patterning process design should involve robust models that describe the patterning process precisely, a calibration procedure for such models should be used to achieve models that are valid, robust and accurate across the process window. In an embodiment, calibration is done by printing a certain number of 1-dimensional and/or 2-dimensional gauge patterns on a substrate (e.g., the gauge patterns may be specially designated measurement patterns or may be device parts of a design device pattern as printed on the substrate) and performing measurements on the printed patterns. More specifically, those 1-dimensional gauge patterns are line-space patterns with varying pitch and CD, and the 2-dimensional gauge patterns typically include line-ends, contacts, and/or SRAM (Static Random Access Memory) patterns. These patterns are then imaged onto a substrate and resulting substrate CDs or contact hole (also known as a via or through-chip via) energy are measured. The original gauge patterns and their substrate measurements are then used jointly to determine the model parameters which reduce or minimize the difference between model predictions and substrate measurements. In an embodiment, the one or more gauge or calibration patterns may not correspond to structures in a device. But, the one or more gauge or calibration patterns possess enough similarities with one or more patterns in the device to allow accurate prediction of the one or more device patterns.

Figure 5:
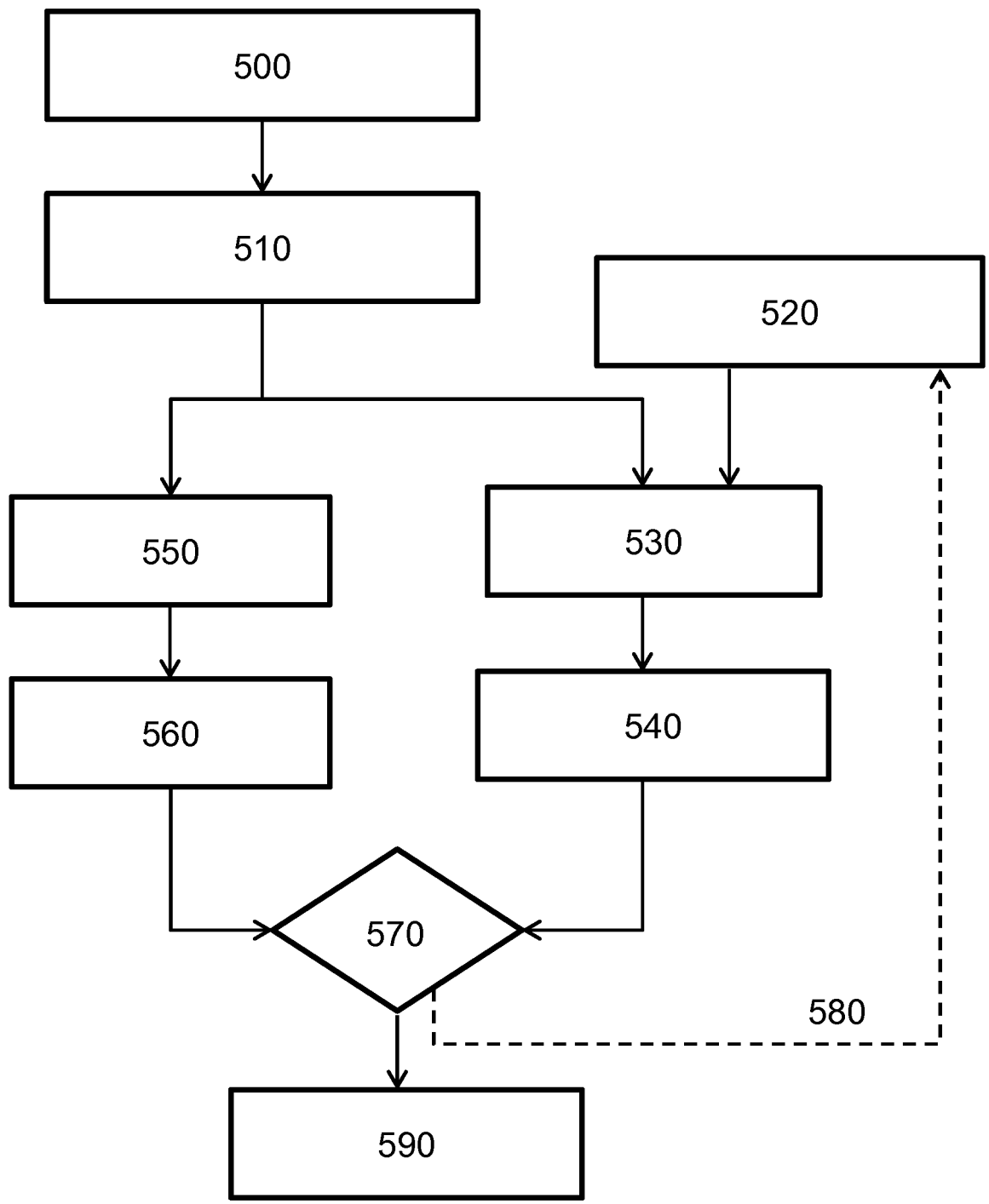
FIG. 5 is an exemplary block diagram illustrating a calibration process for a patterning process model.

An example model calibration process as described above is illustrated in FIG. 5. The process begins with a design layout 500, which can include gauges and optionally other test patterns, and which design layout may include OPC or other RET features. Next, the design layout is used to generate a patterning device layout at 510, which can be in a standard format such as GDSII or OASIS. Then, in an embodiment, two separate paths are taken, for simulation and measurement.

In a simulation path, the patterning device layout and a model 520 are used to create a simulated resist image in step 530. The model 520 provides a model of the patterning process for use in computational lithography, and the calibration process aims to make the model 520 as accurate as possible, so that computational lithography results are likewise accurate. The simulated resist image is then used to determine predicted critical dimensions (CDs), contours, etc. in step 540.

In a measurement path, the patterning device layout 304 is used with or to form a physical mask (e.g., a reticle), which is then imaged onto a substrate at 550. The patterning process (e.g. NA, focus, dose, illumination source, etc. for optical lithography) used to pattern the substrate is the same as that intended to be captured in model 520. Measurements (e.g. using a metrology tool (such as a SEM, etc.) are then performed on the actual patterned substrate at 560, which yields measured CDs, contours, etc.

A comparison is made at 570 between the measurements from 560 and the predictions from 540. If the comparison determines that the predictions match the measurements within a predetermined error threshold, the model is considered to be successfully calibrated at 590. Otherwise, changes are made to the model 520, and steps 530, 540 and 570 are repeated until the predictions generated using the model 520 match the measurements within a predetermined threshold. In an embodiment, the model comprises an OPC model. While the description hereafter will focus on an OPC model as an embodiment, the model may be other than or in addition to an OPC model.

Referring now to FIG. 6, schematics of a gauge pattern are depicted that present a challenge for two-dimensional metrology methods. FIG. 6A illustrates a generally elliptical gauge pattern, which can be used for calibration of, for example, an OPC model. The calibration of an OPC model is effectively aiming to create a model that minimizes an error associated with what are called gauges. The gauges are the imaginary lines 600, 610 that are superimposed on the contours of a shape that is measured, i.e., the gauge 600 for CD in the y direction and the gauge 610 for CD in the x direction. The gauges are positioned at specific spots in a substrate layout and try to essentially represent the actual crossing points of any given measurement contour at those specific gauge line positions. Moreover, thousands of different measurements and/or shapes are made for any given OPC model, so there is a variety of shapes present on any substrate that are measured and all of them should be measured well if they are to report values that correspond to what the actual OPC model would like to have as far as information corresponding to the gauge positions.

So, ideally, the measurements that are made using a CD-SEM would correspond exactly to those crossing points. But, in practice, that may not be the case. Rather, when one configures measurements for these kinds of shapes using a CD-SEM, the CD-SEM is configured in a way that requires some choices of measurement algorithms. Referring then to FIGS. 6B-6F, examples of some of the types of algorithms that are typically used to measure these kinds of shapes are depicted. So, referring to FIG. 6B, the CD-SEM might be configured to report the dimensions corresponding to an ellipse fit 620 to the shape. But, as seen in FIG. 6B, the ellipse fit might not be a particularly good choice in the example shape shown in FIG. 6B. FIG. 6C depicts another example of algorithm that involves sweeping parts of the shape. FIG. 6C depicts an example of an arc sweep in the Y-direction algorithm 630. This algorithm basically sweeps the tips of the shape and estimates what the actual gauge dimension is based on a fit to that sweep. FIG. 6D depicts a further algorithm 640 by which parts of the shape can be measured by basically performing a width base measurement (in this case in FIG. 6D, in the X-direction). This is more or less an averaging box by which an average along the length of the shape is determined. The average is used and reported as a measurement that could be used to associate with the desired gauge measurement. Then, FIGS. 6E and 6F depict example of an arc sweep in the X-direction algorithm 630. This algorithm basically angularly sweeps the sides of the shape and estimates what the actual gauge dimension is based on a fit to that sweep. Further, these different measurement algorithm choices can be combined in different ways in the configuration of the way that the CD-SEM is run, e.g., width in the X or Y direction plus arc sweep in the X or Y direction, or width in the X-direction plus width in the Y-direction, or arc sweep in the Y-direction plus arc sweep in the X-direction.

So, essentially all measurements that are made using a CD-SEM are specified to be made using a certain algorithm or a certain set of algorithms. So, the CD-SEM receives measurement algorithm specifications ahead of time regarding how it should measure any given image that it captures and how it should then use that measurement methodology to report a result. This may turn out to be problematic.

For example, it is difficult to predict ahead of time exactly what a shape will be and so it is quite possible to make decisions that are less than ideal when it comes to making a prediction. Nevertheless, at the end of the measurement, the CD-SEM will report as requested even though the prediction may not have been perfect. Additionally or alternatively, the shapes that are being measured may not correspond exactly to any particular algorithm that is used to attempt to measure them. That is, some shapes are not particularly well measured by any given set of algorithms.

For example, some gauge patterns may be slot-like or ellipse-like, but not really either one. So, for example, if the curvature at the end of the shape is not necessarily well defined, if it is more box-like as opposed to being more rounded then perhaps an arc sweep algorithm may misfit that shape. As another example, for the width in the X-direction algorithm, if there is some curvature in the side of the shape that is being measured that will distort the average value that is ultimately reported. The result is that choice of an algorithm creates algorithm dependent offsets in the data. So, for example, if shapes are ellipse-like they should desirably be measured using an ellipse algorithm. And, for example, if shapes are slot-like, then they should probably be measured as a combination of a width algorithm and an arc sweep type algorithm. But there are many shapes where it is not known, and cannot be known, at the time of measurement which algorithm is appropriate because the shapes are neither an ellipse nor a slot but rather some intermediate shape. Nevertheless, an algorithm choice is made up front and the measurement offset between the measurement methodologies can be quite significant for any particular shape that is neither perfectly an ellipse nor a slot. For example, there may be a 5 percent (as fraction of measured CD) or larger difference in terms of measuring any of those intermediate shapes as an ellipse versus as a width measurement. So essentially for any intermediate shape, there will be a bouncing back and forth between measuring using a particular algorithm(s) and measuring using another algorithm(s) that inherently creates an algorithm induced jitter in the quality of the measurement data.

Thus, if there is some mistake in the prediction, this will distort the data and for many shapes, there may be no absolutely correct prediction and so there is some expectation of distortion of the data. So, different shapes should be measured in different ways yet different algorithms have to be assumed and assigned, all of which leads to a great deal of complexity and possibility of error.

Accordingly, in an embodiment, there is provided a solution to this algorithm sensitivity that is part of two-dimensional metrology methods for, e.g., OPC correction measurements and models. In particular, a solution aims to avoid the use of shape-fitting algorithms to determine the gauge as part of the measurement. To do so, a solution works on the strengths of the way that OPC measurements are done.

So, in an embodiment, the typical repeating patterns that are captured in CD-SEM images are used to basically create superior representations of the average of those patterns. Then, measurements in those superior representations of the pattern are carried out that can be implemented without using shape-fitting algorithms to determine the gauge during measurement. So, the measurements can more closely represent the actual measurements that are desirable for inputting into OPC modelling software for, e.g., calibration.

Referring to FIG. 7A, an example of a SEM image is depicted with a relatively large number of repeating gauge patterns in it, i.e., a plurality of instances of a gauge pattern. A set 700 of unit cells are identified by image processing, wherein each unit cell 710 encompasses an instance of the repeated gauge pattern. Then, the pattern information of each repeating unit cell 710 is extracted from the SEM image. The extracted information from the plurality of unit cells are averaged together to create a synthetic representation of the average of those unit cells as shown in FIG. 7B. In an embodiment, the extracted information is pixels of the image and so the pixel values (e.g., intensity) are averaged. The result is a quite substantial signal to noise improvement, e.g., a signal to noise enhancement of about 9 times or more. Using this synthesized unit cell image of the gauge pattern (i.e., the synthetic representation of the average of the unit cells of the instances of the gauge pattern), a contour fit 720 can be applied to the shape provided in that synthesized unit cell image. This contour fit has a relatively high quality because of the relatively high signal to noise ratio of the synthetic representation of the gauge pattern. No filtering or only minimal filtering may be required to detect the contour. That contour 710 can then be used to determine dimensions at the desired gauge positions. In an embodiment, the contour 710 may be filtered and converted to .gds form as shown in FIG. 7C and from this FIG. 7C representation dimensions at the desired gauge positions can be determined.

In cases where relatively few unit cells are present in an image, unit cells from multiple images may be averaged. So, in an embodiment, the set 700 of unit cells may extend across a plurality of images. In an embodiment, each of the images is associated with the same or substantially same process condition for each image (e.g., the structures in the image were made using the same or substantially same process conditions). So, in an embodiment, multiple images are captured under the substantially same process conditions. In an embodiment, each image of a plurality of images may be created under a different process condition, but the averaged unit cells are specific to a specific process condition.

In an embodiment, a subset of the set 700 of unit cells may be used. So, in an embodiment, the set or subset may selected based on focus, dose or other similarities associated with the underlying gauge patterns. For example, the set or subset may be selected based on a predefined range of focus values. This may be particularly applicable to a situation where each image of a plurality of images is not created under identical process conditions.

Thus, this method plays to the strengths of OPC methodologies by still making use of the gauge concept but being able to measure gauge positions without having to rely on any particular shape-fitting algorithms to determine the gauge as part of the measurement. Rather, unit cells of the instances of the gauge pattern are averaged together to create a high quality representation of the gauge pattern, which high quality representation is then used create a high quality contour. A majority of the kinds of patterns that are measured for 2-D OPC can be represented by highly repeating unit cells, such as depicted in FIG. 7A. They may have various different degrees of complexity associated with them and/or different geometries associated with them, but typically there are quite a number of repeats of any of these unit cells in any given SEM image and so this methodology can work with any of them. And so, this unit cell technology can create data that will ultimately create models with higher model accuracy and thus ultimately lead to manufactured devices with better accuracy, better performance, etc.

An advantage of averaging image information such as pixels is that the synthesized unit cell image may avoid the effects of, for example, filtering preprocessing that may be used to extract smooth contours from a noisy SEM image. This filtering may impart an embedded filtering distortion in the synthesized unit cell image.

Figure 8B:
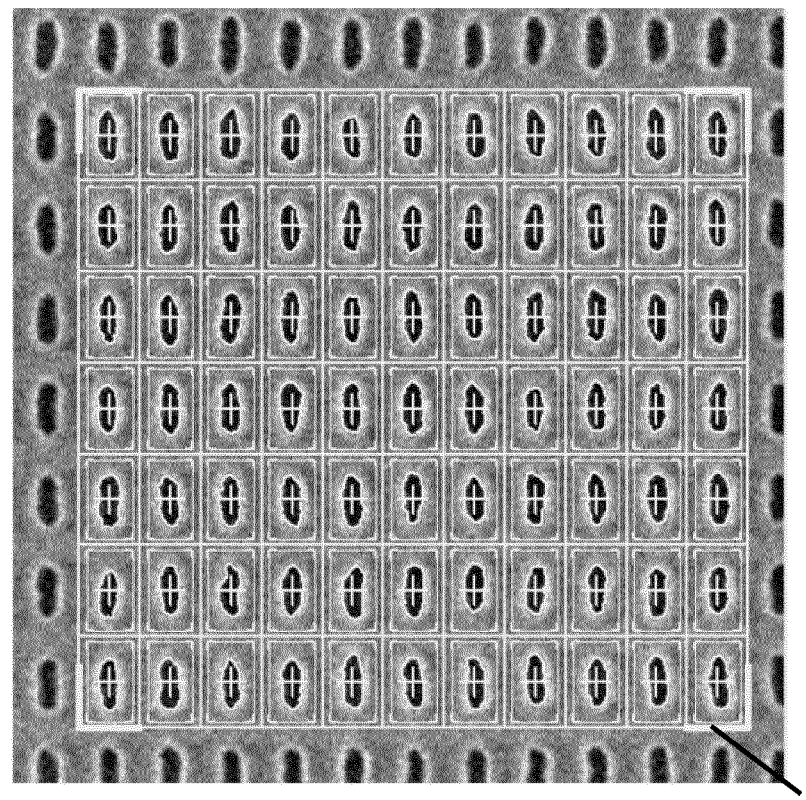
FIG. 8A schematically depicts an embodiment of unit cells of a SEM image a plurality of instances of a gauge pattern, and FIG. 8B schematically depicts extracted contours of the unit cells of FIG. 8A.
Figure 8B:
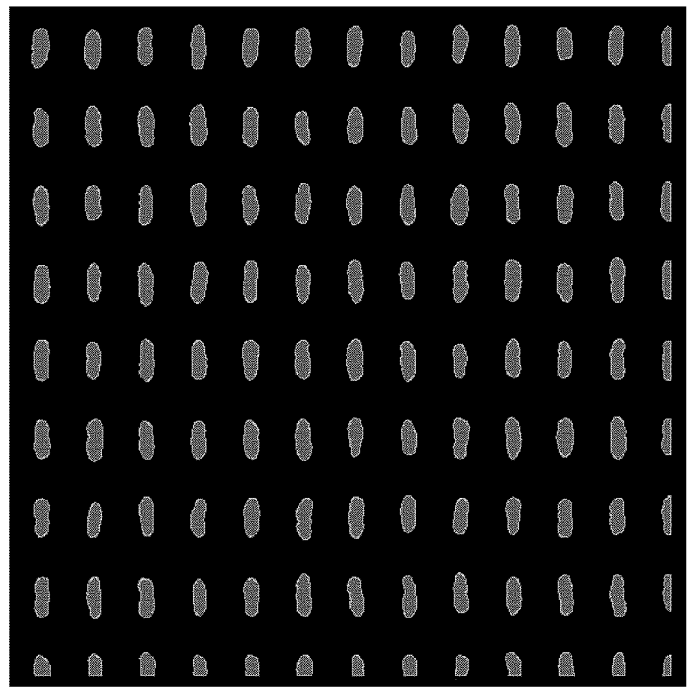

Referring to FIG. 8, in an embodiment, instead of averaging together the image unit cells based on pixel information in the SEM image, the image, such as shown in FIG. 8A, can be processed to extract the contours of the gauge pattern in the image. That is, image filtering could be applied to the image of FIG. 8A and then contour extraction applied along with conversion of the image into .gds form, to create a contoured representation of the image as shown in FIG. 8B. The result would be one contoured image per gauge pattern. Then, as an example, one could synthesize the contours by averaging the contours together.

In a further embodiment, one could take a large number of images of the gauge patterns (for example, a plurality of images of the gauge patterns in FIG. 8A), average the images together and process the individual gauge patterns. That is, the contour is found for the center of any given gauge pattern image, i.e., it finds basically information at one unit cell. But, this may not take advantage of additional information from the other instances of a gauge pattern in the image.

So, in an embodiment, unit cells are synthesized together and associating information with the synthesized unit cell based on the synthesis occurring at the image level helps to, e.g., retain the maximum amount of information and/or minimally distort the information.

Figure 9A:
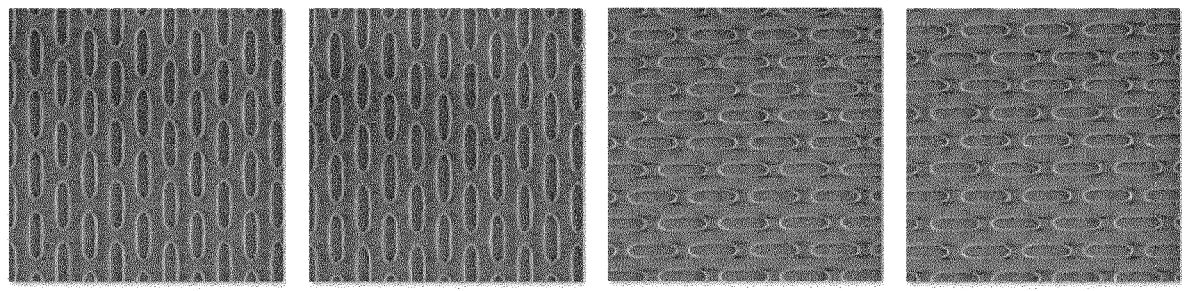
FIG. 9A schematically depicts images of a plurality of instances of a gauge pattern obtained at different measurement orientations.
Figure 9B:
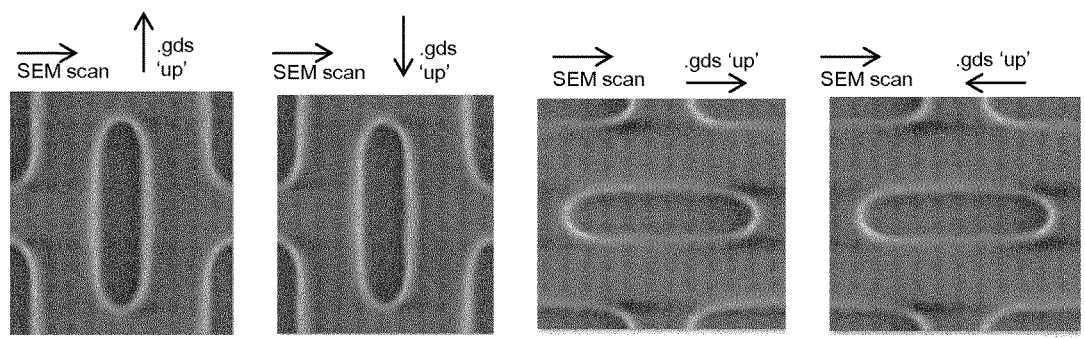
FIG. 9B depicts an example synthesized unit cell image for the gauge pattern for each measurement orientation.
Figure 9C:
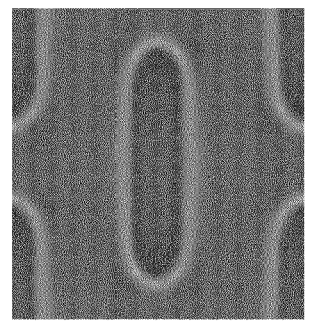
FIG. 9C depicts an example combined synthesized unit cell image for the gauge pattern across all the measurement orientations of FIG. 9A.

Referring to FIG. 9, an embodiment of generating a synthesized representation of a gauge pattern. In this embodiment, a number of images of the gauge patterns are effectively averaged but not by merely averaging the images together. In particular, in this embodiment, SEM images are obtained at different capture orientations. FIG. 9A shows as an example raw SEM images at 4 different orientations, specifically 0 degrees, 180 degrees, 90 degrees, and 270 degrees respectively from left to right. From these images, unit cells can be determined as discussed above and averaged to derive a synthesized unit cell image for each of the different SEM capture orientations as shown in FIG. 9B. That is, from left to right, FIG. 9B shows examples of a synthesized unit cell image for 0 degrees, 180 degrees, 90 degrees, and 270 degrees SEM capture orientations respectively. Then, these synthesized unit cell images for each of the different SEM capture orientations can be re-aligned to have a same orientation (e.g., the design orientation) and then averaged to yield an example combined synthesized unit cell image, as shown in FIG. 9C, that averages the gauge pattern across all the measurement orientations of FIG. 9A. The combined synthesized unit cell image can then be processed for gauge geometric dimension determination. The result is significant signal-to-noise enhancement. While 4 capture orientations are depicted, it will be appreciated that more or less capture orientations can be used (e.g., 8 capture orientations may be used). Further, while capture orientations at 0 degrees, 90 degrees, 180 degrees, and 270 degrees are depicted, it will be appreciated that other capture orientations could be used (e.g., 45 degrees, 135 degrees, 225 degrees, and 315 degrees). So, in an embodiment, a plurality of capture orientations (e.g., 4 or 8) can be used that are selected from: 0 degrees, 45 degrees, 90 degrees, 135 degrees, 180 degrees, 225 degrees, 270 degrees and 315 degrees.

Moreover, when a scanning electron microscope scans there is a rastering and as a result of the rastering, a number of artifacts may be generated in the images. Such artifacts can show up as, for example, black streaks in the synthesized unit cell images in FIG. 9B. So, an advantage of this methodology is that the unit cells from multiple different images captured in multiple different orientations can be ultimately merged together in a way that averages out the artifacts that are present in the images themselves. That is, by taking the synthesized unit cell images, rotating them, aligning them and once again combining them together, the artifacts are substantially attenuated by carrying out this averaging process. So, rotation averaging can at least partially suppress measurement artifacts, such as SEM charging artifacts.

Figure 10A:
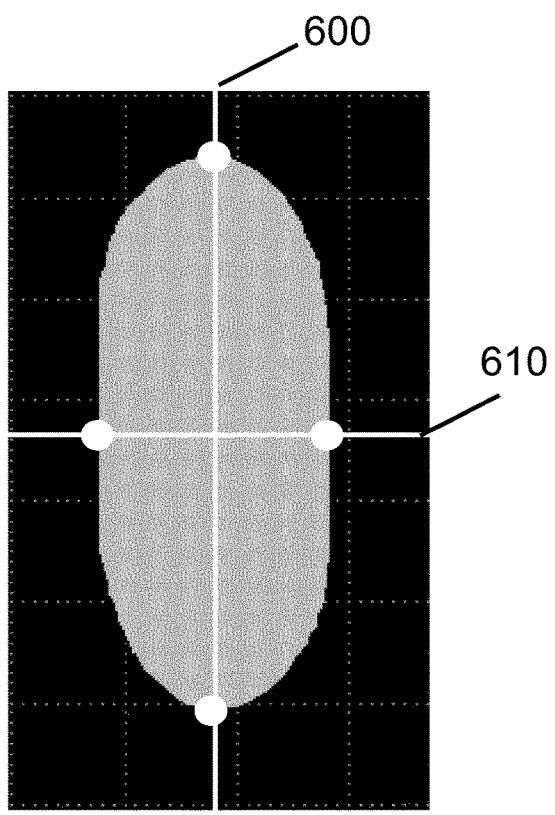
FIG. 10A schematically depicts a gauge measurement of a geometric dimension based on synthesized unit cell image and FIG. 10B depicts contour sampling measurement of a geometric dimension based on synthesized unit cell image.
Figure 10B:
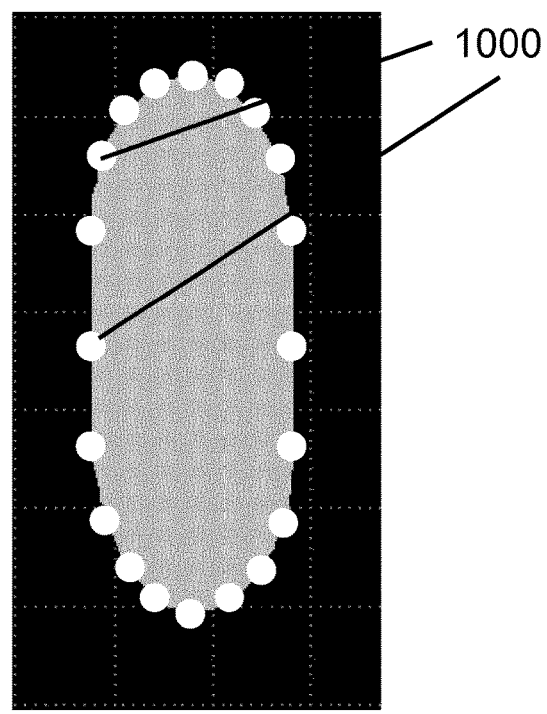

Now referring to FIG. 10, as discussed above, specific positions of any given contour in a SEM image are used to define gauge measurements as shown in FIG. 10A. As discussed previously that contour may be the contour of a synthesized unit cell image of a gauge pattern. In an embodiment, in addition to alternatively to determining gauge measurements as depicted in FIG. 10A, the contour of the synthesized unit cell image may be sampled to arrive at geometric dimensions. Thus, basically, the measurements are obtained at a larger number of positions along the contour. This may yield a more efficient use of the information that is ultimately captured by going through this synthesis technique.

Figure 11:
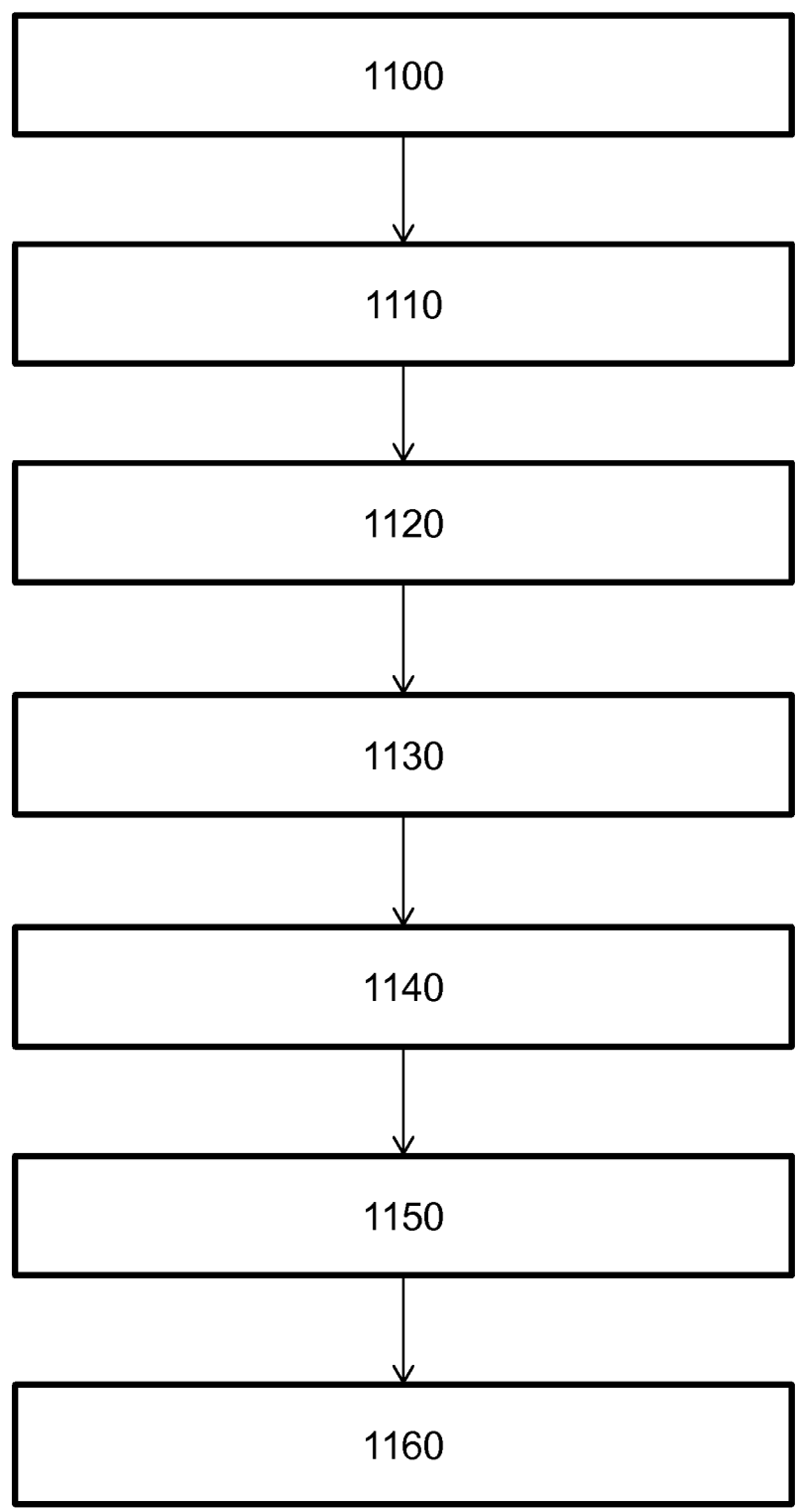
FIG. 11 schematically depicts an embodiment of the modules of a software product to implement the unit cell image synthetization.

In FIG. 11, an implementation of the modules of a software product to implement the unit cell image synthetization is depicted. In particular, the software may be an OPC product that would support metrology for OPC and may ultimately support model calibration and/or verification (e.g., OPC model calibration and/or verification) and thus ultimately support manufacture of devices based on the use of this type of approach. In an embodiment, the software may be an essentially linear, or almost Wizard-like, process flow. In an embodiment, a module 1100 may be provided to import the raw image data (e.g., SEM images from a CD-SEM). From module 1100, the data would be provided to a module 1110 to implement automated image correction using computational image correction techniques. The corrected data may then be provided to module 1120 to synthesize the image. Optionally, a module 1130 may be provided to enable cross-calibration. Cross-calibration can allow the user to automatically calibrate a synthesis measurement recipe that most closely matches measurements from conventional CD-SEM outputs and involves configuration of a subset of images for calibration. Conventional CD-SEM setting inputs (e.g., one or more thresholds, one or more smoothing setting, etc.) may be useful, but may not be required. Whether from module 1120 or module 1130, the synthesized unit cell image may then be provided to module 1140 for contour determination on the synthesized unit cell image. Then, optionally at module 1150, the data may be reviewed, e.g., this module allows user to review, analyze, compare and/or export results. And, then whether from module 1140 or module 1150, a file of geometric dimensions (e.g., gauge measurements) may be created and output at module 1160. The geometric dimensions file may then be fed to a model for the patterning process (e.g., an OPC model) and that model can then be used for verification of what is happening on the substrate and/or for calibration of the model for design of the patterning process.

Figure 12:
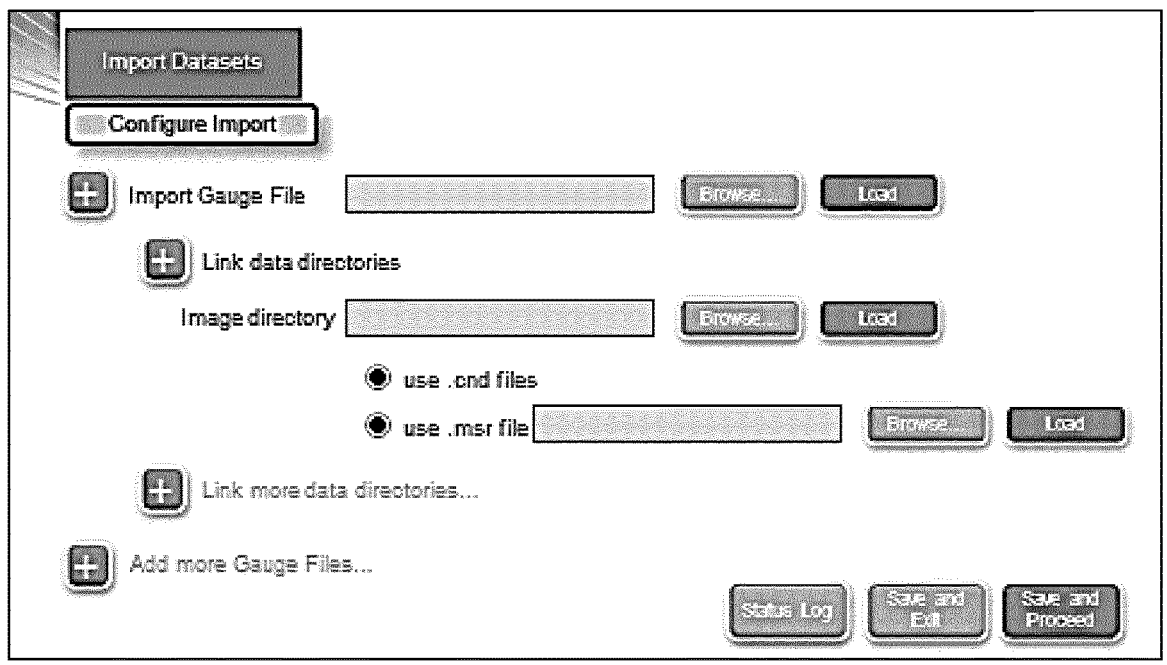
FIGS. 12, 13 and 14 schematically depict embodiments of input screens for importing of image data.
Figure 13:
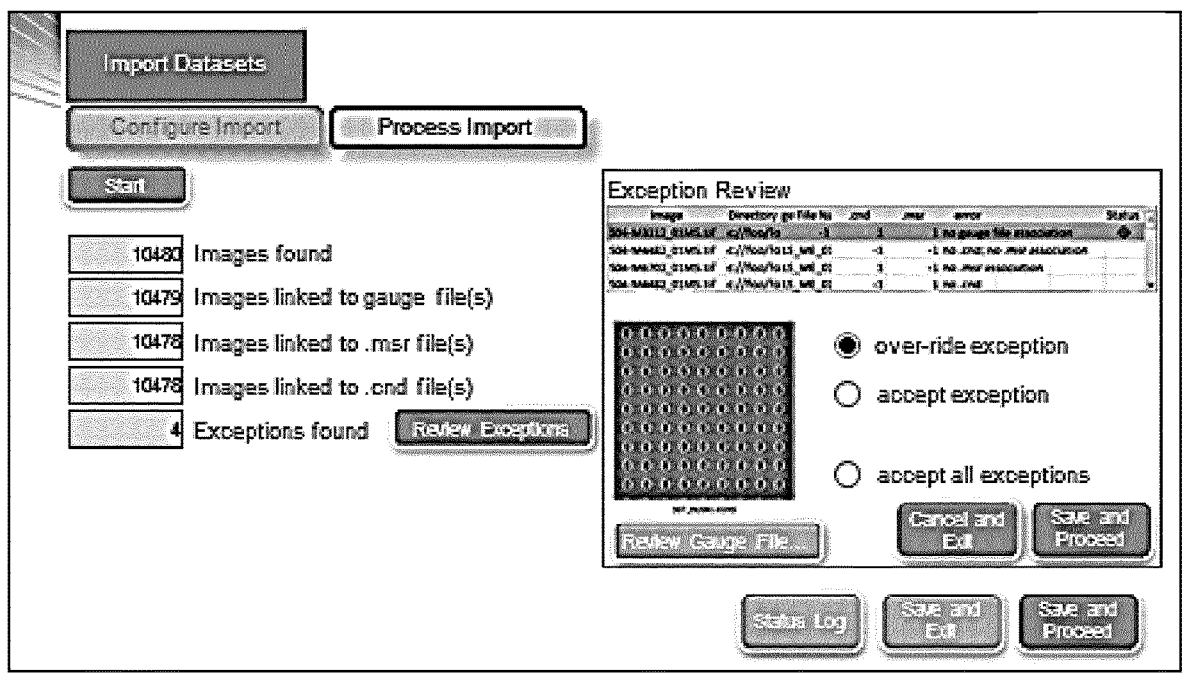
Figure 14:
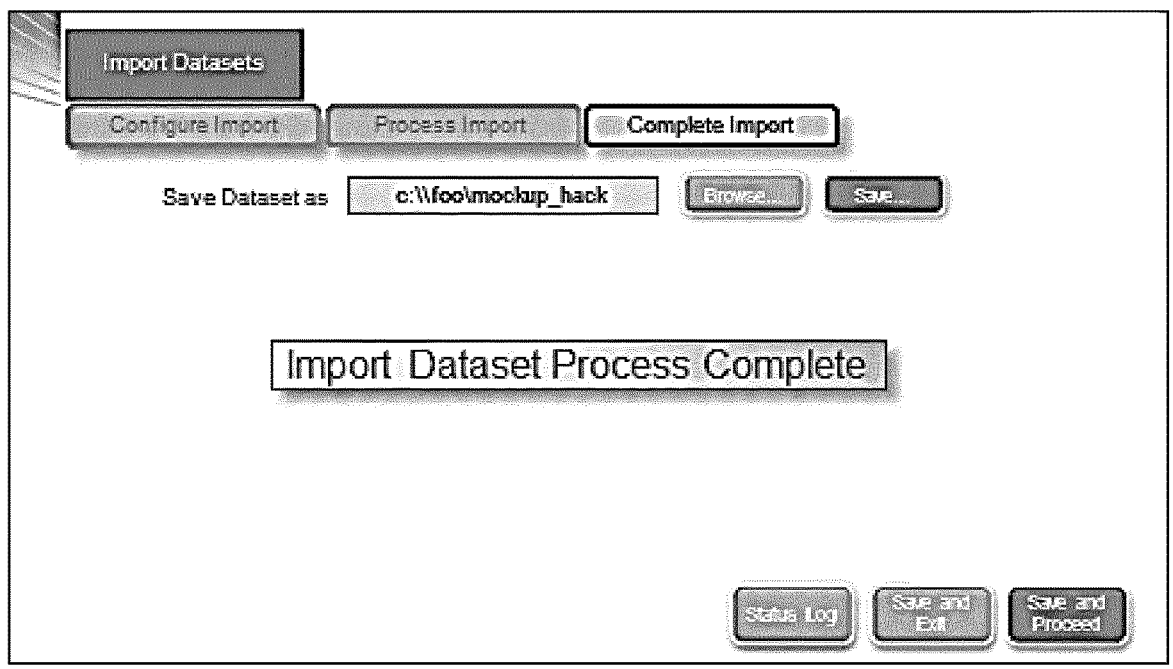
Figure 15:
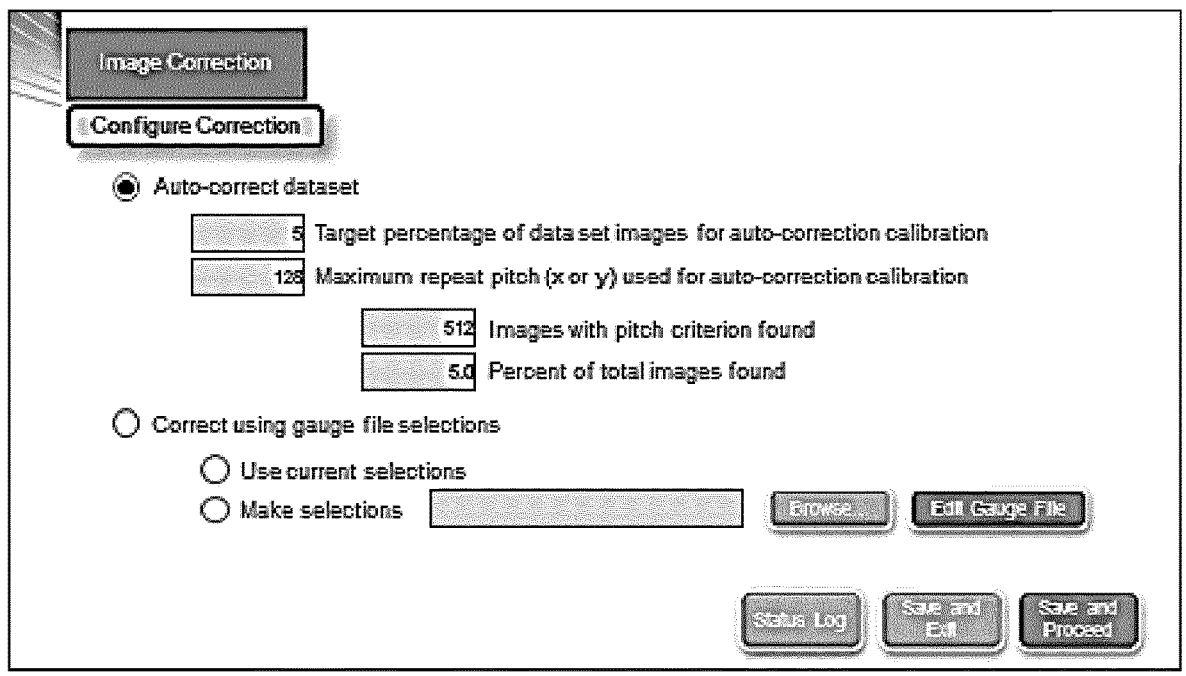
FIGS. 15, 16, 17 and 18 schematically depict embodiments of input screens for correction of the image data.
Figure 16:
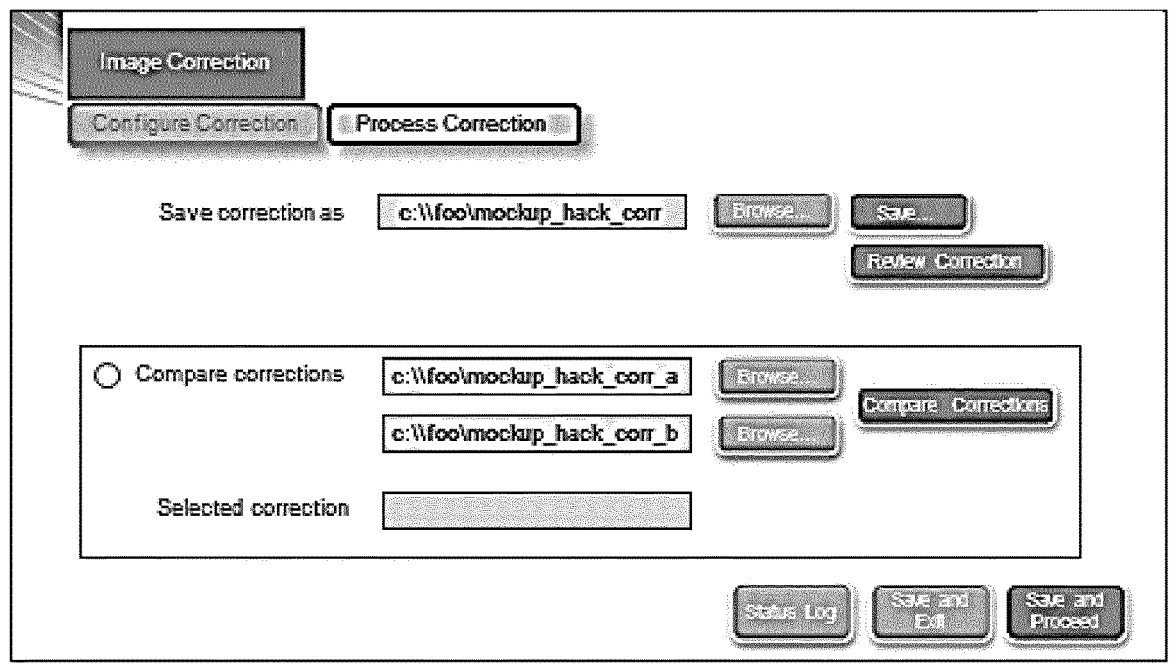
Figure 17:
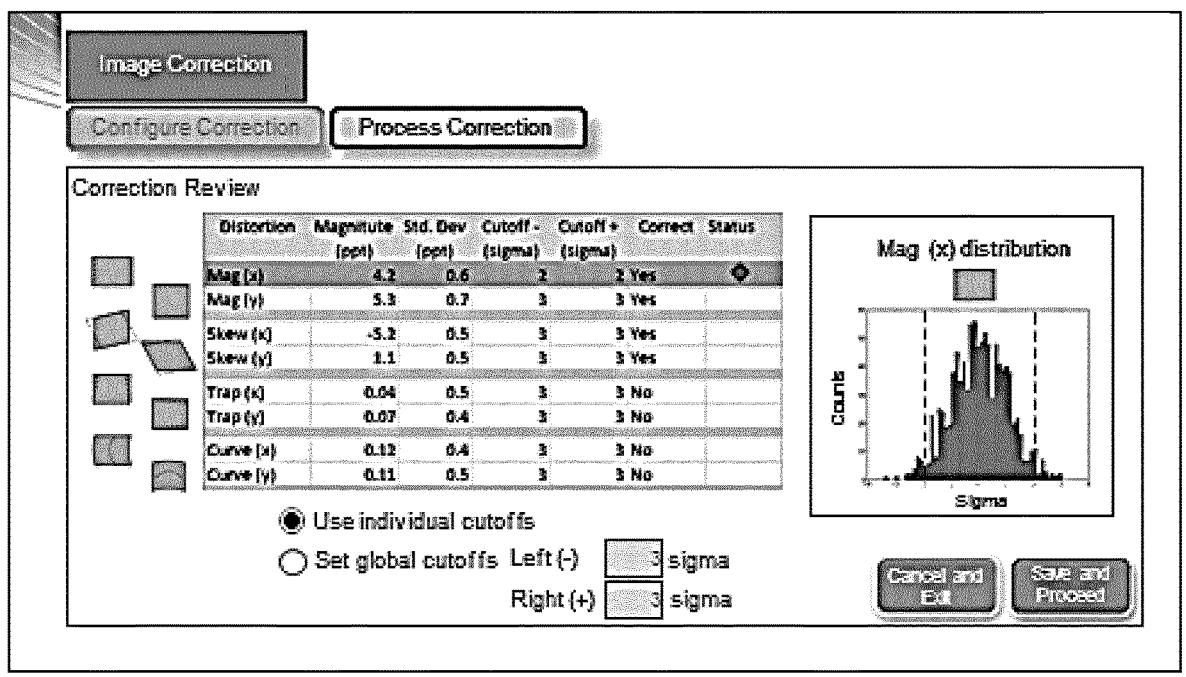
Figure 18:
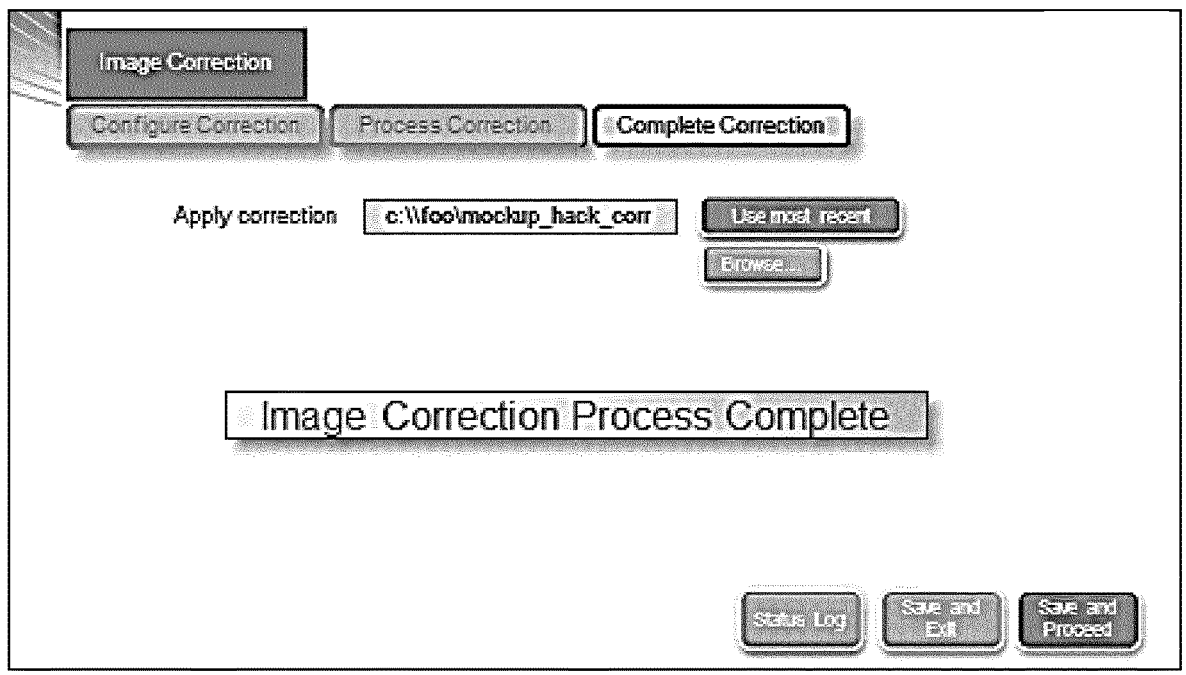
Figure 19:
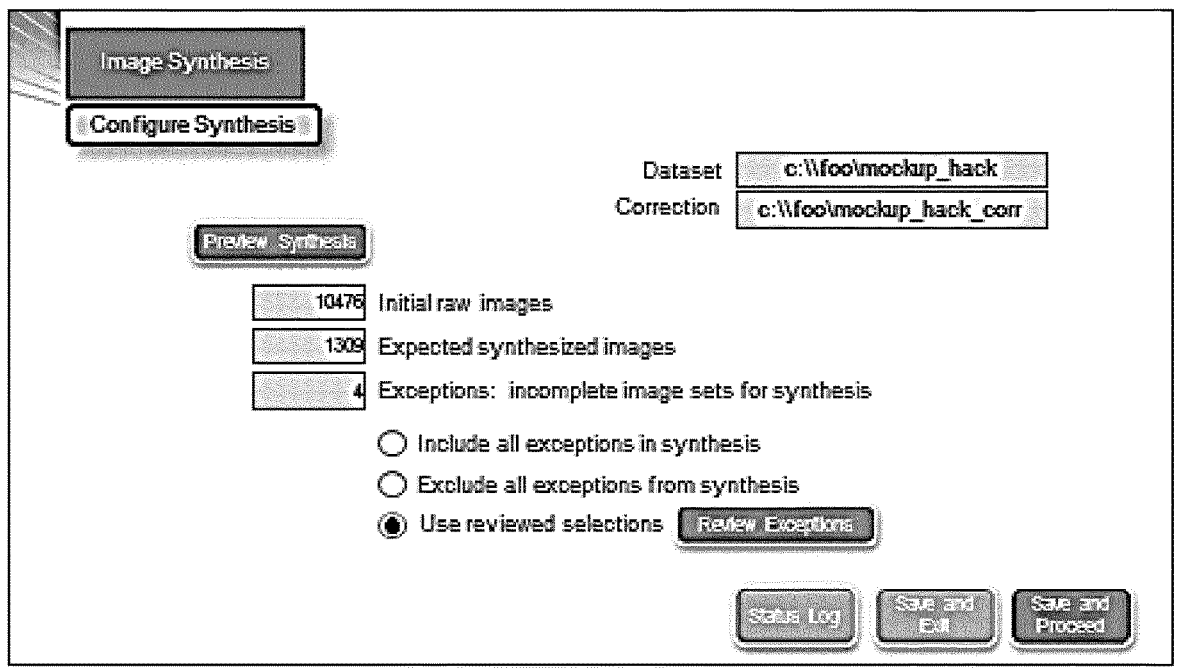
FIGS. 19, 20, 21, 22 and 23 schematically depict embodiments of input screens for synthesis of a synthesized unit cell image based on the corrected image data.
Figure 20:
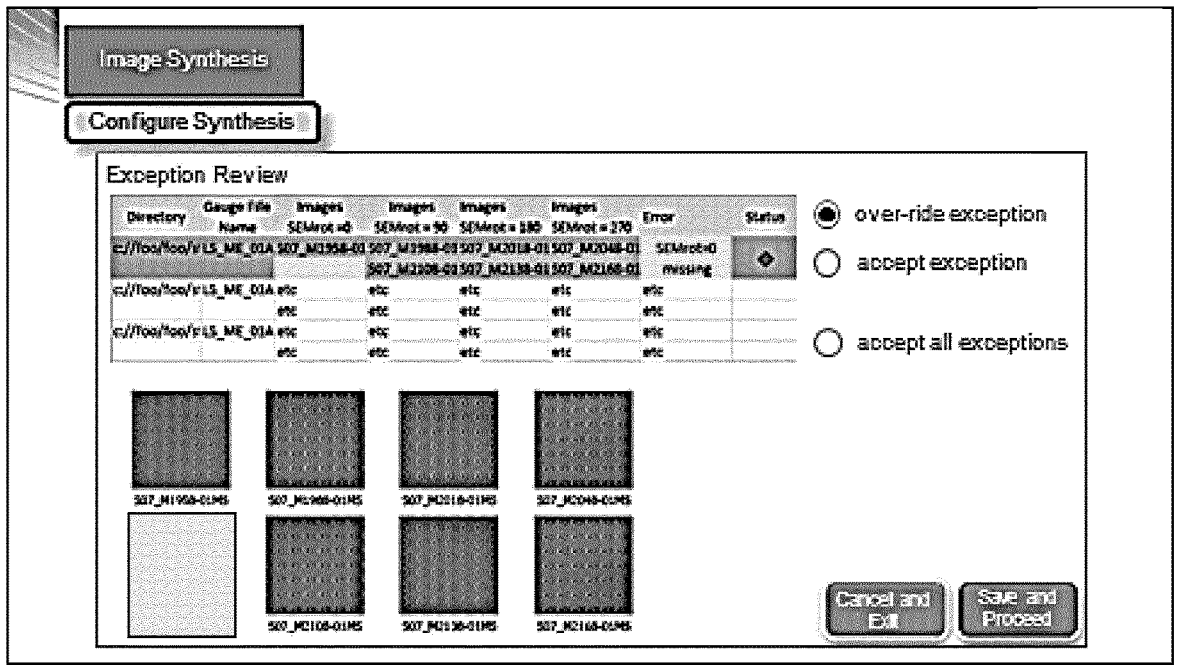
Figure 21:
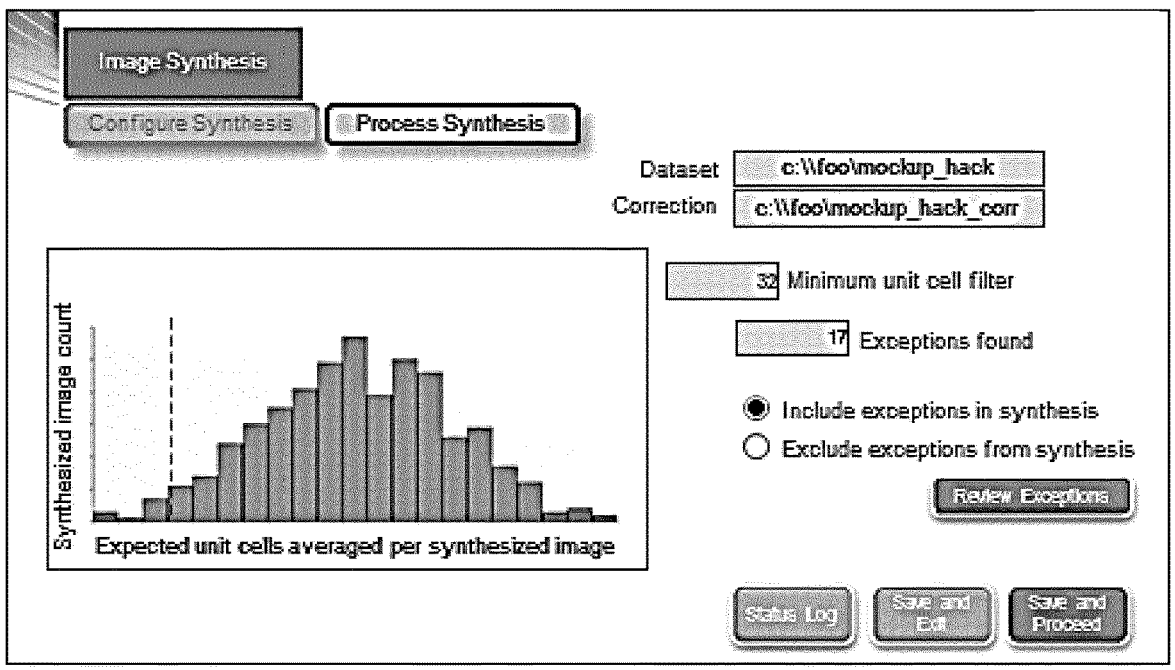
Figure 22:
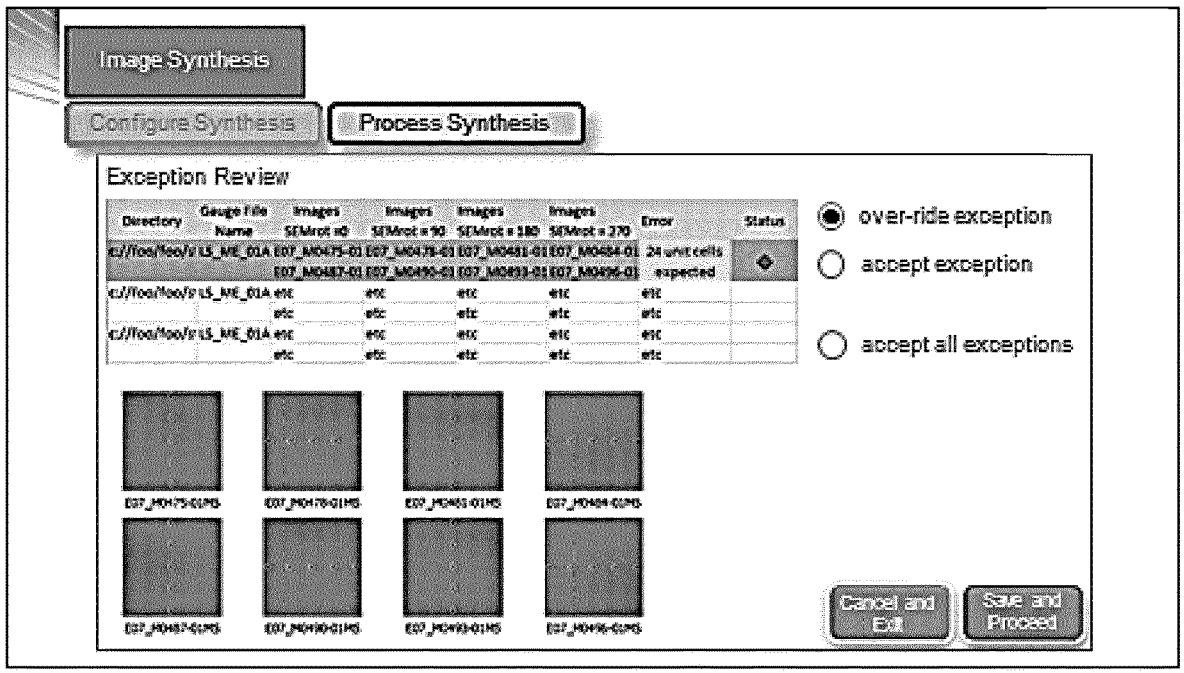
Figure 23:
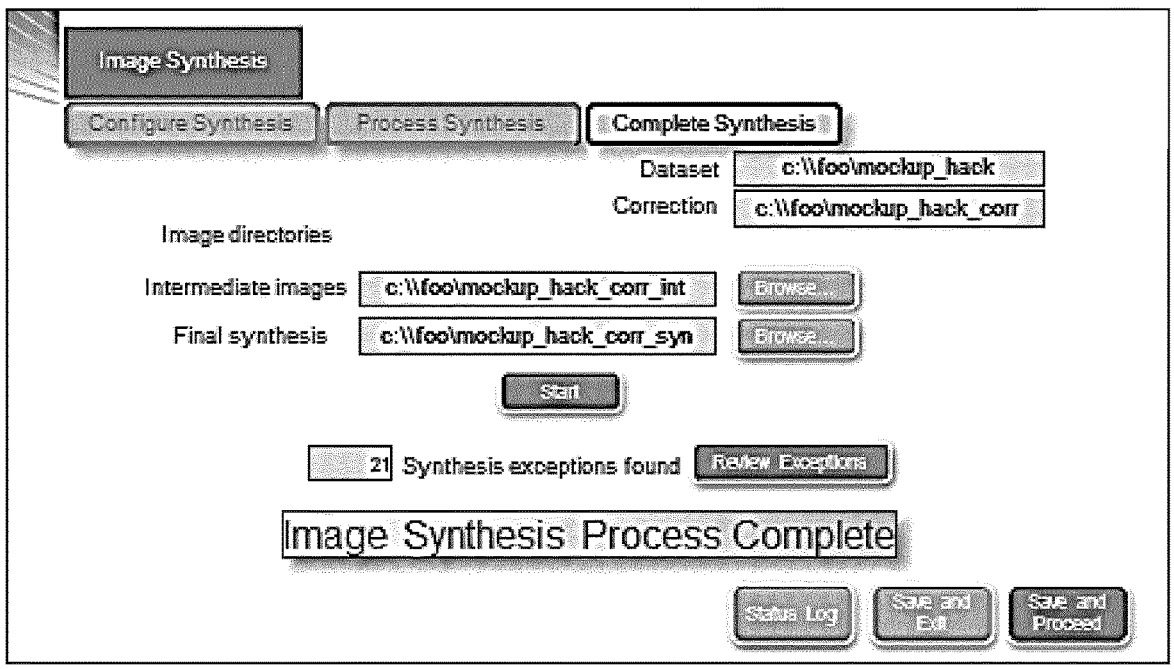

Referring to FIGS. 12-14, example input screens for different stages of operation of module 1100 are depicted. On the example screen of FIG. 12, a user can import a collection of images (e.g., SEM images). The result of the importation is shown in the example screen of FIG. 13. The example screen of FIG. 13 can enable optional exception review and processing of the imported images. Once the import is configured, the importation can be executed and saved as shown on the example screen of FIG. 14. Each of the example screens indicate a particular stage of execution including "Configure . . . " for the configuration of the action (in this case, import), "Process . . . " for the processing of the action (in this case, import) and/or "Complete . . . " for completion of the action (in this case, import).

FIGS. 15, 16, 17 and 18 depict embodiments of example input screens for correction of the image data. These example screens reflect that the received image data is analyzed and corrected by module 1110. For example, in module 1110, the image data can be automatically analyzed to identify appropriate corrections and then those corrections are applied, subject to optional thresholds or other configurations. In an embodiment, the user may select or otherwise identify appropriate corrections and configure those corrections, whether by inputting values ab initio or modifying suggested values by the software.

For example, SEM images can have a significant amount of image distortion present in them and that includes different kinds of grid distortions. For instance, one or more of the images may be skewed. As another example, one or more of the images may have a magnification error. As another example, one or more of the images may have curvature in the data. Thus, there may be variety of different kinds of distortions that are analyzed and corrected in order to enable the unit cell approach to extract information from the image data. For example, the spatial correction may comprise one or more selected from: skew, magnification, rotation, curvature, and/or trapezoid.

Figure 29:
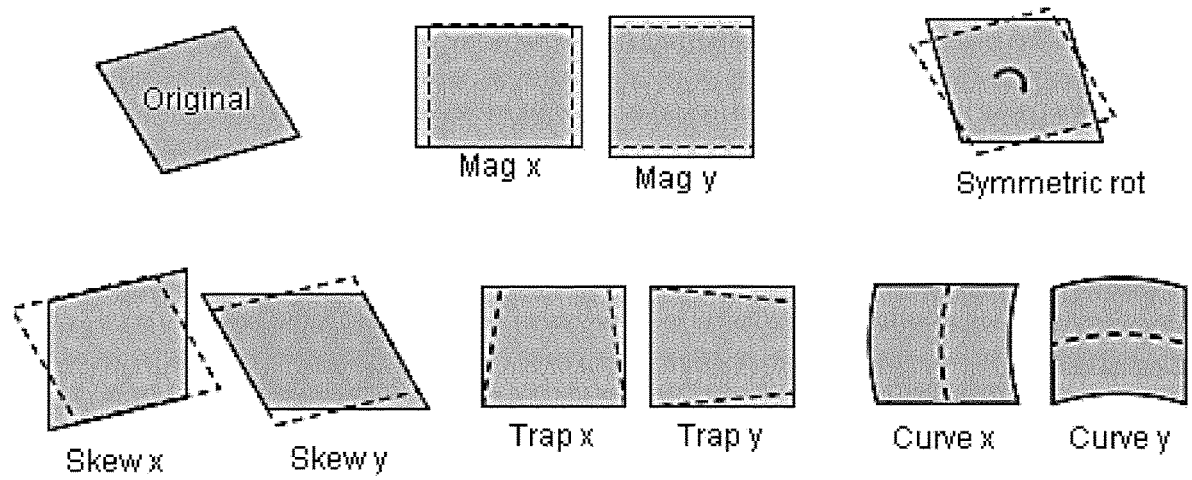
FIG. 29 schematically shows examples of these types of distortions in the images and their corresponding corrections.
Figure 30:
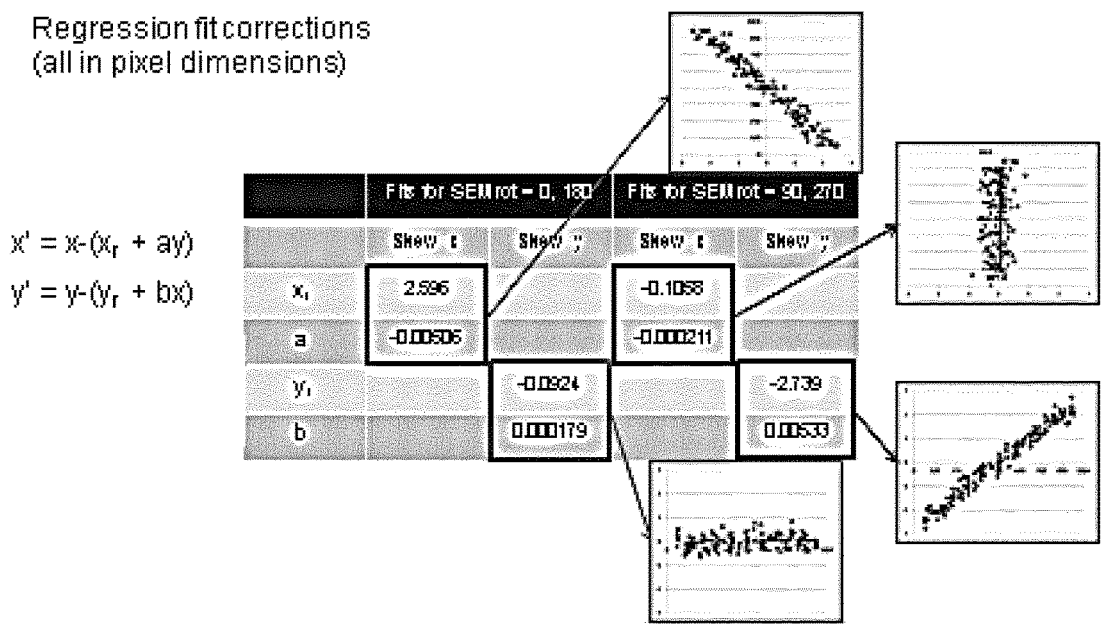
FIG. 30 schematically shows an example of a correction of an image using regression fitting of the correction.

FIG. 29 shows examples of these types of distortions in the images and their corresponding corrections. For example, a skew error in the −X direction could be corrected by a skew correction in the −X direction. Similarly, a rotation error of +45 degrees could be corrected by a rotation correction of −45 degrees. If unit cells are extracted in the presence of one or more these distortions, then the unit cells may tend to "wander off" of their centering or "wander off" of how they are aligned together in a desired or optimal way. Thus, in an embodiment, image distortions are recognized and corrected using computational distortion recognition and correction techniques. Further, FIG. 30 shows an example of a correction of an image using regression fitting of the correction. In this example, the correction is a skew with x and y being the original coordinates and x' and y' being the corrected coordinates. The first two columns are example regression fits for SEM images at 0 degrees and 180 degrees capture orientations and the second two columns are example regression fits for SEM images at 90 degrees and 270 degrees capture orientations. The first column is the skew in x for SEM images at 0 degrees and 180 degrees capture orientations, the second column is the skew in y for SEM images at 0 degrees and 180 degrees capture orientations, the third column is the skew in x for SEM images at 90 degrees and 270 degrees capture orientations, and the fourth columns is the skew in y for SEM images at 90 degrees and 270 degrees capture orientations. The rows represent the values of the parameter $x_r$, a, $y_r$ and b in the formulas in FIG. 30.

Figure 31:
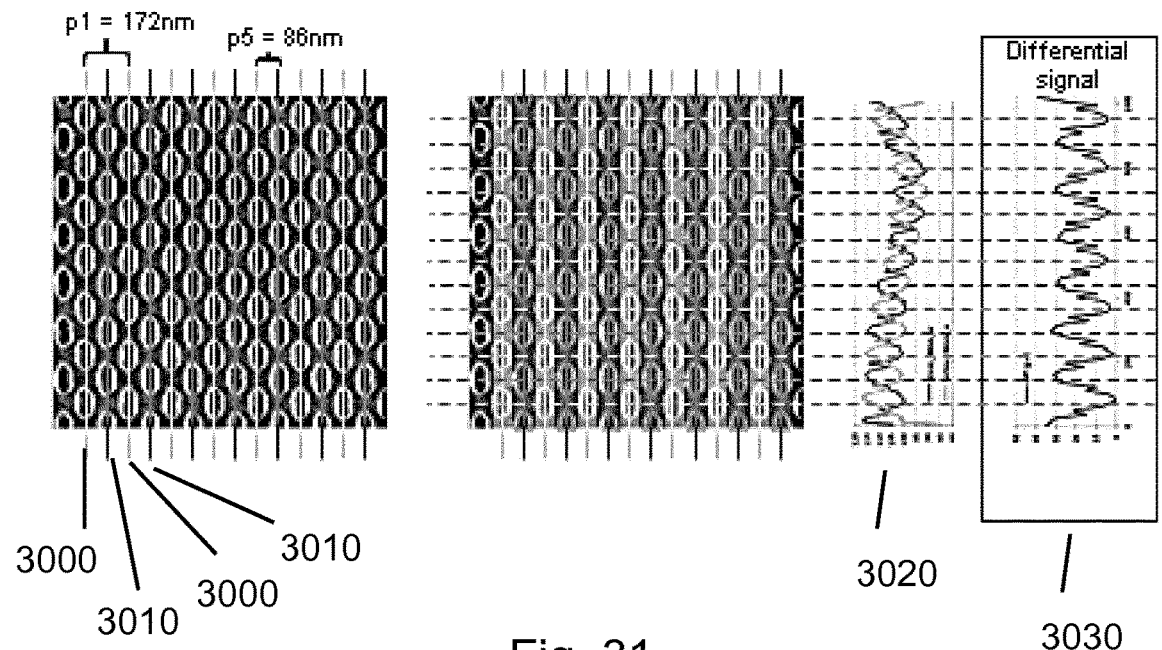
FIGS. 31 and 32 schematically describe an embodiment of using a differential method to eliminate image artifacts.
Figure 32:
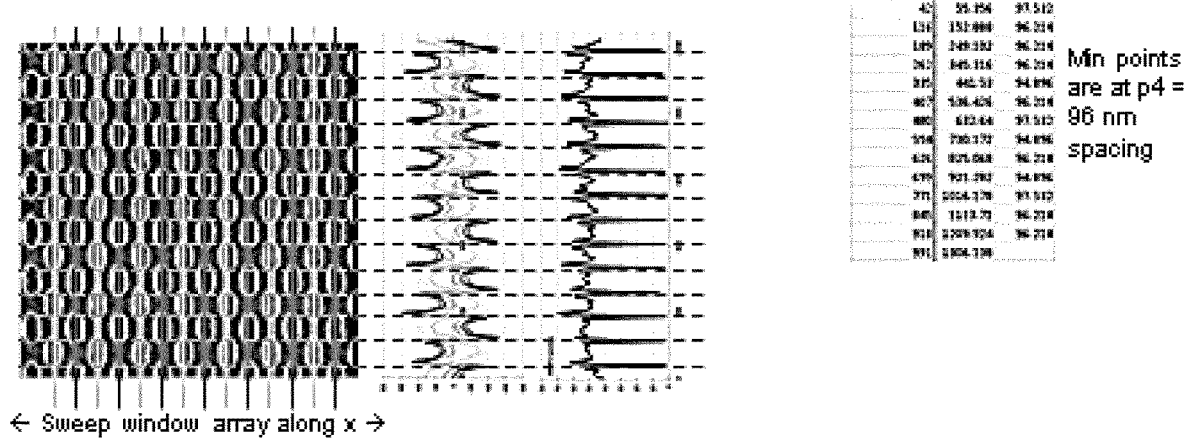

Referring to FIGS. 31 and 32, there may be various types of artifacts present in SEM images, including relatively large area charging artifacts that appear as darkened blotches. Such artifacts will distort different kinds of algorithms and are something that is not easily correctible using a correction as described above. Accordingly, algorithms may be used that operate relatively well in the presence of such artifacts. In an embodiment, a binarized filtered version of the image may be used to highlight and identify the artifacts. FIGS. 31 and 32 describe an embodiment of using a differential method to help eliminate such artifacts. For example, as described in FIG. 31, the image may be segmented by pitch into a first periodic set of features 3000 and a second periodic set of features 3010 that interlace with the first periodic set of features 3000. An averaging window then may be used to obtain a signal from respectively the first periodic set 3000 and the second periodic set 3010 (which is shown at 3020) and then the signals are differenced to obtain a different signal (which is shown at 3030). The differential signal can effectively suppress artifact sensitivity and improves noisy orientation. Moreover, a binarized image may not be required (rather a filtered image may be used), which can eliminate sensitivity to the threshold used to obtain a binarized image. So, referring to FIG. 31, a differential method of effectively sweeping the image can be used to essentially eliminate larger-scale flaws. Further, as shown in FIG. 32, a y differential signal can be swept along x to get y grid information from crossing points. That is, the local maximum and minimums identify y grid points. However, without limiting the scope of the embodiments, other methods and algorithms may be used suppress effectively uncorrectable image distortions.

Figure 36:
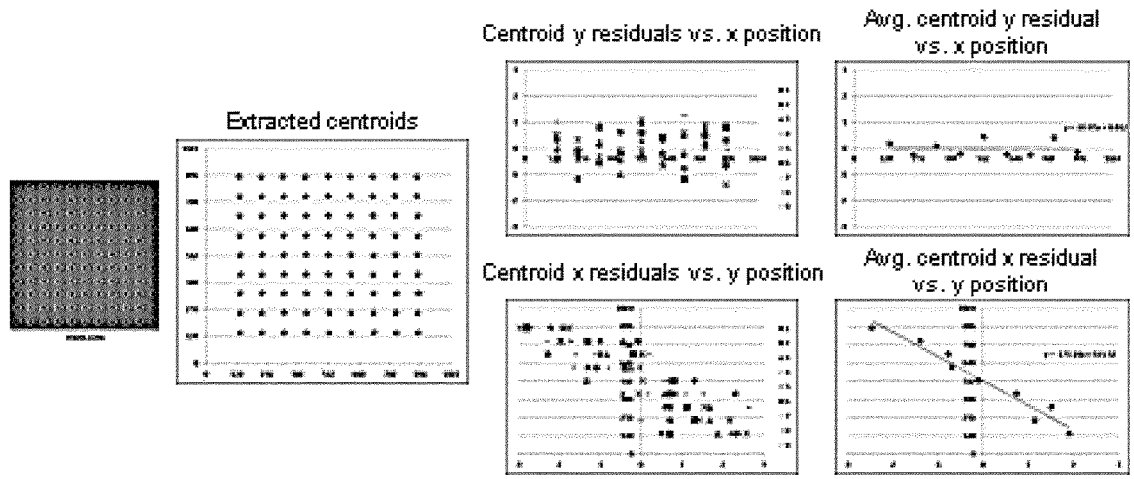
FIG. 36 schematically shows an example statistical analysis of SEM images obtained at 180 degrees capture orientation to identify a representative image for distortion correction across a larger set of images.
Figure 37:
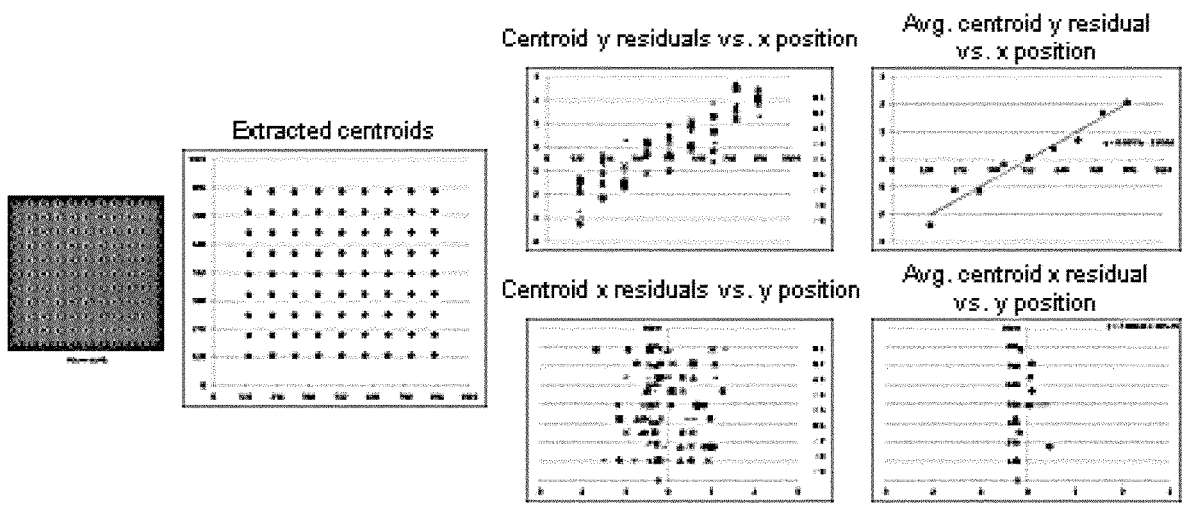
FIG. 37 schematically shows an example statistical analysis of SEM images obtained at 270 degrees capture orientation to identify a representative image for distortion correction across a larger set of images.

In an embodiment, an algorithm is provided to identify a subset of patterns and associated one or more images that are useful to detect and correct distortion within a larger set of images. Thus, in an embodiment, a subset of a set of images is analyzed to identify at least one pattern for correction of distortion in the pattern and then the distortion correction is applied to the set of images. Thus, there is provided a method of essentially calibrating the distortions that are present in a large set of images by analyzing them and characterizing them for a smaller set of images. The idea is that there are many images that are better for calibrating and ultimately removing distortions and they are ones that, for instance, have a relatively high pattern density in them so that a distortion grid can be effectively calculated for such images. By identifying and using those images in a larger dataset, those images can be used to calibrate away errors that exist in the larger dataset. So, FIG. 33 shows an example of regions of a patterned substrate from which SEM images are obtained at 0 degrees, 90 degrees, 180 degrees and 270 degrees capture orientations (marked respectively R0, R90, R180 and R270). Using a plurality of images obtained at each capture orientation, a statistical analysis can applied to determine a representative image for which a distortion correction can be applied to a larger set of images. FIG. 34 shows an example statistical analysis of SEM images obtained at 0 degrees capture orientation to identify a representative image for distortion correction across a larger set of images. FIG. 35 shows an example statistical analysis of SEM images obtained at 90 degrees capture orientation to identify a representative image for distortion correction across a larger set of images. FIG. 36 shows an example statistical analysis of SEM images obtained at 180 degrees capture orientation to identify a representative image for distortion correction across a larger set of images. And, FIG. 37 shows an example statistical analysis of SEM images obtained at 270 degrees capture orientation to identify a representative image for distortion correction across a larger set of images.

Figure 40:
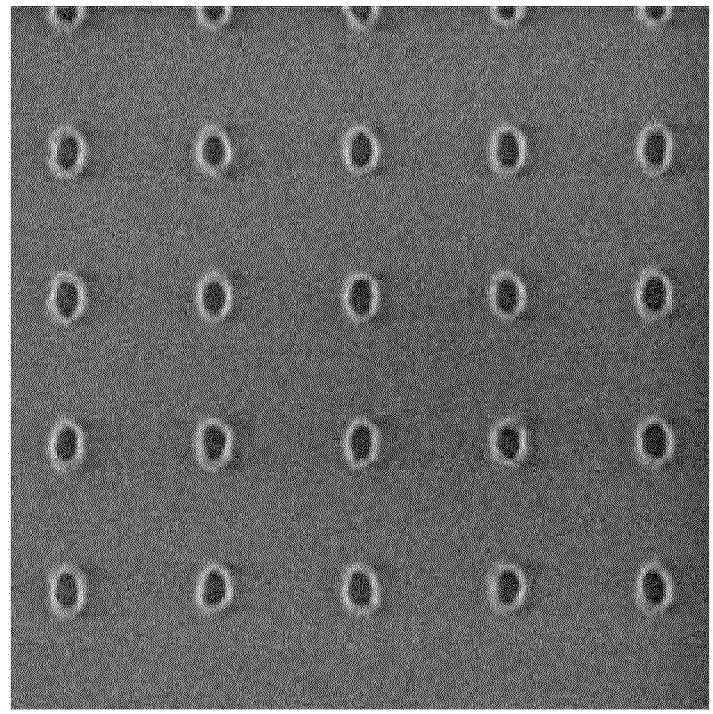
FIGS. 40 and 41 depict an example of a spatial deviation error in the patterns of an image.
Figure 41:
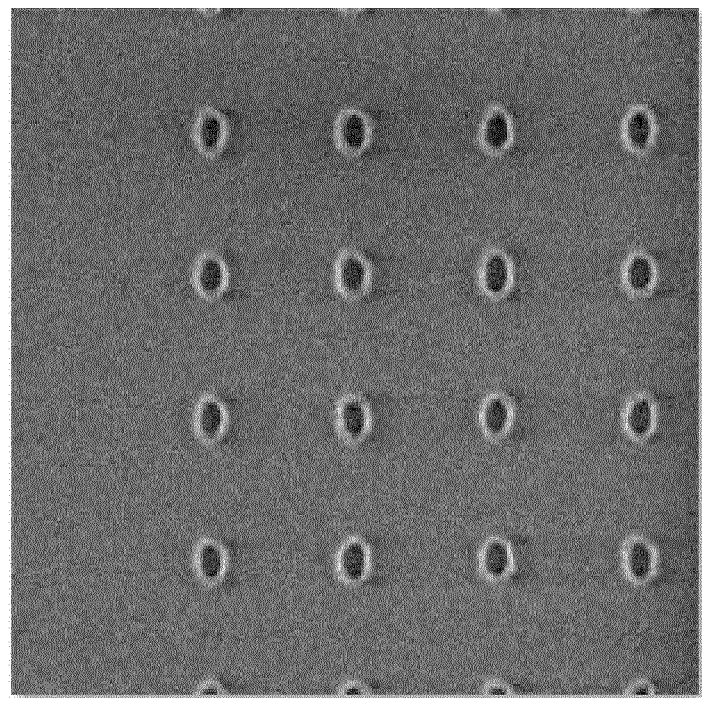

Further, in an embodiment, the images may be analyzed to determine whether there are errors in the images before image synthesis. For example, the patterns in the image may be spatially deviated such as shown in FIG. 41 relative to FIG. 40.

FIGS. 19, 20, 21, 22 and 23 depict embodiments of example input screens for the synthesis of a synthesized unit cell image based on the corrected image data and associated with module 1120.

As described above, e.g., with respect to module 1120, unit cells are determined for one or more images and then an image synthesis is performed as described above, e.g., averaging of the pixels of unit cells from one or more images, to create a single representation of all of the unit cells that are present in the one or more images that are being averaged together.

Figure 38:
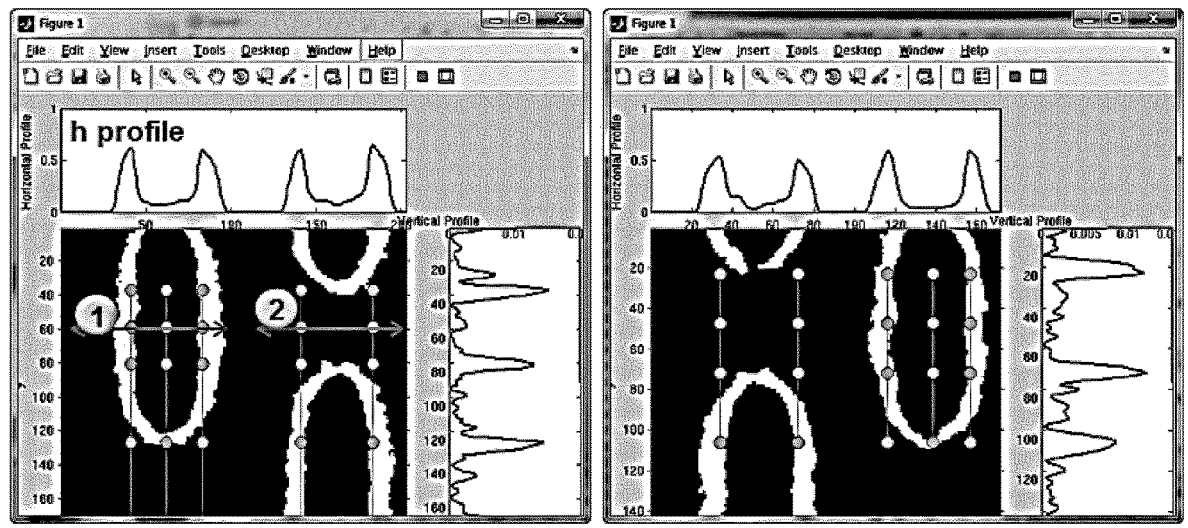
FIGS. 38 and 39 schematically depict an embodiment of a technique for identifying unit cells in an image.
Figure 39:
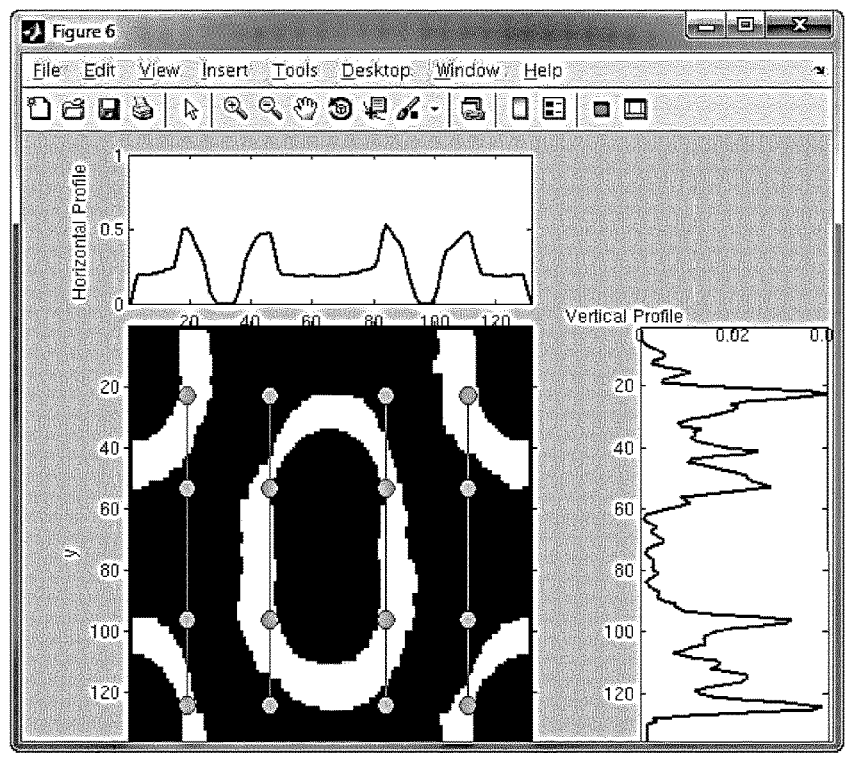

In an embodiment, there is provided one or more algorithms for finding unit cells within an image and one or more algorithms for optimal alignment of the unit cells within an image. In an embodiment, the unit cells may be defined based on information known from the actual layout from the patterning device. That is unit cells may be defined automatically and/or by user guidance on the actual layout and that definition of unit cells may be transposed to the location of the patterned substrate where the corresponding patterns on the patterning device layout appear. Of course a scaling factor may apply if there is (de)magnification in projecting an image of the patterning device layout. Additionally or alternatively, in an embodiment, the unit cells are defined using the information within the image itself. In an embodiment, the image can be swept, averaged, binarized or otherwise analyzed/processed to find where the repeating patterns are located, which can then be used to extract the unit cells that envelop each instance of a pattern. The unit cells can then be averaged as discussed above to arrive at the synthesized unit cell image. Referring to FIGS. 38 and 39, an embodiment of a technique for identifying repetitive patterns in an image can include "cutting" the image along various cut lines and using thresholds to find pattern edges. The pattern edges can then be used along information about the proximity of edges of adjacent patterns to identify unit cells that can cover each instance of a pattern.

In an embodiment, the one or more images (e.g., the raw images) are re-scaled or re-pixelized prior to carrying out the unit cell image synthesis. This may be useful, for example, if a unit cell size does not contain an integer number of pixels. Relatedly, in an embodiment, the one or more images (e.g., the raw images) are re-pixelized (i.e., shift pixel positions by non-pixel integers) and re-calculate pixel intensity based on averaging of the pixels affected by the shift. After re-pixelization, a more accurate unit cell may be extracted.

Figure 42:
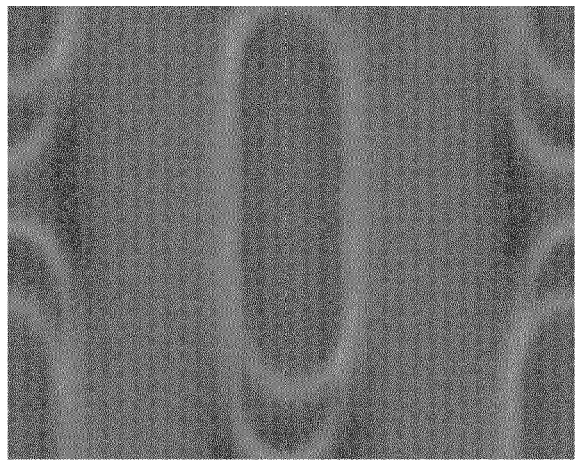
FIGS. 42, 43, 44 and 45 depict examples of errors in a synthesized unit cell image.
Figure 43:
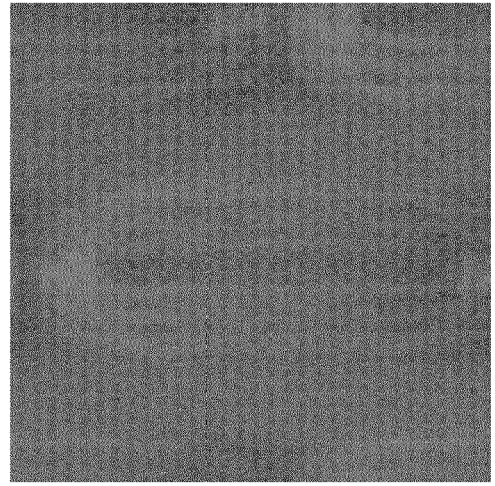
Figure 44:
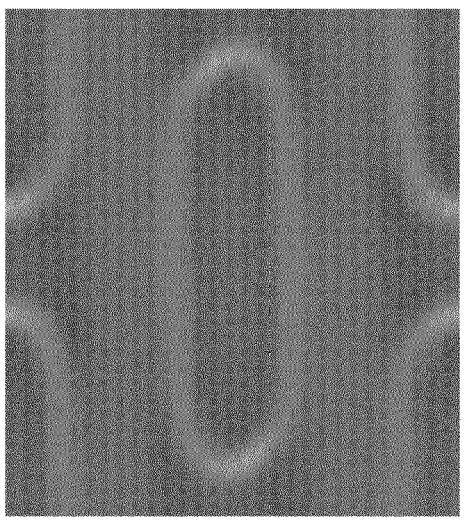
Figure 45:
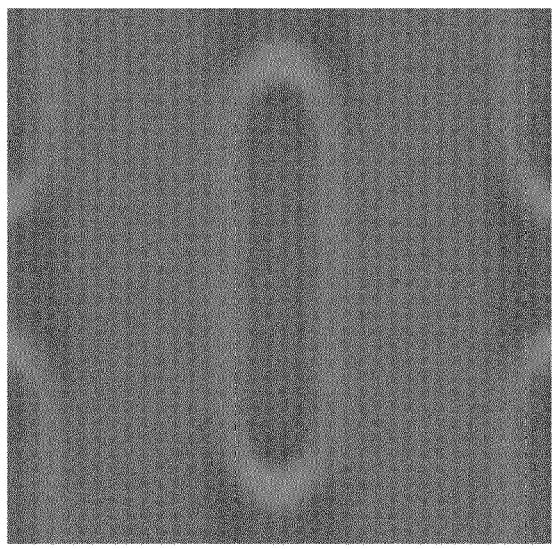
Figure 46:
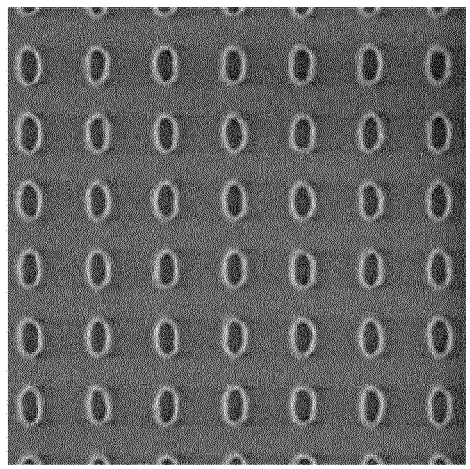
FIGS. 46, 47, 48 and 49 depicts examples of reliable and unreliable data for synthesized unit cell image determination

Further, in an embodiment, the synthesized unit cell image is evaluated to identify whether there is an error in the synthesized unit cell image. For example, the analysis can identify mis-registration of data as shown in, for example, FIGS. 42 and 43. This error may arise from, e.g., an error in defining the unit cells. As another example, the analysis can identify blurring of data as shown in FIGS. 42-44. This error may arise from, e.g., an error in defining the unit cells, such as their alignment relative to each other. If an error is identified, the synthesis process is performed again (e.g., defining the unit cells and averaging) or an alert is provided that a synthesized unit cell image cannot be properly determined.

Figure 48:
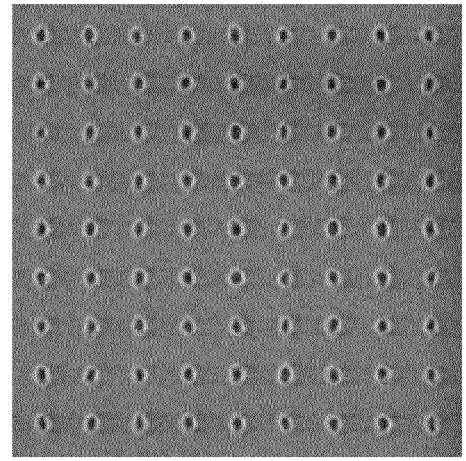
Figure 47:
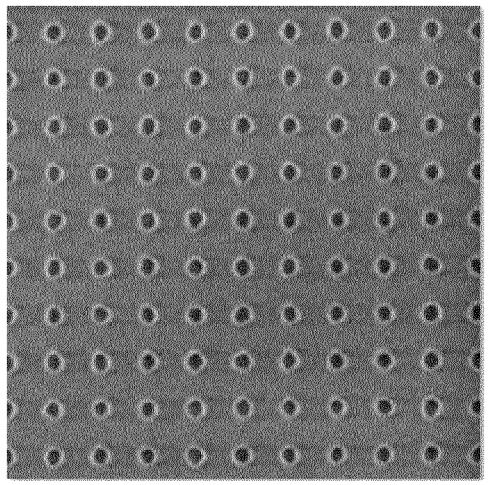
Figure 49:
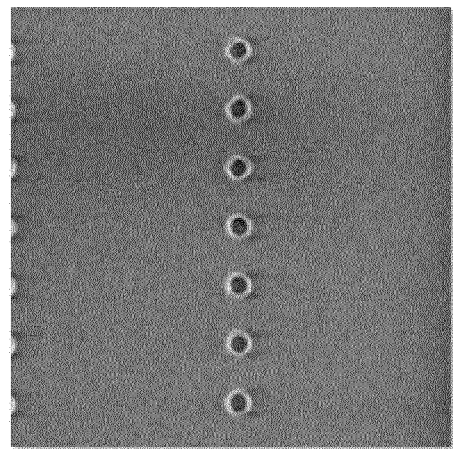
Figure 50:
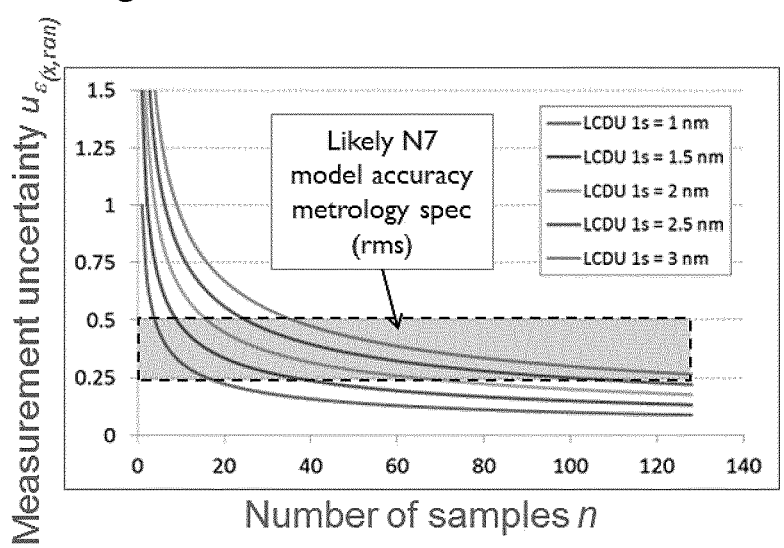
FIG. 50 depicts a statistical analysis to arrive at a determination of whether the data is reliable or unreliable for synthesized unit cell image determination.

In an embodiment, there are provided one or more algorithms to estimate final synthesized unit cell image quality and/or to estimate measurement reliability. Thus, the data is analyzed to determine how reliable the data is within any given synthesized unit cell image. Typically, using the raw images, it is known the number of images being considered and how many features of those images are being averaged together, and as a result there is knowledge about the variability of those features. But, in the synthesis method described herein, the variability is essentially averaged into the synthesized image. So, in an embodiment, an algorithm is provided that effectively assigns an image quality value to the shapes in an image. Then, the shapes are counted and a variability is estimated in the shapes before the synthesis. That will allow a type of cost-weighting to be used to reflect how reliable any given measurement is expected to be. So, referring to FIGS. 46, 47, 48 and 49, FIG. 46 shows an example image where the shapes have relatively low variability and so they can be assigned a relatively high image quality value and so their data may be given a higher weight. Similarly, FIG. 47 shows an example image where the sample size of shapes is high (i.e., there is relatively high density of shapes) and so those shapes can be assigned a relatively high image quality value and so their data may be given a higher weight. In contrast, FIG. 48 shows an example image where the shapes have relatively high variability and so they can be assigned a relatively low image quality value and so their data may be given a lower weight. Similarly, FIG. 49 shows an example image where the sample size of shapes is low (i.e., there is relatively low density of shapes) and so those shapes can be assigned a relatively low image quality value and so their data may be given a lower weight. FIG. 50 depicts a statistical analysis to arrive at a determination of whether data is reliable or unreliable for synthesized unit cell image determination. In this example, the analysis is of the sample size of shapes.

Figure 24:
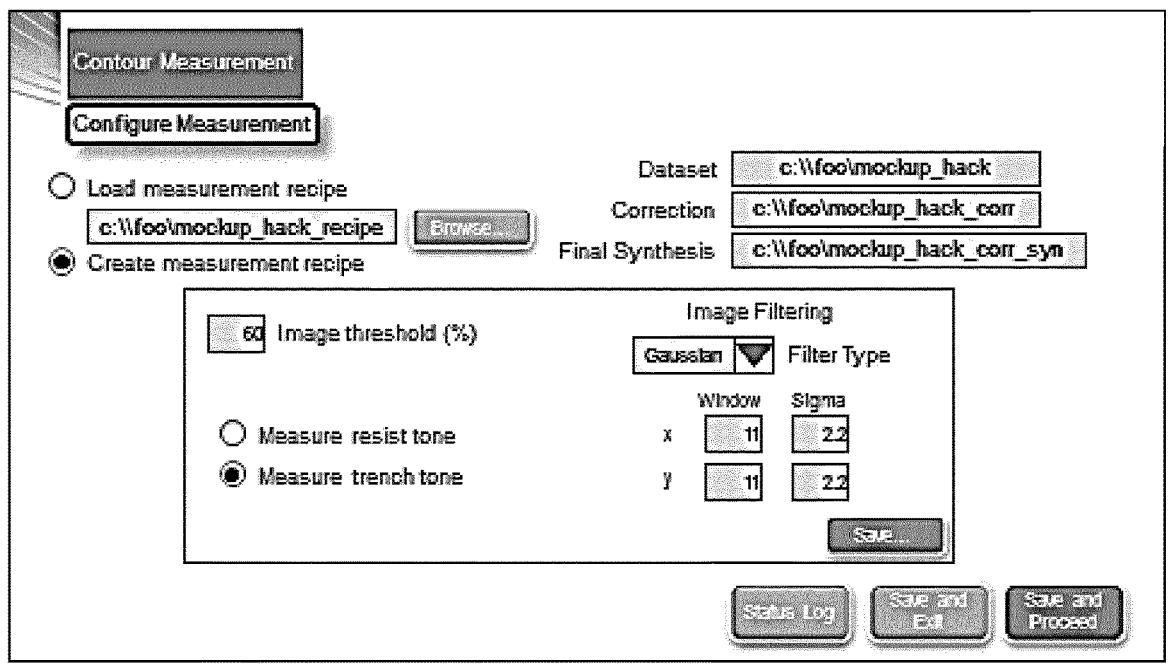
FIGS. 24, 25 and 26 schematically depict embodiments of input screens for contour determination of a shape of the synthesized unit cell image.
Figure 25:
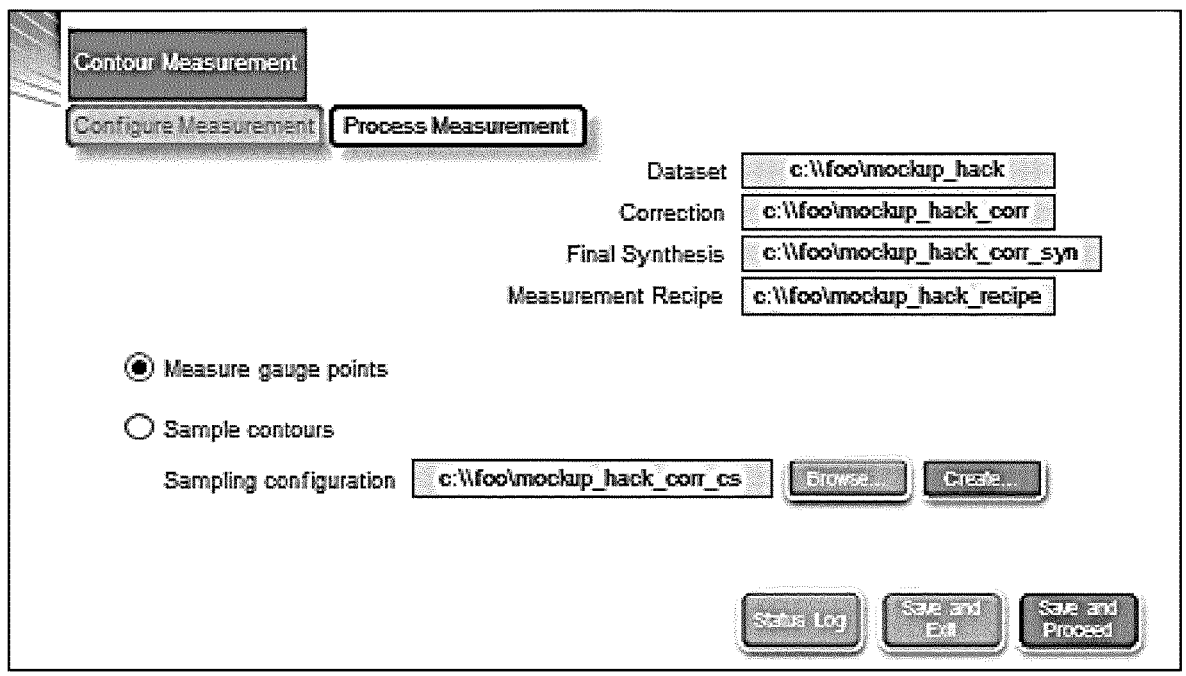
Figure 26:
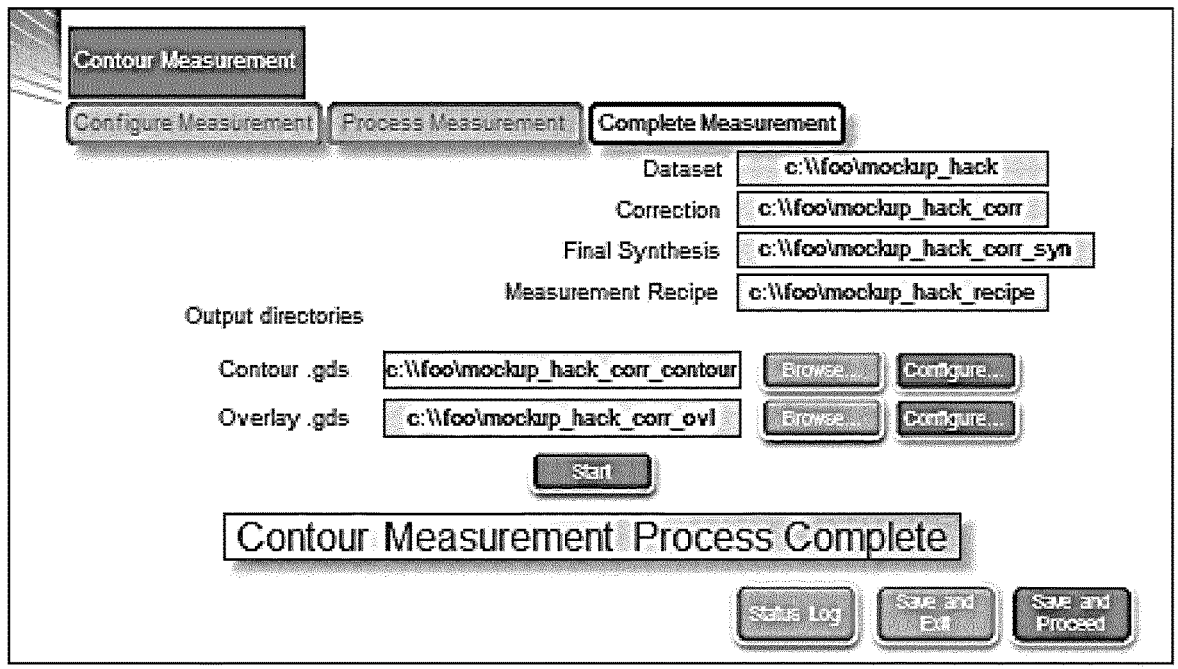

FIGS. 24, 25 and 26 depict embodiments of example input screens for contour determination of a shape of the synthesized unit cell image and associated with module 1140.

In an embodiment, contour determination may include applying a smoothing filter to the image as needed. Further, an image threshold may be specified at which the contour is determined. Thus, the various techniques and settings used to process a contour of a raw CD-SEM image may be employed for contour determination of the shape of the synthesized unit cell image.

Figure 27:
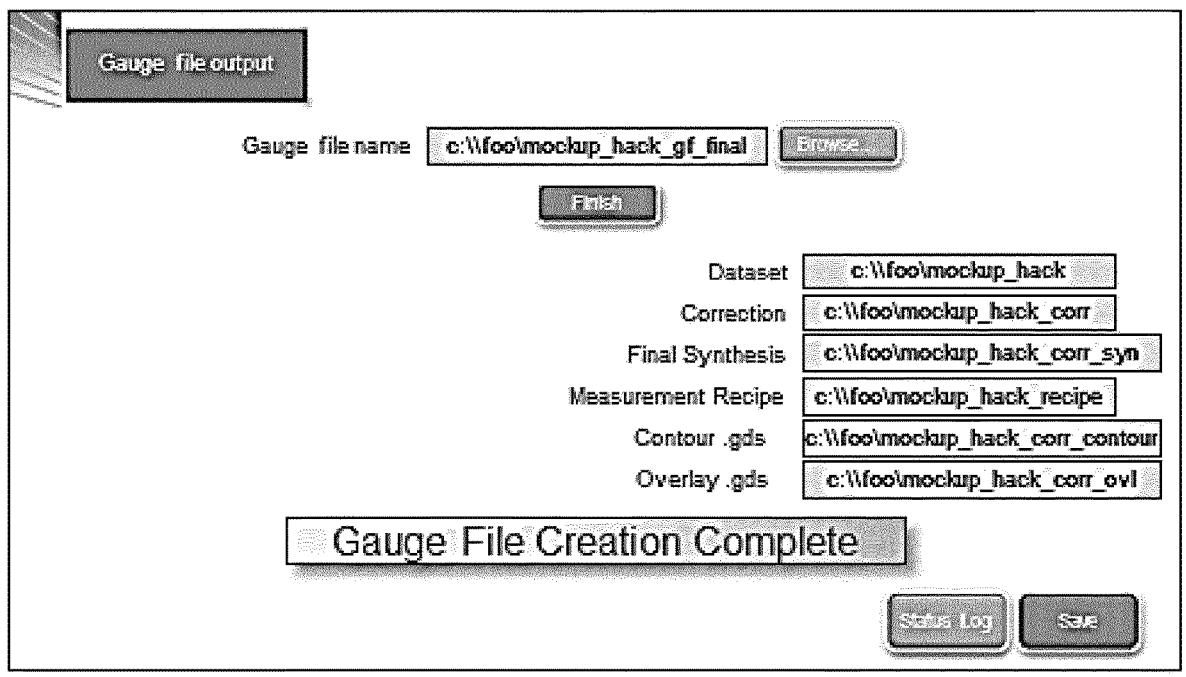
FIG. 27 schematically depicts an embodiment of an input screen for provision of a file of measurement data based on the synthesized unit cell image.

FIG. 27 depicts an embodiment of an example input screen for provision of a file of measurement data based on the synthesized unit cell image and associated with module 1150.

In an embodiment, once the contour has been determined of the shape of the synthesized unit cell image, an output may be provided of the contour, of one or more gauge geometric dimension measurements, a sampling of the contour for geometric dimension measurement and one or geometric dimension measurements from the sampling, etc. Thus, a data file may be created and provided that has in it information that is based on the synthesized unit cell image and based on where the synthesized unit cell image thinks the actual measurement crossing points should be.

As evident from the above, no shape-fitting algorithm was needed in the measurement of the image and the shape-fitting algorithms that are used in, e.g., image synthesis and/or contour determination, are applied after obtaining the images from the metrology apparatus. So, pattern specific algorithms may be avoided as part of the shape measurement process.

Figure 28:
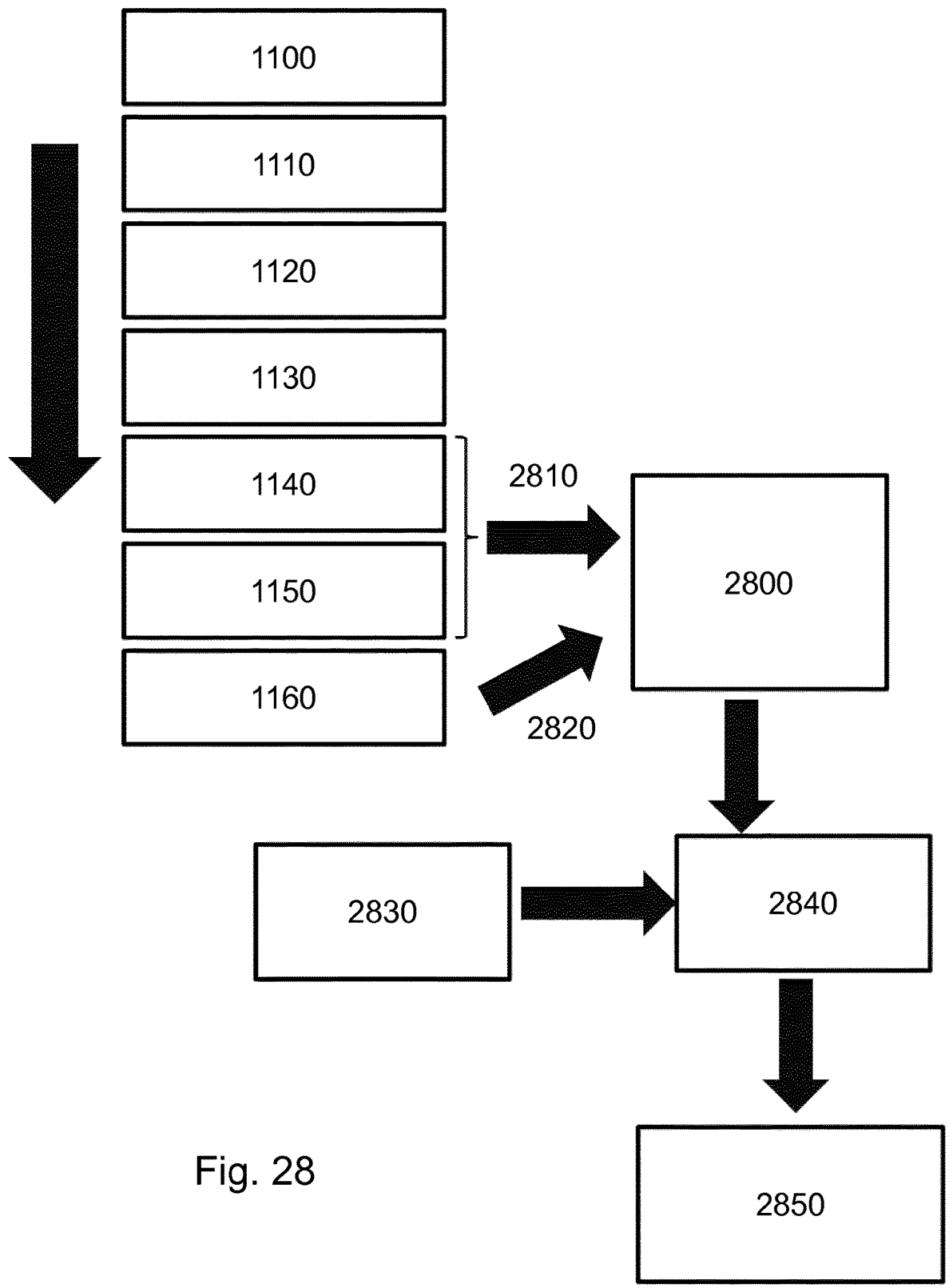
FIG. 28 schematically depicts embodiments of an extension of the software of FIG. 11.

Referring to FIG. 28, the end-output of software that implements the unit cell image synthesis can be applied to model calibration/creation and/or model verification. For example, in an embodiment, output of the software can be applied to model calibration/creation 2800, e.g., OPC model calibration. As an example, the information generated in the software in FIG. 11 can be used in different ways for model calibration. In an embodiment, contour information may be provided 2810 to the model calibration/creation 2800 and that contour information (e.g., sampled contour information and/or geometric dimensions associated with the sampled contour) may be used directly in and by the model calibration/creation 2800. Additionally or alternatively, one or more gauge geometric dimension measurements may be provided 2820 to the model calibration/creation 2800 for use in and by the model calibration/creation 2800. That is, the file at module 1160 may comprise gauge measurements and be fed into the model calibration/creation 2800 that would then make use of that data.

In an embodiment, additionally or alternatively, output of the software can be applied to model verification 2800, e.g., OPC model verification. So, for example, one use contour information 2810 and/or gauge measurements 2820 to verify the performance of a model (e.g., a model calibrated or created by model calibration/creation 2800) on a set of shapes that are not the same shapes that were used in the calibration/creation of the model. Thus, the image synthesis flow can be applied to create contours and/or gauge measurements that could be part of the verification of a model.

Having a created, calibrated or verified model, the model then may be applied to designing, controlling, verifying, etc. a patterning process or a portion thereof. So, for where the model is an OPC model, the model may be used with a device design layout 2830 to arrive at a corrected device design layout 2840. The corrected device design layout may then be provided to a patterning device (e.g., a reticle manufactured with the corrected device design layout). The patterning device with the correct device design layout may then be used to print 2850 substrates so as to manufacture devices.

In an embodiment, the software of FIG. 11 may be extended with software to implement 2800-2850 or may be connected to software or systems that implement or facilitate 2800-2850.

Thus, as discussed above, it is desired that 2D metrology measurements align with model (e.g., OPC model) gauge definitions. But, the actual gauge inputs to a model can depend on the metrology algorithm choices made when measuring CD-SEM images. As discussed above, the best measurement results depend on an appropriate match of algorithm to pattern shape yet the choice of algorithm is made before measurement. An incorrect choice of algorithm can yield distorted measurement results. So, for 2D-intensive metrology, image synthesis and measurement on unit cell level is beneficial. It may yield a simplification of the OPC metrology process by, for example, eliminating choice of algorithm prior to measurement. Further, it can provide faster results, less risk of error, and/or more efficiency. For example, there can be elimination of inaccuracies arising from enforced algorithm choices, e.g., measurement algorithms that must be predicted and chosen before measurements are made. Making 'best' algorithm choices may require complex pre-metrology prediction studies and may nevertheless yield incorrect results. Further, less-than-optimal algorithm choices are hard to find and correct after measurements are made. Moreover, many printed patterns are inherently difficult to measure accurately with conventional algorithm approaches. Some shapes simply are not fit well by any particular algorithm. Further, many algorithms have measurement- and shape-dependent sensitivities that create additional measurement inaccuracies. Thus, in an embodiment, such algorithm selection may be eliminated significantly if not completely to yield a simpler process with little or no algorithm-induced inaccuracies.

Further, to evaluate one or more models that model one or more aspects of the patterning process (e.g., an OPC model), an error function or metric can be used to determine the difference between a predicted value of a parameter (e.g., CD of a portion of a pattern) using the model and one or more measured values of the parameter (e.g., measured CD of the corresponding portion on a corresponding exposed pattern). An example function is a weighted RMSE, such as:

$$RMSE = \sqrt{\sum_{i=1}^{n} w_i \, (\hat{x}_i - x_i)^2}$$

wherein $\hat{x}_i$ corresponds to a predicted value of a parameter, $x_i$ corresponds to a measured value of the parameter, n corresponds to the number of predicted values and the associated measured values, and $w_i$ corresponds to a weighting factor to give one or more values x greater weight than one or more values x.

Now, it would be desirable to define a weighting factor for a model error term, such as $w_i$ for each or a plurality of terms ($\hat{x}_i - x_i$) in the error function RMSE above. So, in an embodiment, the weighting factor is based on a SEM image metric that effectively represents that quality of the SEM image. That is, a SEM image metric is evaluated for one or more SEM images and the evaluated SEM image metric is used to determine the weighting factor.

Figures 51A, 51B:
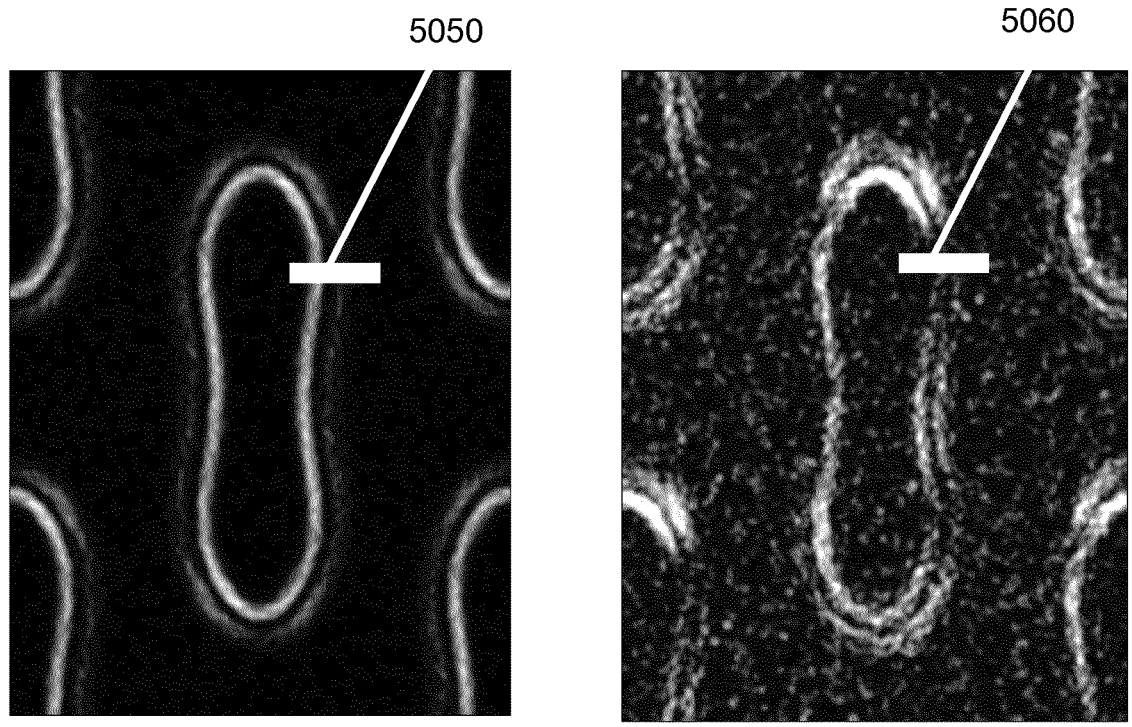
FIG. 51A depicts an example unit cell synthesis of a plurality of SEM images corresponding to a plurality of instances of a pattern.
FIG. 51B depicts a further example unit cell synthesis of a plurality of SEM images corresponding to a plurality of instances of the same pattern as in FIG. 51A.

Referring to FIG. 51A, a unit cell synthesis of a plurality of SEM images corresponding to a plurality of instances of the pattern. In this case, the unit cell synthesis corresponds to a 4 orientation unit cell synthesis of SEM images of instances of the pattern measured by a SEM at 0 degrees, 90 degrees, 180 degrees and 270 degrees. Further, an example cutline 5050 is shown across the boundary of the pattern.

FIG. 51B shows a unit cell synthesis of a plurality of SEM images corresponding to a plurality of instances of the same pattern as in FIG. 51A. In this case, the unit cell synthesis corresponds to a unit cell synthesis of SEM images of instances of the pattern measured by a SEM at 270 degrees. Further, an example cutline 5060, which is at the same location on the pattern as cutline 5050 in FIG. 51A, is shown across the boundary of the pattern.

Figure 51C:
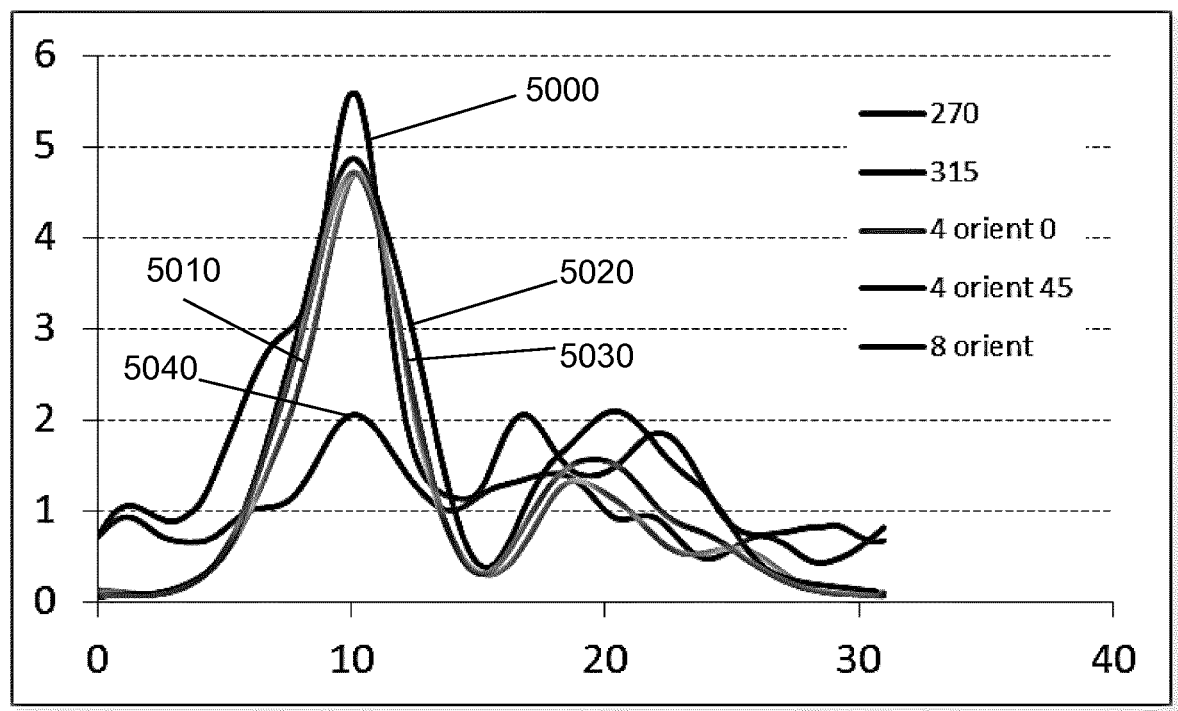
FIG. 51C depicts a waveform graph for a portion of the SEM images of FIGS. 51A and 51B.

Referring to FIG. 51C, a waveform graph is depicted for a SEM image. In this case, the waveform graph corresponds to the cutlines 5050 and 5060 and corresponds to the unit cell synthesis of FIG. 51A and FIG. 51B. That is, line 5010 corresponds to the waveform for the cutline 5050 of FIG. 51A and line 5040 corresponds to the waveform for the cutline 5060 of FIG. 51B. In this case, there is further depicted a waveform as line 5000 for a unit cell synthesis of SEM images of instances of the pattern measured by a SEM at 315 degrees at a comparable cutline. There is further depicted a waveform as line 5020 for a unit cell synthesis of SEM images of instances of the pattern measured by a SEM at 45 degrees, 135 degrees, 225 degrees and 315 degrees at a comparable cutline. There is further depicted a waveform as line 5030 for a unit cell synthesis of SEM images of instances of the pattern measured by a SEM at 0 degrees, 45 degrees, 90 degrees, 135 degrees, 180 degrees, 225 degrees, 270 degrees and 315 degrees at a comparable cutline. While the waveforms are depicted as graph lines, it will be appreciated that the waveform data need not be graphed and any processing of a waveform can be performed based on the data (i.e., it need not involve analyzing a graph).

In the graph of FIG. 51C, the horizontal axis corresponds to the position along the cutline and the vertical axis corresponds to a pixel intensity gradient (e.g., intensity unit per nanometer). Thus, each line represents a gradient across a portion of the pattern of the SEM image (in this, the unit cell synthesis of SEM images).

Having regard to the lines 5000, 5010, 5020, 5030 and 5040, it can be seen that lines 5000, 5010, 5020 and 5030 have comparable results. That is, there is fairly good SEM contrast. However, it can be seen that line 5040 has a quite low SEM contrast for this interaction between pattern geometry and the SEM measurement raster orientation. Thus, use of a gauge based on the cutline 5060 could give poor results. So, the ability of a SEM to measure edges depends on interaction between the pattern and the SEM measurement orientation, and so, regardless of method, there can be geometry-dependent 'weak points' present.

Thus, having regard to FIG. 51C, a SEM image metric that can be used to determine the weighting factor can be a SEM image gradient (e.g., intensity gradient), in particular a local SEM image gradient. In an embodiment, the SEM image metric can comprise a SEM image contrast, in particular a local SEM image contrast. Other types of parameters can be used as the SEM image metric. In an embodiment, a combination of parameters can be used as the SEM image metric.

Figure 52:
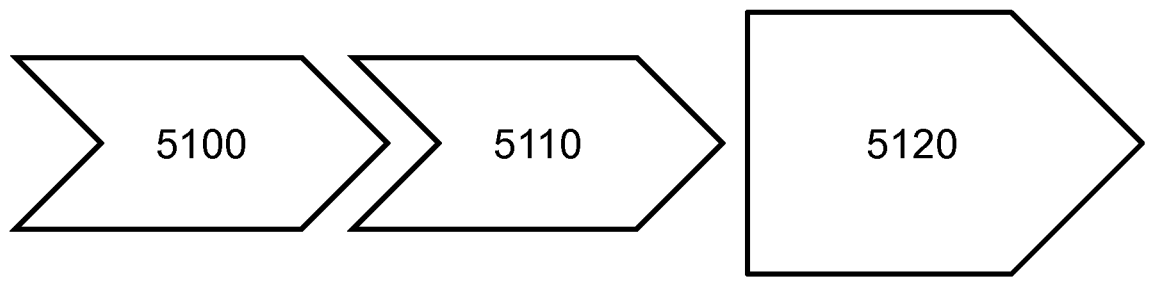
FIG. 52 depicts an example flow chart for determining a weighting factor for a model error function.

Referring to FIG. 52, an example flow chart of a method for determining a weighting factor for a model error function is depicted. At 5100, one or more SEM images of a pattern are obtained. In an embodiment, the one or more SEM images comprise a unit cell synthesis (UCS) of SEM images as discussed above. For example, in an embodiment, the one or more SEM images comprise one or more UCS images, each UCS image based on SEM images made using multiple SEM measurement orientations (e.g., raster orientations). In an embodiment, the one or more SEM images comprise one or more UCS images, each UCS image based on only a single SEM measurement orientation.

In an embodiment, the SEM image is processed to determine one or more values of one or more SEM image metrics. Such processing can include obtaining a SEM waveform of at least part of the SEM image of the pattern. In an embodiment, the SEM waveform is of SEM image gradient (e.g., intensity gradient) and/or SEM image contrast, as a function of position along a cutline perpendicular to a particular position along the edge contour of the pattern.

Based on the SEM waveform, one or more local SEM image metrics are determined at 5110 for the particular part of the SEM image for the purposes of determining the weighting factor. In an embodiment, the local SEM image metric can comprise the average of a SEM image metric along the cutline. In an embodiment, the local SEM image metric can comprise a minimum or maximum value of a SEM image metric along the cutline. Thus, the SEM image metric can comprise a SEM image gradient (e.g., intensity gradient) and/or a SEM image contrast.

At 5120, a weighting factor is determined based on the local SEM image metric and is assigned to all positions along the waveform, i.e., to all positions along the cutline. In an embodiment, the weighting factor is the value of one or more local SEM image metrics. In an embodiment, the weighting factor is a function of one or more local SEM image metrics. In an embodiment, the weighting factor is proportional to one or more local SEM image metrics.

As will be appreciated, in an embodiment, the steps of 5100-5120 would be applied for a plurality of points along the contour of the SEM image. For example, the points along the contour of the SEM image are those used in model calibration or verification. In an embodiment, the steps of 5100-5120 would be applied for each pattern of a plurality of patterns used in model calibration or verification (and thus for the plurality of points along the contours of each of the patterns).

In an embodiment, a contour weighting factor wi can be defined as wi~(sp1+sp2+ . . . ), where sp(x) are SEM image metrics such as local SEM image gradient, local SEM image contrast, etc. and where x equals any integer greater than or equal to 1. In an embodiment, rather than combining sp(x) by addition, the metrics sp(x) can be multiplied together or some other combination.

The applicable weighting factor for the applicable pattern and portion of the pattern, is then used in the model error function as discussed above in calibration or verification of the model.

Figure 53:
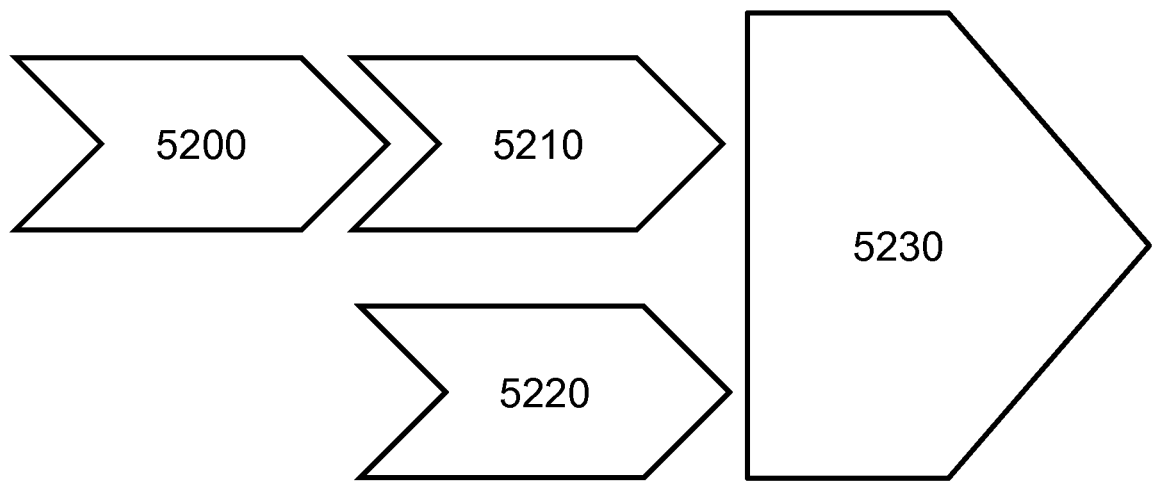
FIG. 53 depicts a further example flow chart for determining a weighting factor for a model error function.

Referring to FIG. 53, a further example flow chart of a method for determining a weighting factor for a model error function is depicted.

At 5200, one or more SEM images of a pattern are obtained. In an embodiment, the one or more SEM images comprise a unit cell synthesis (UCS) of SEM images as discussed above. For example, in an embodiment, the one or more SEM images comprise one or more UCS images, each UCS image based on SEM images made using multiple SEM measurement orientations (e.g., raster orientations). In an embodiment, the one or more SEM images comprise one or more UCS images, each UCS image based on only a single SEM measurement orientation.

In an embodiment, the SEM image is processed to determine one or more values of one or more SEM image metrics. Such processing can include obtaining a SEM waveform of at least part of the SEM image of the pattern. In an embodiment, the SEM waveform is of SEM image gradient (e.g., intensity gradient) and/or SEM image contrast, as a function of position along a cutline perpendicular to a particular position along the edge contour of the pattern. Thus, the SEM image metric can comprise a SEM image gradient (e.g., intensity gradient) and/or a SEM image contrast.

Based on the SEM waveform, one or more local SEM image metrics are determined at 5210 for the particular part of the SEM image for the purposes of determining the weighting factor. In particular, at 5220, the SEM waveform is sampled. That is, the one or more SEM image metrics are obtained at various positions along the waveform.

At 5230, a weighting factor is determined based on the local SEM image metric and is assigned to the sampled positions along the waveform, i.e., to particular sampled positions along the cutline. In an embodiment, the weighting factor is the value of one or more local SEM image metrics at the sampled position. In an embodiment, the weighting factor is a function of one or more local SEM image metrics at the sampled position. In an embodiment, the weighting factor is proportional to one or more local SEM image metrics at the sampled position.

As will be appreciated, in an embodiment, the steps of 5200-5230 would be applied for a plurality of points along the contour of the SEM image. For example, the points along the contour of the SEM image are those used in model calibration or verification. In an embodiment, the steps of 5200-5230 would be applied for each pattern of a plurality of patterns used in model calibration or verification (and thus for the plurality of points along the contours of each of the patterns).

The applicable weighting factor for the applicable pattern and portion of the pattern, is then used in the model error function as discussed above in calibration or verification of the model.

Figure 54:
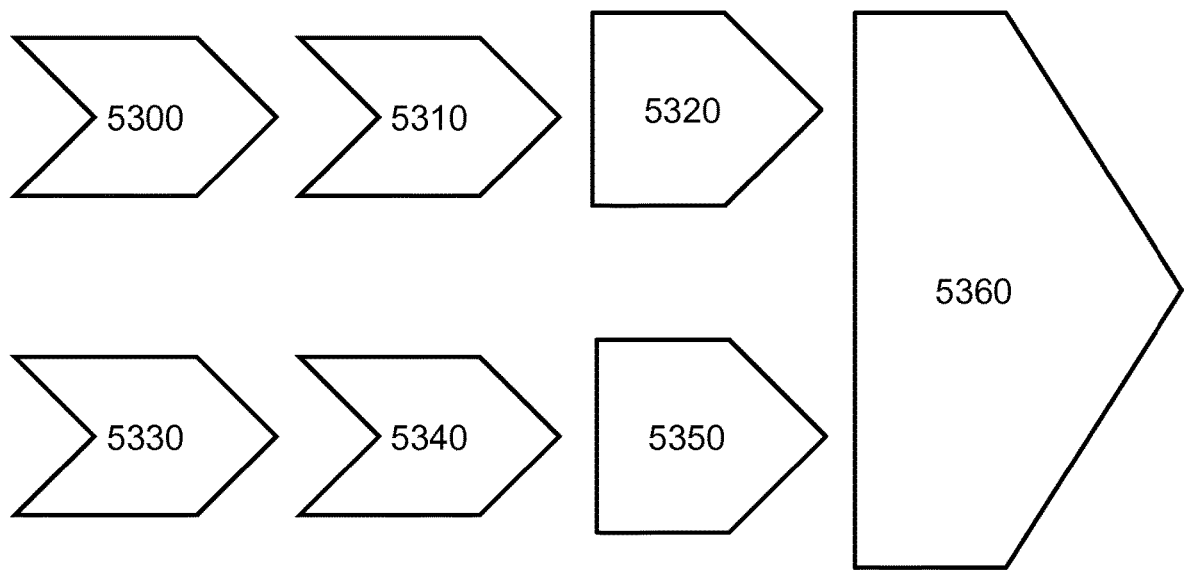
FIG. 54 depicts a further example flow chart for determining a weighting factor for a model error function.

Referring to FIG. 54, a further example flow chart of a method for determining a weighting factor for a model error function is depicted.

At 5300, one or more SEM images of a pattern are obtained. In an embodiment, the one or more SEM images comprise a unit cell synthesis (UCS) of SEM images as discussed above. For example, in an embodiment, the one or more SEM images comprise one or more UCS images, each UCS image based on SEM images made using multiple SEM measurement orientations (e.g., raster orientations). In an embodiment, the one or more SEM images comprise one or more UCS images, each UCS image based on only a single SEM measurement orientation.

In an embodiment, the SEM image is processed to determine one or more values of one or more SEM image metrics. Such processing can include obtaining a SEM waveform of at least part of the SEM image of the pattern. In an embodiment, the SEM waveform is of a SEM image gradient (e.g., intensity gradient) and/or SEM image contrast, as a function of position along a cutline perpendicular to a particular position along the edge contour of the pattern. Thus, the SEM image metric can comprise a SEM image gradient (e.g., intensity gradient) and/or a SEM image contrast.

Based on the SEM waveform, one or more local SEM image metrics are determined at 5310 for the particular part of the SEM image for the purposes of determining the weighting factor. In an embodiment, the local SEM image metric can comprise the average of a SEM image metric along the cutline. In an embodiment, the local SEM image metric can comprise a minimum or maximum value of a SEM image metric along the cutline.

At 5320, a weighting factor is determined based on the local SEM image metric and is assigned to all positions along the waveform, i.e., to all positions along the cutline. In an embodiment, the weighting factor is the value of one or more local SEM image metrics. In an embodiment, the weighting factor is a function of one or more local SEM image metrics. In an embodiment, the weighting factor is proportional to one or more local SEM image metrics.

At 5330, a result of the pattern as processed by the patterning process is obtained. In an embodiment, the result is a simulated result obtained by simulating the creation of the pattern by a patterning process. In an embodiment, the simulation result comprises an aerial image of the pattern. In an embodiment, the simulation result comprises a resist image of the pattern. In an embodiment, the result is measured data from performance of the patterning process to produce the pattern, such as lithographic apparatus data such as dose, focus, stage movement data, etc.

Based on the pattern processing result, one or more local patterning process metrics are determined at 5340 for the particular part of the pattern for the purposes of determining the weighting factor. In an embodiment, the local patterning process metric can comprise the average of a patterning process metric along the cutline. In an embodiment, the local patterning process metric can comprise a minimum or maximum value of a patterning process metric along the cutline. In an embodiment, the patterning process metric comprises image log slope (ILS) and/or contrast.

At 5350, a weighting factor is determined based on the local patterning process metric and is assigned to all positions along the waveform, i.e., to all positions along the cutline. In an embodiment, the weighting factor is the value of one or more patterning process metrics. In an embodiment, the weighting factor is a function of one or more patterning process metrics. In an embodiment, the weighting factor is proportional to one or more patterning process metrics.

At 5360, a combined weighting factor is determined that is based on the weighting factor based on the local SEM image metric and based on the weighting factor based on the patterning process metric and the combined weighting factor is assigned to all positions along the waveform. In an embodiment, the weighting factor is determined directly from the local SEM image metric and the patterning process metric. That is, a weighting factor based on the local SEM image metric and a weighting factor based on the patterning process metric is not separately calculated.

As will be appreciated, in an embodiment, the steps of 5300-5360 would be applied for a plurality of points along the contour of the SEM image. For example, the points along the contour of the SEM image are those used in model calibration or verification. In an embodiment, the steps of 5300-5360 would be applied for each pattern of a plurality of patterns used in model calibration or verification (and thus for the plurality of points along the contours of each of the patterns).

In an embodiment, a contour weighting factor wi can be defined as wi~(ip(x)+sp(x)), where sp(x) are one or more SEM image metrics such as local SEM image gradient, local SEM image contrast, etc. and ip(x) are one or more patterning process metrics such things as image log slope (ILS), contrast, etc., where x equals any integer greater than or equal to 1. In an embodiment, rather than combining sp(x) or ip(x) by addition, the metrics sp(x) and/or metrics ip(x) can be multiplied together or some other combination. Further, rather than combining sp(x) with ip(x) by addition, sp(x) and ip(x) can be multiplied together or some other combination. Further, in an embodiment, sp(x) and ip(x) can have their own sub-weightings. Thus, the sub-weightings can be assigned to give more or less value to the patterning process metric vs. the SEM image metric.

The applicable weighting factor for the applicable pattern and portion of the pattern, is then used in the model error function as discussed above in calibration or verification of the model.

Figure 55:
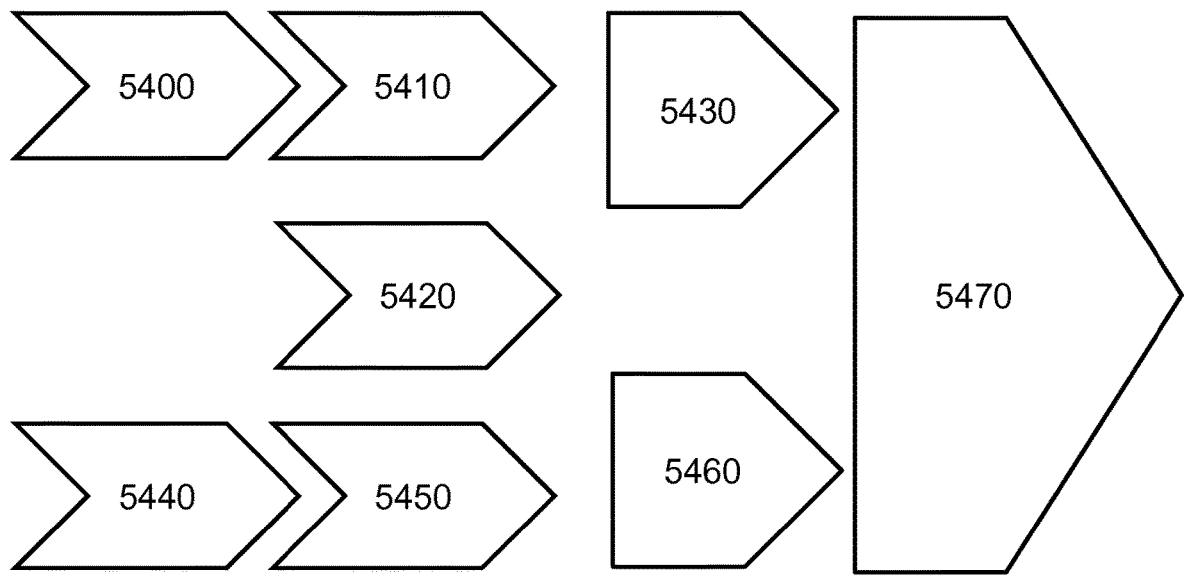
FIG. 55 depicts a further example flow chart for determining a weighting factor for a model error function.

Referring to FIG. 55, a further example flow chart of a method for determining a weighting factor for a model error function is depicted.

At 5400, one or more SEM images of a pattern are obtained. In an embodiment, the one or more SEM images comprise a unit cell synthesis (UCS) of SEM images as discussed above. For example, in an embodiment, the one or more SEM images comprise one or more UCS images, each UCS image based on SEM images made using multiple SEM measurement orientations (e.g., raster orientations). In an embodiment, the one or more SEM images comprise one or more UCS images, each UCS image based on only a single SEM measurement orientation.

In an embodiment, the SEM image is processed to determine one or more values of one or more SEM image metrics. Such processing can include obtaining a SEM waveform of at least part of the SEM image of the pattern. In an embodiment, the SEM waveform is of a SEM image gradient (e.g., intensity gradient) and/or SEM image contrast, as a function of position along a cutline perpendicular to a particular position along the edge contour of the pattern. Thus, the SEM image metric can comprise a SEM image gradient (e.g., intensity gradient) and/or a SEM image contrast.

Based on the SEM waveform, one or more local SEM image metrics are determined at 5410 for the particular part of the SEM image for the purposes of determining the weighting factor.

At 5420, either the SEM waveform or a patterning process result representing data corresponding to the creation of the pattern by the patterning process is sampled. That is, either the one or more SEM image metrics are obtained at various positions along the SEM waveform or the one or more patterning process metrics as discussed hereafter are obtained at various positions along a cutline of the patterning process result of the pattern.

At 5430, a weighting factor is determined based on the local SEM image metric. Where the SEM waveform is sampled, the weighting factor is assigned to the sampled positions along the waveform, i.e., to particular sampled positions along the cutline. So, in this embodiment, the weighting factor is the value of one or more local SEM image metrics at the sampled position. In an embodiment, the weighting factor is a function of one or more local SEM image metrics at the sampled position. In an embodiment, the weighting factor is proportional to one or more local SEM image metrics at the sampled position.

Where the SEM waveform is not sampled, the weighting factor is assigned to all positions along the waveform, i.e., to all positions along the cutline. In an embodiment, the weighting factor is the value of one or more local SEM image metrics. In an embodiment, the weighting factor is a function of one or more local SEM image metrics. In an embodiment, the weighting factor is proportional to one or more local SEM image metrics.

At 5440, a result of the pattern as processed by the patterning process is obtained. In an embodiment, the result is a simulated result obtained by simulating the creation of the pattern by a patterning process. In an embodiment, the simulation result comprises an aerial image of the pattern. In an embodiment, the simulation result comprises a resist image of the pattern. In an embodiment, the result is measured data from performance of the patterning process to produce the pattern, such as lithographic apparatus data such as dose, focus, stage movement data, etc.

Based on the pattern processing result, one or more local patterning process metrics are determined at 5450 for the particular part of the pattern for the purposes of determining the weighting factor. In an embodiment, the patterning process metric comprises image log slope (ILS) and/or contrast.

At 5460, a weighting factor is determined based on the local patterning process metric. Where the patterning process result of the pattern is sampled, the weighting factor is assigned to the sampled positions along the patterning process result of the cutline of the pattern, i.e., to particular sampled positions along the cutline. So, in this embodiment, the weighting factor is the value of one or more local patterning process metrics at the sampled position. In an embodiment, the weighting factor is a function of one or more local patterning process metrics at the sampled position. In an embodiment, the weighting factor is proportional to one or more local patterning process metrics at the sampled position.

Where the patterning process result of the pattern is not sampled, the weighting factor is assigned to all positions along the patterning process result of the cutline of the pattern, i.e., to all positions along the cutline. In an embodiment, the weighting factor is the value of one or more local patterning process metrics. In an embodiment, the weighting factor is a function of one or more patterning process metrics. In an embodiment, the weighting factor is proportional to one or more local patterning process metrics.

At 5470, a combined weighting factor is determined that is based on the weighting factor based on the local SEM image metric and based on the weighting factor based on the patterning process metric and the combined weighting factor is assigned to all positions or to sampled positions. In an embodiment, the weighting factor is determined directly from the local SEM image metric and the patterning process metric. That is, a weighting factor based on the local SEM image metric and a weighting factor based on the patterning process metric is not separately calculated.

As will be appreciated, in an embodiment, the steps of 5400-5470 would be applied for a plurality of points along the contour of the SEM image. For example, the points along the contour of the SEM image are those used in model calibration or verification. In an embodiment, the steps of 5400-5470 would be applied for each pattern of a plurality of patterns used in model calibration or verification (and thus for the plurality of points along the contours of each of the patterns).

In an embodiment, a contour weighting factor wi can be defined as wi~(ip(x)+sp(x)), where sp(x) are one or more SEM image metrics such as local SEM image gradient, local SEM image contrast, etc. and ip(x) are one or more patterning process metrics such things as image log slope (ILS), contrast, etc., where x equals any integer greater than or equal to 1. In an embodiment, rather than combining sp(x) or ip(x) by addition, the metrics sp(x) and/or metrics ip(x) can be multiplied together or some other combination. Further, rather than combining sp(x) with ip(x) by addition, sp(x) and ip(x) can be multiplied together or some other combination. Further, in an embodiment, sp(x) and ip(x) can have their own sub-weightings. Thus, the sub-weightings can be assigned to give more or less value to the patterning process metric vs. the SEM image metric.

The applicable weighting factor for the applicable pattern and portion of the pattern, is then used in the model error function as discussed above in calibration or verification of the model.

Figure 56:
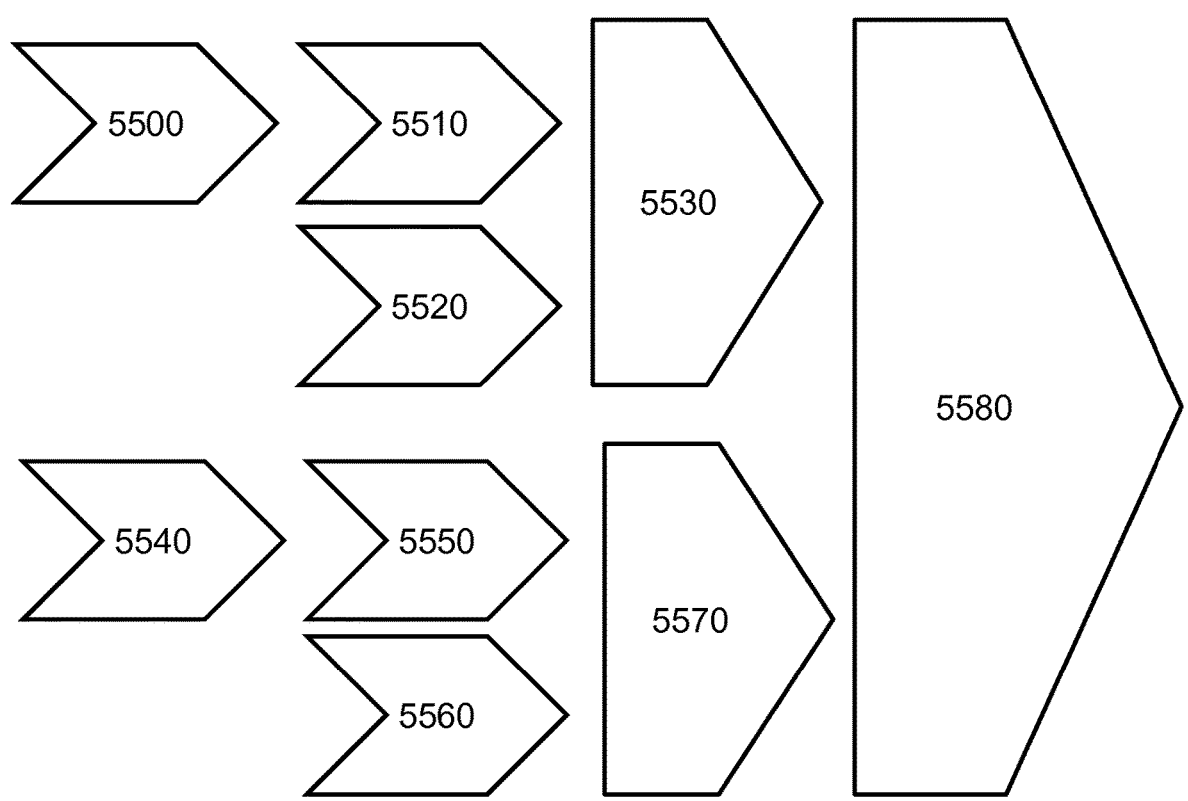
FIG. 56 depicts a further example flow chart for determining a weighting factor for a model error function.

Referring to FIG. 56, a further example flow chart of a method for determining a weighting factor for a model error function is depicted.

At 5500, one or more SEM images of a pattern are obtained. In an embodiment, the one or more SEM images comprise a unit cell synthesis (UCS) of SEM images as discussed above. For example, in an embodiment, the one or more SEM images comprise one or more UCS images, each UCS image based on SEM images made using multiple SEM measurement orientations (e.g., raster orientations). In an embodiment, the one or more SEM images comprise one or more UCS images, each UCS image based on only a single SEM measurement orientation.

In an embodiment, the SEM image is processed to determine one or more values of one or more SEM image metrics. Such processing can include obtaining a SEM waveform of at least part of the SEM image of the pattern. In an embodiment, the SEM waveform is of a SEM image gradient (e.g., intensity gradient) and/or SEM image contrast, as a function of position along a cutline perpendicular to a particular position along the edge contour of the pattern. Thus, the SEM image metric can comprise a SEM image gradient (e.g., intensity gradient) and/or a SEM image contrast.

Based on the SEM waveform, one or more local SEM image metrics are determined at 5510 for the particular part of the SEM image for the purposes of determining the weighting factor.

At 5520, the SEM waveform is sampled. That is, the one or more SEM image metrics are obtained at various positions along the SEM waveform.

At 5530, a weighting factor is determined based on the local SEM image metric. The weighting factor is assigned to the sampled positions along the waveform, i.e., to particular sampled positions along the cutline. So, in this embodiment, the weighting factor is the value of one or more local SEM image metrics at the sampled position. In an embodiment, the weighting factor is a function of one or more local SEM image metrics at the sampled position. In an embodiment, the weighting factor is proportional to one or more local SEM image metrics at the sampled position.

At 5540, a result of the pattern as processed by the patterning process is obtained. In an embodiment, the result is a simulated result obtained by simulating the creation of the pattern by a patterning process. In an embodiment, the simulation result comprises an aerial image of the pattern. In an embodiment, the simulation result comprises a resist image of the pattern. In an embodiment, the result is measured data from performance of the patterning process to produce the pattern, such as lithographic apparatus data such as dose, focus, stage movement data, etc.

Based on the pattern processing result, one or more local patterning process metrics are determined at 5550 for the particular part of the pattern for the purposes of determining the weighting factor. In an embodiment, the patterning process metric comprises image log slope (ILS) and/or contrast.

At 5560, the patterning process result of the pattern is sampled. That is, the one or more patterning process metrics are obtained at various positions along a cutline of the patterning process result of the pattern.

At 5570, a weighting factor is determined based on the local patterning process metric. The weighting factor is assigned to the sampled positions along the patterning process result of the cutline of the pattern, i.e., to particular sampled positions along the cutline. So, in this embodiment, the weighting factor is the value of one or more local patterning process metrics at the sampled position. In an embodiment, the weighting factor is a function of one or more local patterning process metrics at the sampled position. In an embodiment, the weighting factor is proportional to one or more local patterning process metrics at the sampled position.

At 5580, a combined weighting factor is determined that is based on the weighting factor based on the local SEM image metric and based on the weighting factor based on the patterning process metric and the combined weighting factor is assigned to the sampled position along the waveform. In an embodiment, the weighting factor is determined directly from the local SEM image metric and the patterning process metric. That is, a weighting factor based on the local SEM image metric and a weighting factor based on the patterning process metric is not separately calculated.

As will be appreciated, in an embodiment, the steps of 5500-5580 would be applied for a plurality of points along the contour of the SEM image. For example, the points along the contour of the SEM image are those used in model calibration or verification. In an embodiment, the steps of 5500-5580 would be applied for each pattern of a plurality of patterns used in model calibration or verification (and thus for the plurality of points along the contours of each of the patterns).

In an embodiment, a contour weighting factor wi can be defined as wi~(ip(x)+sp(x)), where sp(x) are one or more SEM image metrics such as local SEM image gradient, local SEM image contrast, etc. and ip(x) are one or more patterning process metrics such things as image log slope (ILS), contrast, etc., where x equals any integer greater than or equal to 1. In an embodiment, rather than combining sp(x) or ip(x) by addition, the metrics sp(x) and/or metrics ip(x) can be multiplied together or some other combination. Further, rather than combining sp(x) with ip(x) by addition, sp(x) and ip(x) can be multiplied together or some other combination. Further, in an embodiment, sp(x) and ip(x) can have their own sub-weightings. Thus, the sub-weightings can be assigned to give more or less value to the patterning process metric vs. the SEM image metric.

The applicable weighting factor for the applicable pattern and portion of the pattern, is then used in the model error function as discussed above in calibration or verification of the model.

Thus, for contour-based metrology and model calibration or verification methods, there is provided a method of determining a weighting factor at arbitrary contour points for a model error function that involves quantifying a local SEM image quality and using it create the weighting factor. Further, in an embodiment, the weighting factor is further determined based on a patterning process (e.g., lithographic) image quality.

In an embodiment, there is provided a method comprising: providing a plurality of unit cells for a plurality of gauge patterns appearing in one or more images of one or more patterning process substrates, each unit cell representing an instance of a gauge pattern of the plurality of gauge patterns; averaging together image information of each unit cell to arrive at a synthesized representation of the gauge pattern; and determining a geometric dimension of the gauge pattern based on the synthesized representation.

In an embodiment, the method further comprises defining a contour of the gauge pattern in the synthesized representation. In an embodiment, the determining comprises determining the gauge geometric dimension from the contour. In an embodiment, the determining comprises determining a geometric dimension of the gauge pattern by sampling the contour. In an embodiment, the method further comprises providing a plurality of images, each image corresponding to a different measurement capture orientation, and wherein the averaging comprises averaging image information from each image corresponding to a different measurement capture orientation to arrive at a synthesized representation of the gauge pattern for each of the measurement capture orientations, and averaging the synthesized representations of the gauge pattern for the different measurement capture orientations to arrive at a combined synthesized representation of the gauge pattern for the different measurement capture orientations. In an embodiment, the method further comprises, prior to processing the image to identify the plurality of unit cells, applying a spatial correction to the image. In an embodiment, the spatial correction comprises one or more selected from: skew, magnification, rotation, curvature, and/or trapezoid. In an embodiment, the method further comprises sweeping the image to obtain at least two signals and differencing the at least two signals to suppress image artifacts. In an embodiment, the method further comprises analyzing subset of a set of images to identify at least one pattern for correction of distortion in the pattern and applying the distortion correction to the set of images. In an embodiment, the method further comprises processing the image to identify the plurality of unit cells using a pattern edge technique. In an embodiment, the method further comprises evaluating the synthesized representation to identify whether there is an error in the image information and/or in a definition of the unit cells. In an embodiment, the method further comprises using the geometric dimension to calibrate or create a mathematical model representing an aspect of a patterning process. In an embodiment, the method further comprises using the geometric dimension to verify a mathematical model representing an aspect of a patterning process, the model calibrated with a different pattern than the gauge pattern. In an embodiment, the model comprises an OPC model and further comprising using the model with a device design layout to arrive at a corrected device design layout. In an embodiment, the method further comprises using the geometric dimension to calibrate, verify, or otherwise adjust a pattern prediction model. In an embodiment, the method further comprises applying the model derived from the geometric dimension in the patterning of substrates employed in integrated circuit processing and/or manufacture. In an embodiment, the method further comprises selecting a subset of the unit cells based on a patterning process parameter. In an embodiment, the gauge pattern comprises a feature of an integrated circuit pattern. In an embodiment, the image is a scanning electron microscope image.

In an embodiment, there is provided a method comprising: determining, by a hardware computer system, a SEM image metric for a portion of a SEM image of a pattern produced by a patterning process on a substrate; and determining, by the hardware computer system, a weighting factor for a model error function based on the SEM image metric.

In an embodiment, the SEM image comprises a unit cell synthesis of a plurality of SEM images of the pattern. In an embodiment, the unit cell synthesis is based on SEM images made using multiple SEM measurement orientations. In an embodiment, the SEM image metric comprises a SEM image gradient and/or a SEM image contrast. In an embodiment, the method further comprises obtaining the weighting factor for each position of a plurality of sampled positions along a cutline across an edge of a contour of the SEM image of the pattern. In an embodiment, the method further comprises assigning the weighting factor for all positions along a cutline across an edge of a contour of the SEM image of the pattern. In an embodiment, the method further comprises determining the weighting factor based on a patterning process metric representing a quality of the pattern as produced using the patterning process. In an embodiment, the method further comprises obtaining a simulated result of the pattern using the patterning process and deriving the patterning process metric from the simulated result data. In an embodiment, the patterning process metric comprising an image log slope or an image contrast. In an embodiment, the patterning process metric has a different weighting than the SEM image metric in determining the weighting factor. In an embodiment, determining the SEM image metric comprises obtaining a SEM waveform of at least part of the SEM image of the pattern and deriving the SEM image metric from the SEM waveform data. In an embodiment, the method further comprises applying the model error function having the determined weighting factor in the calibration or verification of a model.

In association with an imaging apparatus such as a SEM, an embodiment may include a computer program containing one or more sequences of machine-readable instructions describing a method of detecting and representing an imaged structure, registering a template image object representing the imaged structure against a reference image object, and/or predicting a change in a structure based on variation in a parameter during a patterning process. This computer program may be included, for example, with or within the imaging apparatus of FIG. 3 and/or with or within the control unit LACU of FIG. 2. There may also be provided a data storage medium (e.g., semiconductor memory, magnetic or optical disk) having such a computer program stored therein. Where an existing apparatus, for example of the type shown in FIGS. 1-3, is already in production and/or in use, an embodiment can be implemented by the provision of updated computer program products for causing a processor of the apparatus to perform a method as described herein.

The term "optimizing" and "optimization" as used herein mean adjusting an apparatus or process, e.g., a lithographic apparatus or an optical lithography process step, such that patterning and/or device fabrication results and/or processes (e.g., of lithography) have one or more desirable characteristics, such as higher accuracy of projection of a design layout on a substrate, larger process window, etc.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The invention may further be described using the following clauses:

1. A method comprising:
   providing a plurality of unit cells for a plurality of gauge patterns appearing in one or more images of one or more patterning process substrates, each unit cell representing an instance of a gauge pattern of the plurality of gauge patterns;
   averaging together image information of each unit cell to arrive at a synthesized representation of the gauge pattern; and
   determining a geometric dimension of the gauge pattern based on the synthesized representation.
2. The method of clause 1, further comprising defining a contour of the gauge pattern in the synthesized representation.
3. The method of clause 2, wherein the determining comprises determining the gauge geometric dimension from the contour.
4. The method of clause 2 or clause 3, wherein the determining comprises determining a geometric dimension of the gauge pattern by sampling the contour.
5. The method of any of clauses 1 to 4, further comprising providing a plurality of images, each image corresponding to a different measurement capture orientation, and wherein the averaging comprises averaging image information from each image corresponding to a different measurement capture orientation to arrive at a synthesized representation of the gauge pattern for each of the measurement capture orientations, and averaging the synthesized representations of the gauge pattern for the different measurement capture orientations to arrive at a combined synthesized representation of the gauge pattern for the different measurement capture orientations.
6. The method of any of clauses 1 to 5, further comprising, prior to processing the image to identify the plurality of unit cells, applying a spatial correction to the image.
7. The method of clause 6, wherein the spatial correction comprises one or more selected from: skew, magnification, rotation, curvature, and/or trapezoid.
8. The method of any of clauses 1 to 7, further comprising sweeping the image to obtain at least two signals and differencing the at least two signals to suppress image artifacts.
9. The method of any of clauses 1 to 8, further comprising analyzing subset of a set of images to identify at least one pattern for correction of distortion in the pattern and applying the distortion correction to the set of images.
10. The method of any of clauses 1 to 9, further comprising processing the image to identify the plurality of unit cells using a pattern edge technique.
11. The method of any of clauses 1 to 10, further comprising evaluating the synthesized representation to identify whether there is an error in the image information and/or in a definition of the unit cells.

12. The method of any of clauses 1 to 11, further comprising using the geometric dimension to calibrate or create a mathematical model representing an aspect of a patterning process.

13. The method of any of clauses 1 to 12, further comprising using the geometric dimension to verify a mathematical model representing an aspect of a patterning process, the model calibrated with a different pattern than the gauge pattern.

14. The method of clause 12 or clause 13, wherein the model comprises an OPC model and further comprising using the model with a device design layout to arrive at a corrected device design layout.

15. The method of any of clauses 1 to 12, further comprising using the geometric dimension to calibrate, verify, or otherwise adjust a pattern prediction model.

16. The method of clause 15, further comprising applying the model derived from the geometric dimension in the patterning of substrates employed in integrated circuit processing and/or manufacture.

17. The method of any of clauses 1 to 16, further comprising selecting a subset of the unit cells based on a patterning process parameter.

18. The method of any of clauses 1 to 17, wherein the gauge pattern comprises a feature of an integrated circuit pattern.

19. The method of any of clauses 1 to 18, wherein the image is a scanning electron microscope image.

20. A method comprising:
determining, by a hardware computer system, a SEM image metric for a portion of a SEM image of a pattern produced by a patterning process on a substrate; and
determining, by the hardware computer system, a weighting factor for a model error function based on the SEM image metric.

21. The method of clause 20, wherein the SEM image comprises a unit cell synthesis of a plurality of SEM images of the pattern.

22. The method of clause 21, wherein the unit cell synthesis is based on SEM images made using multiple SEM measurement orientations.

23. The method of any of clauses 20 to 22, wherein the SEM image metric comprises a SEM image gradient and/or a SEM image contrast.

24. The method of any of clauses 20 to 23, further comprising obtaining the weighting factor for each position of a plurality of sampled positions along a cutline across an edge of a contour of the SEM image of the pattern.

25. The method of any of clauses 20 to 23, further comprising assigning the weighting factor for all positions along a cutline across an edge of a contour of the SEM image of the pattern.

26. The method of any of clauses 20 to 25, further comprising determining the weighting factor based on a patterning process metric representing a quality of the pattern as produced using the patterning process.

27. The method of clause 26, further comprising obtaining a simulated result of the pattern using the patterning process and deriving the patterning process metric from the simulated result data.

28. The method of clause 26 or clause 27, wherein the patterning process metric comprising an image log slope or an image contrast.

29. The method of any of clauses 26 to 28, wherein the patterning process metric has a different weighting than the SEM image metric in determining the weighting factor.

30. The method of any of clauses 20 to 29, wherein determining the SEM image metric comprises obtaining a SEM waveform of at least part of the SEM image of the pattern and deriving the SEM image metric from the SEM waveform data.

31. The method of any of clause 20 to 30, further comprising applying the model error function having the determined weighting factor in the calibration or verification of a model.

32. A method of manufacturing devices wherein a device pattern is applied to a series of substrates using a patterning process, the method including evaluating a structure created using the patterning process using the method of any of clauses 1 to 31 and controlling and/or designing the patterning process for one or more of the substrates in accordance with the result of the method.

33. A non-transitory computer program product comprising machine-readable instructions configured to cause a processor to cause performance of the method of any of clauses 1 to 31.

34. A system comprising:
a scanning electron microscope configured to provide an image of a lithographically created structure; and
an image analysis engine comprising the non-transitory computer program product of clause 33.

35. The system of clause 34, further comprising a lithographic apparatus comprising a support structure configured to hold a patterning device to modulate a radiation beam and a projection optical system arranged to project the modulated onto a radiation-sensitive substrate.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A method comprising:
providing a plurality of unit cells for a plurality of gauge patterns appearing in one or more images of one or more patterning process substrates, each unit cell representing an instance of a gauge pattern of the plurality of gauge patterns;
averaging together, by a computer processor, image information of each unit cell extracted from the one or more images to arrive at a synthesized representation of the gauge pattern; and
determining a geometric dimension of the gauge pattern based on the synthesized representation.

2. The method of claim 1, further comprising defining a contour of the gauge pattern in the synthesized representation.

3. The method of claim 2, wherein the determining comprises determining the geometric dimension from the contour, and/or wherein the determining comprises determining the geometric dimension by sampling the contour.

4. The method of claim 1, further comprising providing a plurality of images, each image corresponding to a different measurement capture orientation, and wherein the averaging comprises averaging image information from each image corresponding to a different measurement capture orientation to arrive at a synthesized representation of the gauge pattern for each of the measurement capture orientations, and averaging the synthesized representations of the gauge pattern for the different measurement capture orientations to arrive at a combined synthesized representation of the gauge pattern for the different measurement capture orientations.

5. The method of claim 1, further comprising, prior to processing the image to identify the plurality of unit cells, applying a spatial correction to the image.

6. The method of claim 5, wherein the spatial correction comprises one or more selected from: skew, magnification, rotation, curvature, and/or trapezoid.

7. The method of claim 1, further comprising sweeping the image to obtain at least two signals and differencing the at least two signals to suppress image artifacts.

8. The method of claim 1, further comprising analyzing subset of a set of images to identify at least one pattern for correction of distortion in the pattern and applying the distortion correction to the set of images.

9. The method of claim 1, further comprising processing the image to identify the plurality of unit cells using a pattern edge technique.

10. The method of claim 1, further comprising evaluating the synthesized representation to identify whether there is an error in the image information and/or in a definition of the unit cells.

11. The method of claim 1, further comprising using the geometric dimension to calibrate or create a mathematical model representing an aspect of a patterning process, and/or using the geometric dimension to verify a mathematical model representing an aspect of a patterning process, the model calibrated with a different pattern than the gauge pattern.

12. The method of claim 11, wherein the model comprises an OPC model and further comprising using the model with a device design layout to arrive at a corrected device design layout.

13. The method of claim 1, further comprising using the geometric dimension to calibrate, verify, or otherwise adjust a pattern prediction model.

14. A non-transitory computer program product comprising machine-readable instructions configured to cause a processor system to at least:
provide a plurality of unit cells for a plurality of gauge patterns appearing in one or more images of one or more patterning process substrates, each unit cell representing an instance of a gauge pattern of the plurality of gauge patterns;
average together, by the processor system, image information of each unit cell extracted from the one or more images to arrive at a synthesized representation of the gauge pattern; and
determine a geometric dimension of the gauge pattern based on the synthesized representation.

15. A system comprising:
a scanning electron microscope configured to provide an image of a lithographically created structure; and
an image analysis engine comprising the non-transitory computer program product of claim 14.

16. A method comprising:
determining, by a hardware computer system, a SEM image metric for a portion of a SEM image of a pattern produced by a patterning process on a substrate; and
determining, by the hardware computer system, a weighting factor for a model error function based on the SEM image metric.

17. The method of claim 16, wherein the SEM image comprises a unit cell synthesis of a plurality of SEM images of the pattern.

18. The method of claim 17, wherein the unit cell synthesis is based on SEM images made using multiple SEM measurement orientations.

19. The method of claim 16, wherein the SEM image metric comprises a SEM image gradient and/or a SEM image contrast.

20. The method of claim 16, further comprising obtaining the weighting factor for each position of a plurality of sampled positions along a cutline across an edge of a contour of the SEM image of the pattern.

21. A non-transitory computer program product comprising machine-readable instructions configured to cause a processor system to at least:
determine a SEM image metric for a portion of a SEM image of a pattern produced by a patterning process on a substrate; and
determine a weighting factor for a model error function based on the SEM image metric.

\* \* \* \* \*